United States Patent
Yamazaki et al.

(10) Patent No.: US 9,214,563 B2
(45) Date of Patent: Dec. 15, 2015

(54) OXIDE SEMICONDUCTOR FILM AND SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Masayuki Sakakura, Tochigi (JP); Ryosuke Watanabe, Ebina (JP); Junichiro Sakata, Atsugi (JP); Kengo Akimoto, Atsugi (JP); Akiharu Miyanaga, Hadano (JP); Takuya Hirohashi, Atsugi (JP); Hideyuki Kishida, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/947,334

(22) Filed: Jul. 22, 2013

(65) Prior Publication Data
US 2013/0299827 A1 Nov. 14, 2013

Related U.S. Application Data

(63) Continuation of application No. 12/887,646, filed on Sep. 22, 2010, now Pat. No. 8,492,758.

(30) Foreign Application Priority Data

Sep. 24, 2009 (JP) ................................ 2009-218877

(51) Int. Cl.
*H01L 29/12* (2006.01)
*H01L 29/786* (2006.01)
(Continued)

(52) U.S. Cl.
CPC ........ *H01L 29/7869* (2013.01); *H01L 27/1225* (2013.01); *H01L 29/04* (2013.01); *H01L 29/12* (2013.01); *H01L 29/41733* (2013.01)

(58) Field of Classification Search
CPC ........................... H01L 29/12; H01L 29/7869
USPC .............. 257/43, E21.476, E29.296; 438/158
See application file for complete search history.

(56) References Cited

U.S. PATENT DOCUMENTS

| 4,390,890 A | 6/1983 | Bergeron et al. |
| 5,731,856 A | 3/1998 | Kim et al. |

(Continued)

FOREIGN PATENT DOCUMENTS

| CN | 100424825 C | 10/2008 |
| EP | 1349217 A | 10/2003 |

(Continued)

OTHER PUBLICATIONS

Kimizuka et al., "Spinel, $YbFe_2O_4$, and $Yb_2Fe_3O_7$ Types of Structures for Compounds in the $In_2O_3$ and $Sc_2O_3$-$A_2O_3$-BO Systems [A: Fe, Ga, or Al; B: Mg, Mn, Fe, Ni, Cu, or Zn] at Temperatures Over 1000° C.," Journal of Solid State Chemistry, 1985, vol. 60, pp. 382-384.

(Continued)

*Primary Examiner* — Phuc Dang
(74) *Attorney, Agent, or Firm* — Eric J. Robinson; Robinson Intellectual Property Law Office, P.C.

(57) ABSTRACT

It is an object to provide a highly reliable semiconductor device with good electrical characteristics and a display device including the semiconductor device as a switching element. In a transistor including an oxide semiconductor layer, a needle crystal group provided on at least one surface side of the oxide semiconductor layer grows in a c-axis direction perpendicular to the surface and includes an a-b plane parallel to the surface, and a portion except for the needle crystal group is an amorphous region or a region in which amorphousness and microcrystals are mixed. Accordingly, a highly reliable semiconductor device with good electrical characteristics can be formed.

16 Claims, 39 Drawing Sheets

(51) Int. Cl.
*H01L 27/12* (2006.01)
*H01L 29/04* (2006.01)
*H01L 29/417* (2006.01)

(56) References Cited

U.S. PATENT DOCUMENTS

| | | | |
|---|---|---|---|
| 5,744,864 A | 4/1998 | Cillessen et al. |
| 6,198,113 B1 | 3/2001 | Grupp |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,740,938 B2 | 5/2004 | Tsunoda et al. |
| 6,860,982 B2 | 3/2005 | Okura et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,276,724 B2 | 10/2007 | Sheats et al. |
| 7,282,782 B2 | 10/2007 | Hoffman et al. |
| 7,297,977 B2 | 11/2007 | Hoffman et al. |
| 7,298,084 B2 | 11/2007 | Baude et al. |
| 7,323,356 B2 | 1/2008 | Hosono et al. |
| 7,339,187 B2 | 3/2008 | Wager, III et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,511,343 B2 | 3/2009 | Li et al. |
| 7,598,520 B2 | 10/2009 | Hirao et al. |
| 7,601,984 B2 | 10/2009 | Sano et al. |
| 7,674,650 B2 | 3/2010 | Akimoto et al. |
| 7,719,185 B2 | 5/2010 | Jin et al. |
| 7,732,229 B2 | 6/2010 | Leidholm et al. |
| 7,732,819 B2 | 6/2010 | Akimoto et al. |
| 7,745,798 B2 | 6/2010 | Takahashi |
| 7,767,505 B2 | 8/2010 | Son et al. |
| 7,838,868 B2 | 11/2010 | Sheats et al. |
| 7,879,468 B2 | 2/2011 | Uchida |
| 7,893,495 B2 | 2/2011 | Li et al. |
| 7,935,964 B2 | 5/2011 | Kim et al. |
| 7,977,169 B2 | 7/2011 | Hirao et al. |
| 7,993,964 B2 | 8/2011 | Hirao et al. |
| 7,994,500 B2 | 8/2011 | Kim et al. |
| 7,998,372 B2 | 8/2011 | Yano et al. |
| 8,013,321 B2 | 9/2011 | Aranami et al. |
| 8,058,645 B2 | 11/2011 | Jeong et al. |
| 8,129,718 B2 | 3/2012 | Hayashi et al. |
| 8,137,594 B2 | 3/2012 | Imanishi et al. |
| 8,148,779 B2 | 4/2012 | Jeong et al. |
| 8,168,544 B2 | 5/2012 | Chang |
| 8,188,480 B2 | 5/2012 | Itai |
| 8,193,045 B2 | 6/2012 | Omura et al. |
| 8,198,117 B2 | 6/2012 | Leidholm et al. |
| 8,202,365 B2 | 6/2012 | Umeda et al. |
| 8,203,143 B2 | 6/2012 | Imai |
| 8,207,522 B2 | 6/2012 | Aranami et al. |
| 8,207,756 B2 | 6/2012 | Shionoiri et al. |
| 8,236,635 B2 | 8/2012 | Suzawa et al. |
| 8,242,494 B2 | 8/2012 | Suzawa et al. |
| 8,274,078 B2 | 9/2012 | Itagaki et al. |
| 8,304,765 B2 | 11/2012 | Yamazaki et al. |
| 8,309,961 B2 | 11/2012 | Yamazaki et al. |
| 8,319,215 B2 | 11/2012 | Yamazaki et al. |
| 8,319,218 B2 | 11/2012 | Yamazaki et al. |
| 8,343,799 B2 | 1/2013 | Ito et al. |
| 8,426,243 B2 | 4/2013 | Hayashi et al. |
| 8,748,879 B2 | 6/2014 | Yano et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2002/0139688 A1 | 10/2002 | Okura et al. |
| 2003/0189401 A1 | 10/2003 | Kido et al. |
| 2003/0218222 A1 | 11/2003 | Wager et al. |
| 2004/0023432 A1 | 2/2004 | Haga |
| 2004/0038446 A1 | 2/2004 | Takeda et al. |
| 2004/0051109 A1 | 3/2004 | Ishizaki et al. |
| 2004/0127038 A1 | 7/2004 | Carcia et al. |
| 2005/0016462 A1 | 1/2005 | Yamazaki |
| 2005/0017302 A1 | 1/2005 | Hoffman |
| 2005/0031799 A1 | 2/2005 | Matsumoto et al. |
| 2005/0081912 A1 | 4/2005 | Okura et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0060237 A1 | 3/2006 | Leidholm et al. |
| 2006/0065186 A1 | 3/2006 | Kumoni |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0273387 A1* | 12/2006 | Hisanaga ............... 257/330 |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0057261 A1 | 3/2007 | Jeong et al. |
| 2007/0068569 A1 | 3/2007 | Nam et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1* | 8/2007 | Hirao et al. ............... 257/43 |
| 2007/0187760 A1 | 8/2007 | Furuta et al. |
| 2007/0194379 A1 | 8/2007 | Hosono et al. |
| 2007/0248132 A1* | 10/2007 | Kikuchi et al. ............ 372/44.01 |
| 2007/0252928 A1 | 11/2007 | Ito et al. |
| 2007/0272922 A1 | 11/2007 | Kim et al. |
| 2007/0287221 A1 | 12/2007 | Ong et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0099803 A1 | 5/2008 | Li et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0280058 A1 | 11/2008 | Krunks et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0315200 A1* | 12/2008 | Kim et al. ............... 257/57 |
| 2009/0002590 A1 | 1/2009 | Kimura |
| 2009/0008638 A1 | 1/2009 | Kang et al. |

(56) References Cited

U.S. PATENT DOCUMENTS

| | | | |
|---|---|---|---|
| 2009/0068773 A1 | 3/2009 | Lai et al. | |
| 2009/0072232 A1 | 3/2009 | Hayashi et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0137103 A1 | 5/2009 | Yamazaki | |
| 2009/0152506 A1 | 6/2009 | Umeda et al. | |
| 2009/0152541 A1 | 6/2009 | Maekawa et al. | |
| 2009/0189155 A1 | 7/2009 | Akimoto | |
| 2009/0189156 A1 | 7/2009 | Akimoto | |
| 2009/0223079 A1 | 9/2009 | Myong | |
| 2009/0278122 A1 | 11/2009 | Hosono et al. | |
| 2009/0280600 A1 | 11/2009 | Hosono et al. | |
| 2009/0283762 A1 | 11/2009 | Kimura | |
| 2010/0026169 A1* | 2/2010 | Jeong et al. | 313/504 |
| 2010/0043859 A1 | 2/2010 | Aranami et al. | |
| 2010/0044701 A1 | 2/2010 | Sano et al. | |
| 2010/0051938 A1 | 3/2010 | Hayashi et al. | |
| 2010/0051949 A1 | 3/2010 | Yamazaki et al. | |
| 2010/0065839 A1 | 3/2010 | Yamazaki et al. | |
| 2010/0065840 A1 | 3/2010 | Yamazaki et al. | |
| 2010/0065844 A1 | 3/2010 | Tokunaga | |
| 2010/0072467 A1 | 3/2010 | Yamazaki et al. | |
| 2010/0084648 A1 | 4/2010 | Watanabe | |
| 2010/0084650 A1 | 4/2010 | Yamazaki et al. | |
| 2010/0092800 A1 | 4/2010 | Itagaki et al. | |
| 2010/0102312 A1 | 4/2010 | Yamazaki et al. | |
| 2010/0105163 A1 | 4/2010 | Ito et al. | |
| 2010/0109002 A1 | 5/2010 | Itagaki et al. | |
| 2010/0117075 A1 | 5/2010 | Akimoto et al. | |
| 2010/0117999 A1 | 5/2010 | Matsunaga et al. | |
| 2010/0123130 A1 | 5/2010 | Akimoto et al. | |
| 2010/0123136 A1 | 5/2010 | Lee et al. | |
| 2010/0155717 A1 | 6/2010 | Yano et al. | |
| 2010/0193782 A1 | 8/2010 | Sakata | |
| 2010/0200843 A1* | 8/2010 | Arai et al. | 257/40 |
| 2010/0244017 A1* | 9/2010 | Hoffman et al. | 257/43 |
| 2010/0276685 A1 | 11/2010 | Itagaki et al. | |
| 2010/0283037 A1* | 11/2010 | Omata et al. | 257/13 |
| 2010/0295042 A1 | 11/2010 | Yano et al. | |
| 2010/0301329 A1 | 12/2010 | Asano et al. | |
| 2010/0320458 A1 | 12/2010 | Umeda et al. | |
| 2010/0320459 A1 | 12/2010 | Umeda et al. | |
| 2011/0024755 A1* | 2/2011 | Korenari et al. | 257/59 |
| 2011/0031497 A1 | 2/2011 | Yamazaki et al. | |
| 2011/0032444 A1 | 2/2011 | Yamazaki et al. | |
| 2011/0050733 A1 | 3/2011 | Yano et al. | |
| 2011/0062433 A1 | 3/2011 | Yamazaki | |
| 2011/0062436 A1 | 3/2011 | Yamazaki et al. | |
| 2011/0117698 A1 | 5/2011 | Suzawa et al. | |
| 2011/0193083 A1 | 8/2011 | Kim et al. | |
| 2011/0215328 A1 | 9/2011 | Morosawa et al. | |
| 2012/0119205 A1 | 5/2012 | Taniguchi et al. | |
| 2012/0256179 A1 | 10/2012 | Yamazaki et al. | |
| 2013/0062601 A1 | 3/2013 | Yamazaki et al. | |
| 2013/0207106 A1 | 8/2013 | Hayashi et al. | |

FOREIGN PATENT DOCUMENTS

| | | |
|---|---|---|
| EP | 1 737 044 A | 12/2006 |
| EP | 1770728 A | 4/2007 |
| EP | 1900859 A | 3/2008 |
| EP | 1905874 A | 4/2008 |
| EP | 1921681 A | 5/2008 |
| EP | 2068367 | 6/2009 |
| EP | 2159844 A | 3/2010 |
| EP | 2 226 847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-035019 A | 2/1992 |
| JP | 05-251705 | 9/1993 |
| JP | 08-264794 | 10/1996 |
| JP | 11-505377 | 5/1999 |
| JP | 2000-026119 | 1/2000 |
| JP | 2000-044236 A | 2/2000 |
| JP | 2000-150900 | 5/2000 |
| JP | 2002-076356 A | 3/2002 |
| JP | 2002-170993 A | 6/2002 |
| JP | 2002-289859 A | 10/2002 |
| JP | 2002-356400 A | 12/2002 |
| JP | 2003-023161 A | 1/2003 |
| JP | 2003-029293 | 1/2003 |
| JP | 2003-041362 | 2/2003 |
| JP | 2003-086000 | 3/2003 |
| JP | 2003-086808 | 3/2003 |
| JP | 2004-103957 | 4/2004 |
| JP | 2004-273614 A | 9/2004 |
| JP | 2004-273732 A | 9/2004 |
| JP | 2006-310186 A | 11/2006 |
| JP | 2007-081362 | 3/2007 |
| JP | 2007-095682 A | 4/2007 |
| JP | 2007-096055 | 4/2007 |
| JP | 2007-121788 | 5/2007 |
| JP | 2007-123861 | 5/2007 |
| JP | 2007-163467 | 6/2007 |
| JP | 2007-171932 | 7/2007 |
| JP | 2007-220820 | 8/2007 |
| JP | 2007-529117 | 10/2007 |
| JP | 2008-098447 A | 4/2008 |
| JP | 2008-098637 A | 4/2008 |
| JP | 2009-010362 | 1/2009 |
| JP | 2009-505430 | 2/2009 |
| JP | 2009-099847 | 5/2009 |
| JP | 2009-167087 | 7/2009 |
| JP | 2009-231613 | 10/2009 |
| JP | 2009-265271 | 11/2009 |
| JP | 2010-016347 | 1/2010 |
| JP | 4415062 | 2/2010 |
| JP | 2010-067954 | 3/2010 |
| JP | 2010-080936 A | 4/2010 |
| JP | 2010-098280 | 4/2010 |
| JP | 2010-177431 | 8/2010 |
| JP | 4571221 | 10/2010 |
| JP | 2011-100979 A | 5/2011 |
| JP | 2012-160679 | 8/2012 |
| KR | 2007-0110320 A | 11/2007 |
| KR | 2008-0066678 A | 7/2008 |
| KR | 2009-0054902 A | 6/2009 |
| WO | 2004/114391 | 12/2004 |
| WO | WO-2005/093847 | 10/2005 |
| WO | WO-2006/129650 | 12/2006 |
| WO | WO-2007/022221 | 2/2007 |
| WO | 2007/058231 | 5/2007 |
| WO | WO-2007/094501 | 8/2007 |
| WO | 2007/108293 | 9/2007 |
| WO | WO-2007/142167 | 12/2007 |
| WO | 2008/096768 | 8/2008 |
| WO | 2008/117810 | 10/2008 |
| WO | 2008/126879 | 10/2008 |
| WO | 2008/126884 | 10/2008 |
| WO | 2008/133345 | 11/2008 |
| WO | WO-2008/136505 | 11/2008 |
| WO | 2008/149873 | 12/2008 |
| WO | 2009/034953 | 3/2009 |
| WO | WO-2009/093625 | 7/2009 |
| WO | WO-2011/043176 | 4/2011 |

OTHER PUBLICATIONS

Kimizuka et al., "Syntheses and Single-Crystal Data of Homologous Compounds, $In_2O_3(ZnO)_m$ (m =3, 4, and 5), $InGaO_3(ZnO)_3$, and $Ga_2O_3(ZnO)_m$ (m =7, 8, 9, and 16) in the $In_2O_3$-$ZnGa_2O_4$-ZnO System," Journal of Solid State Chemistry, Apr. 1, 1995, vol. 116, No. 1, pp. 170-178.

Nakamura et al., "The Phase Relations in the $In_2O_3$-$Ga_2ZnO_4$-ZnO System at 1350° C.," Journal of Solid State Chemistry, Aug. 1, 1991, vol. 93, No. 2, pp. 298-315.

(56) References Cited

OTHER PUBLICATIONS

Li et al., "Modulated Structures of Homologous Compounds $InMO_3(ZnO)_m$ (M=In,Ga; m=Integer) Described by Four-Dimensional Superspace Group," Journal of Solid State Chemistry, 1998, vol. 139, pp. 347-355.
Nomura et al., "Room-Temperature Fabrication of Transparent Flexible Thin-Film Transistors Using Amorphous Oxide Semiconductors," Nature, Nov. 25, 2004, vol. 432, pp. 488-492.
Nomura et al., "Thin-Film Transistor Fabricated in Single-Crystalline Transparent Oxide Semiconductor," Science, May 23, 2003, vol. 300, No. 5623, pp. 1269-1272.
Lee et al., "Current Status of, Challenges to, and Perspective View of AM-OLED," IDW '06: Proceedings of the 13th International Display Workshops, Dec. 7, 2006, pp. 663-666.
Jeong et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.
Asaoka et al., "29.1: Polarizer-Free Reflective LCD Combined With Ultra Low-Power Driving Technology," SID Digest '09: SID International Symposium Digest of Technical Papers, 2009, pp. 395-398.
Tsuda et al., "Ultra Low Power Consumption Technologies for Mobile TFT-LCDs," IDW '02: Proceedings of the 9th International Display Workshops, Dec. 4, 2002, pp. 295-298.
Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.
Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.
Ikeda et al., "Full-Functional System Liquid Crystal Display Using CG-Silicon Technology," SID Digest '04: SID International Symposium Digest of Technical Papers, 2004, vol. 35, pp. 860-863.
Kurokawa et al., "UHF RFCPUS on Flexible and Glass Substrates for Secure RFID Systems," Journal of Solid-State Circuits, 2008, vol. 43, No. 1, pp. 292-299.
Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.
Hirao et al., "Novel Top-Gate Zinc Oxide Thin-Film Transistors (ZnO TFTs) for AMLCDs," Journal of the SID, 2007, vol. 15, No. 1, pp. 17-22.
Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.
Park et al., "Challenge to Future Displays: Transparent AM-OLED Driven by PEALD Grown ZnO TFT," IMID '07 Digest, 2007, pp. 1249-1252.
Park et al., "Amorphous Indium—Gallium—Zinc Oxide TFTs and their Application for Large Size AMOLED," AM-FPD '08 Digest of Technical Papers, Jul. 2, 2008, pp. 275-278.
Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.
Lee et al., "15.4: Excellent Performance of Indium-Oxide-Based Thin-Film Transistors by DC Sputtering," SID Digest '09: SID International Symposium Digest of Technical Papers, May 31, 2009, pp. 191-193.
Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.
Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.
Meiboom et al., "Theory of the Blue Phase of Cholesteric Liquid Crystals," Phys. Rev. Lett. (Physical Review Letters), May 4, 1981, vol. 46, No. 18, pp. 1216-1219.
Costello et al., "Electron Microscopy of a Cholesteric Liquid Crystal and Its Blue Phase," Phys. Rev. A (Physical Review. A), May 1, 1984, vol. 29, No. 5, pp. 2957-2959.
Kitzerow et al., "Observation of Blue Phases in Chiral Networks," Liquid Crystals, 1993, vol. 14, No. 3, pp. 911-916.
Kikuchi et al., "Polymer-Stabilized Liquid Crystal Blue Phases," Nature Materials, Sep. 2, 2002, vol. 1, pp. 64-68.
Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.
Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.
Park et al., "High performance amorphous oxide thin film transistors with self-aligned top-gate structure," IEDM 09: Technical Digest of International Electron Devices Meeting, Dec. 7, 2009, pp. 191-194.
Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Miyasaka, "58.2: Invited Paper: Suftla Flexible Microelectronics on their Way to Business," SID Digest '07: SID International Symposium Digest of Technical Papers, 2007, vol. 38, pp. 1673-1676.
Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.
Prins et al., "A Ferroelectric Transparent Thin-Film Transistor," Appl. Phys. Lett. (Applied Physics Letters), Jun. 17, 1996, vol. 68, No. 25, pp. 3650-3652.
Takahashi et al., "Theoretical Analysis of IGZO Transparent Amorphous Oxide Semiconductor," IDW '08: Proceedings of the 15th International Display Workshops, Dec. 3, 2008, pp. 1637-1640.
Osada et al., "15.2: Development of Driver-Integrated Panel using Amorphous In—Ga—Zn—Oxide TFT," SID Digest '09: SID International Symposium Digest of Technical Papers, May 31, 2009, pp. 184-187.
Ohara et al., "21.3: 4.0 In. QVGA AMOLED Display Using In—Ga—Zn—Oxide TFTs with a Novel Passivation Layer," SID Digest '09: SID International Symposium Digest of Technical Papers, May 31, 2009, pp. 284-287.
Godo et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.
Osada et al., "Development of Driver-Integrated Panel using Amorphous In—Ga—Zn—Oxide TFT," AM-FPD '09 Digest of Technical Papers, Jul. 1, 2009, pp. 33-36.
Godo et al., "Temperature Dependence of Characteristics and Electronic Structure for Amorphous In—Ga—Zn—Oxide TFT," AM-FPD '09 Digest of Technical Papers, Jul. 1, 2009, pp. 41-44.
Ohara et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.
Sakata et al., "Development of 4.0-In. AMOLED Display with Driver Circuit Using Amorphous In—Ga—Zn—Oxide TFTS," IDW '09: Proceedings of the 16th International Display Workshops, 2009, pp. 689-692.
International Search Report (Application No. PCT/JP2010/065190) dated Oct. 5, 2010.
Written Opinion (Application No. PCT/JP2010/065190) dated Oct. 5, 2010.
Fortunato et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.
Park et al., "Improvements in the Device Characteristics of Amorphous Indium Gallium Zinc Oxide Thin-Film Transistors by Ar

(56) References Cited

OTHER PUBLICATIONS

Plasma Treatment," Appl. Phys. Lett. (Applied Physics Letters), Jun. 26, 2007, vol. 90, No. 26, pp. 262106-1-262106-3.

Hayashi et al., "42.1: Invited Paper: Improved Amorphous In—Ga—Zn—O TFTs," SID Digest '08: SID International Symposium Digest of Technical Papers, May 20, 2008, vol. 39, pp. 621-624.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Nomura et al., "Carrier transport in transparent oxide semiconductor with intrinsic structural randomness probed using single-crystalline $InGaO3(ZnO)_5$ films," Appl. Phys. Lett. (Applied Physics Letters), Sep. 13, 2004, vol. 85, No. 11, pp. 1993-1995.

Son et al., "42.4L: Late-News Paper: 4 Inch QVGA AMOLED Driven by the Threshold Voltage Controlled Amorphous GIZO ($Ga_2O_3$-$In_2O_3$-ZnO) TFT," SID Digest '08: SID International Symposium Digest of Technical Papers, May 20, 2008, vol. 39, pp. 633-636.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Nakamura, "Synthesis of Homologous Compound with New Long-Period Structure," NIRIM Newsletter, Mar. 1, 1995, vol. 150, pp. 1-4.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent $InGaZnO_4$," Phys. Rev. B (Physical Review B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review. B), Oct. 4, 2007, vol. 76, No. 16, pp. 165202-1-165202-22.

Park et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review B), 2008, vol. 77, pp. 245202-1-245202-6.

Orita et al., "Amorphous transparent conductive oxide $InGaO_3(ZnO)_m$ (m<4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size AMOLED Displays," IDW '08: Proceedings of the $6^{th}$ International Display Workshops, Dec. 3, 2008, pp. 581-584.

Kim et al., "High-Performance oxide thin film transistors passivated by various gas plasmas," $214^{th}$ ECS Meeting, 2008, No. 2317.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.

Nakayama et al., "17a-TL-8 Effect of GaO Layer on IGZO-TFT Channel," Extended Abstracts (The $57_{th}$ Spring Meeting 2010), The Japan Society of Applied Physics and Related Societies, Mar. 17, 2010, pp. 21-008.

Advisory Action (U.S. Appl. No. 12/880,343) dated Mar. 14, 2013.
Office Action (U.S. Appl. No. 12/880,343) dated Dec. 5, 2012.
Office Action (U.S. Appl. No. 12/880,343) dated Sep. 24, 2012.
Office Action (U.S. Appl. No. 12/880,343) dated Mar. 14, 2012.
Office Action (U.S. Appl. No. 12/880,343) dated May 16, 2012.

Yoshino.Y et al., "Effects of Interface Micro Structure in Crystallization of ZnO Thin Films Prepared by Radio Frequency Sputtering", Vacuum, 1998, vol. 51, No. 4, pp. 601-607.

Taiwanese Office Action (Application No. 099131261) Dated Jan. 15, 2015.

Korean Office Action (Application No. 2014-7029110) Dated Jun. 15, 2015.

Taiwanese Office Action (Application No. 103139363) Dated Aug. 21, 2015.

\* cited by examiner

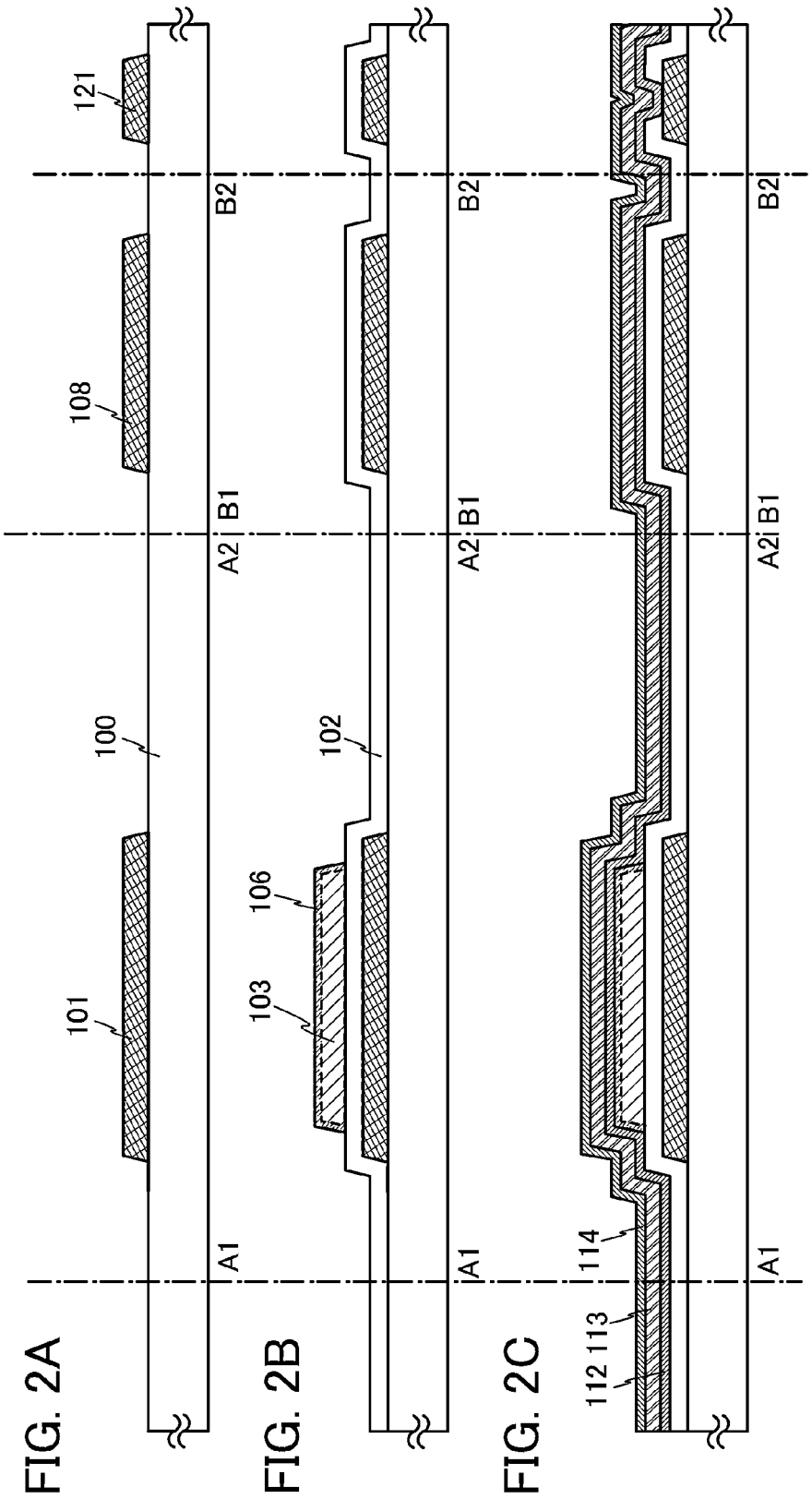

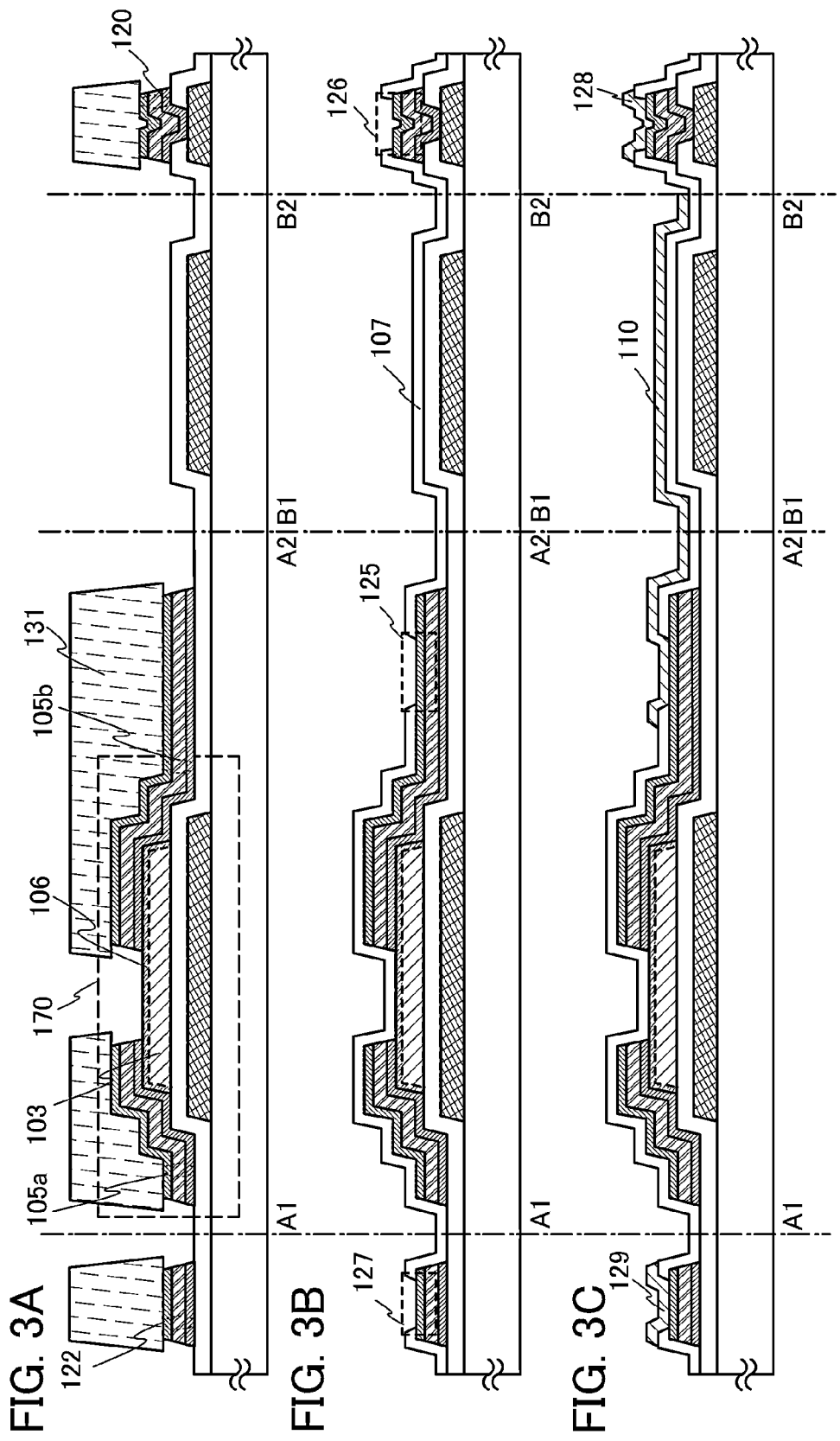

FIG. 8A1
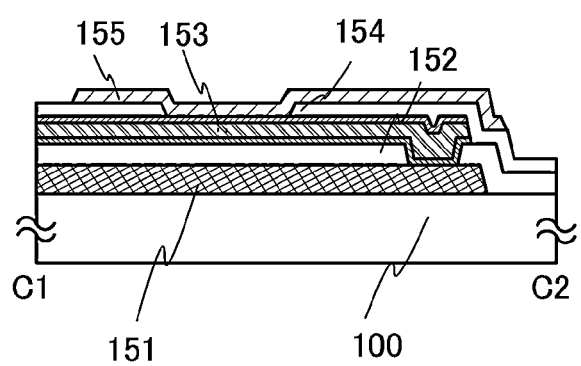
FIG. 8A2
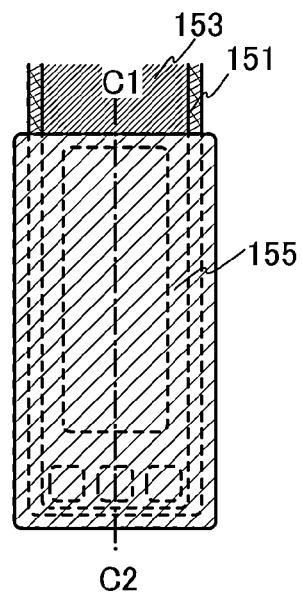
FIG. 8B1
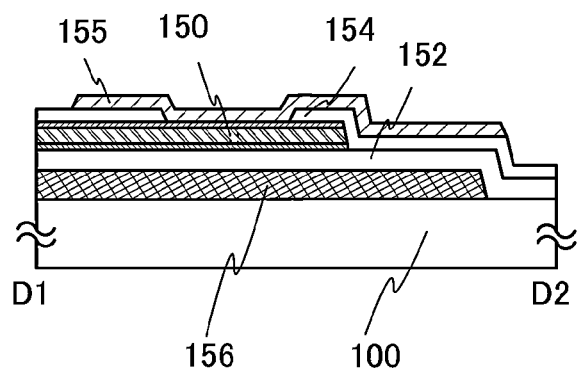
FIG. 8B2
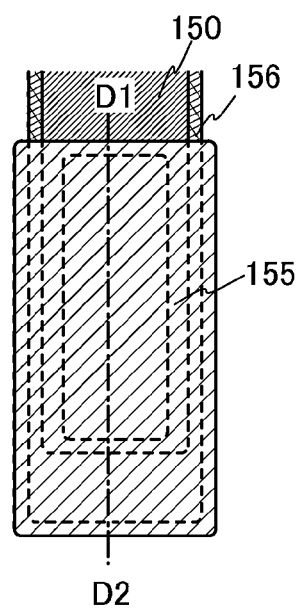

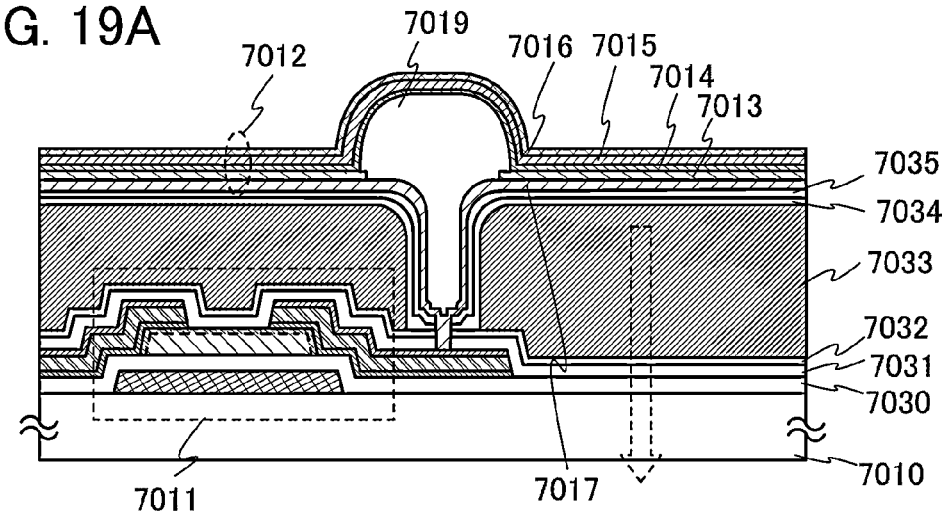
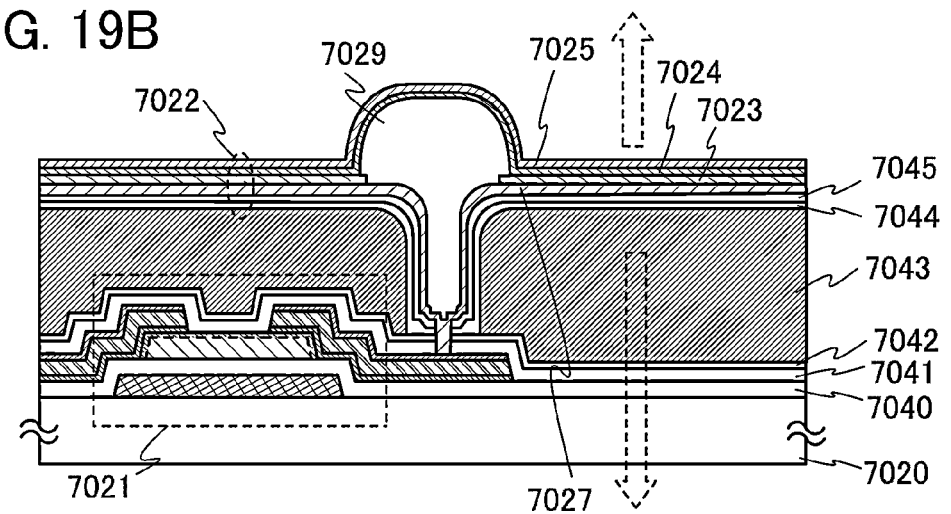
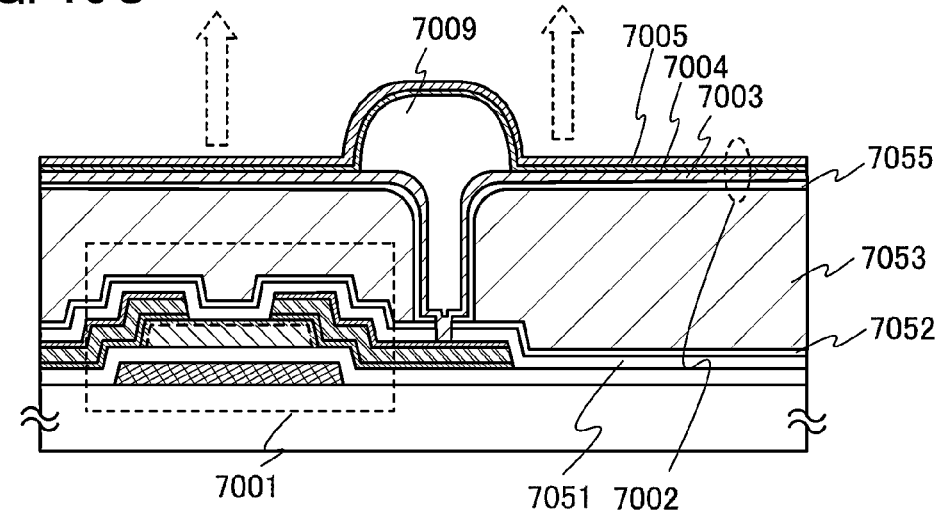

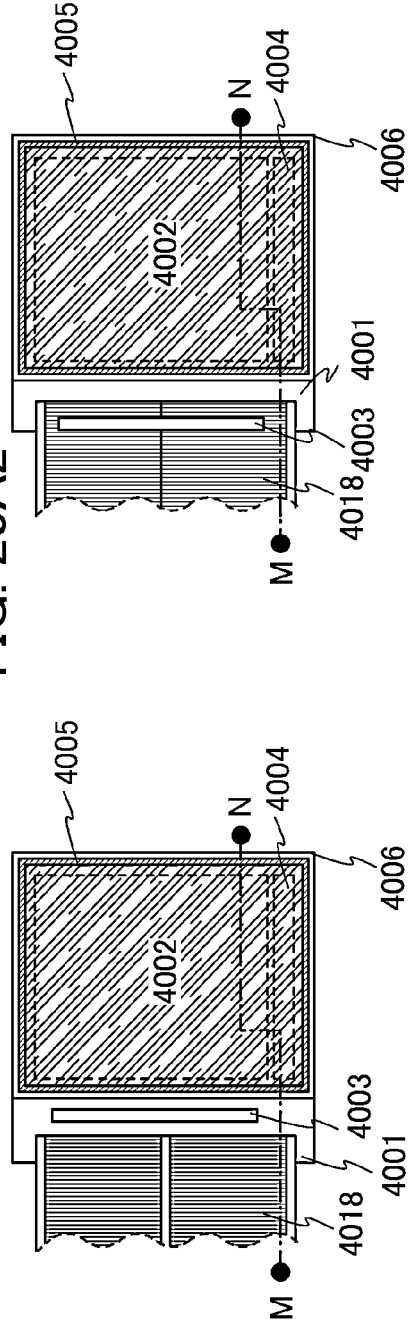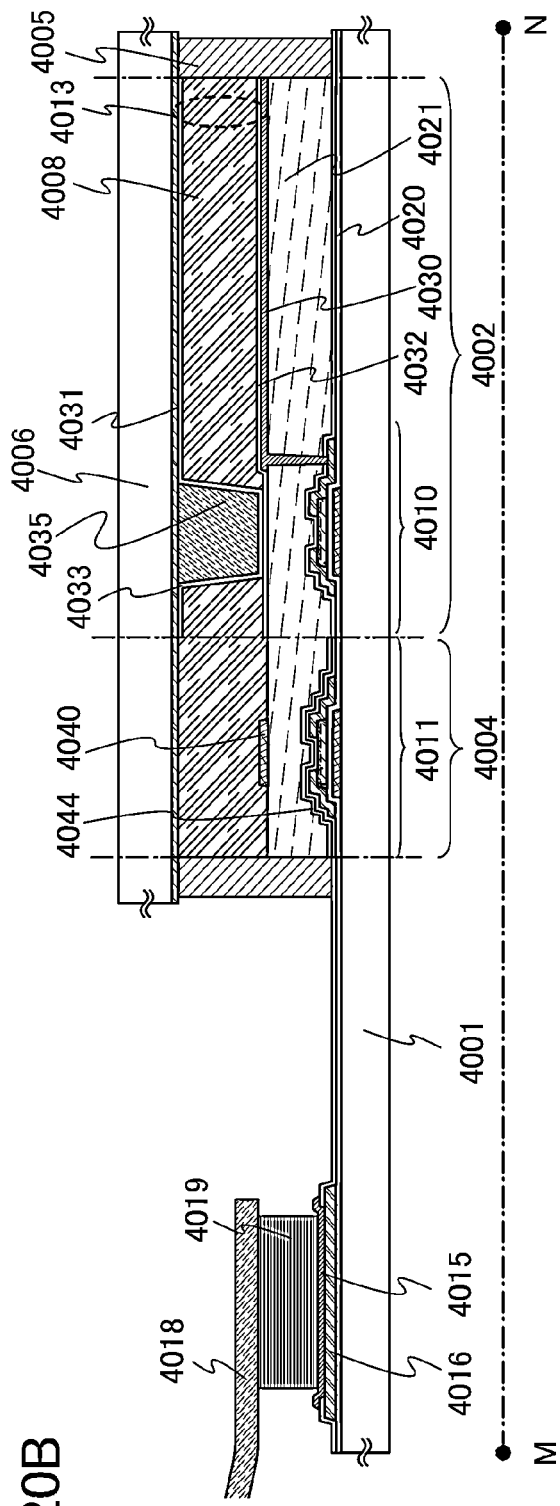
FIG. 20A1
FIG. 20A2
FIG. 20B

US 9,214,563 B2

OXIDE SEMICONDUCTOR FILM AND SEMICONDUCTOR DEVICE

TECHNICAL FIELD

The present invention relates to an oxide semiconductor film, a semiconductor device including the oxide semiconductor film, and a display device including the semiconductor device.

BACKGROUND ART

In recent years, techniques to form thin film transistors (TFT) using a semiconductor thin film (with a thickness of approximately several nanometers to several hundreds of nanometers) which is formed over a substrate having an insulating surface have attracted attention. Thin film transistors are widely applied to electronic devices such as ICs and electro-optic devices and are particularly expected to be rapidly developed as switching elements of image display devices. Various metal oxides are used for a variety of applications. Indium oxide is a well-known material and is used as a transparent electrode material which is necessary for liquid crystal displays and the like.

Some metal oxides have semiconductor characteristics. Examples of such metal oxides having semiconductor characteristics include tungsten oxide, tin oxide, indium oxide, and zinc oxide. Thin film transistors in each of which a channel formation region is formed using such metal oxide having semiconductor characteristics have been known (Patent Documents 1 and 2).

Transistors to which oxide semiconductors are applied have relatively high field effect mobility among transistors to which other semiconductors having amorphous structures are applied. Therefore, driver circuits of display devices and the like can also be formed using the transistors to which oxide semiconductors are applied.

REFERENCE

[Patent Document 1] Japanese Published Patent Application No. 2007-123861
[Patent Document 2] Japanese Published Patent Application No. 2007-96055

DISCLOSURE OF INVENTION

When a plurality of different circuits is formed over an insulating surface, for example, when a pixel portion and a driver circuit are formed over one substrate, excellent switching characteristics such as a high on-off ratio are needed for a transistor used for the pixel portion, while high operation speed is needed for a transistor used for the driver circuit. A transistor used for the driver circuit preferably operates at high speed, since write time of a display image is reduced particularly as the definition of a display device is increased.

An object of one embodiment of the present invention is to provide a highly reliable semiconductor device with good electric characteristics and a display device including the semiconductor device as a switching element.

One embodiment of the present invention includes a semiconductor device in which a needle crystal group provided on at least one surface side of an oxide semiconductor layer forming a channel formation region grows in a c-axis direction perpendicular to the surface and includes an a-b plane parallel to the surface, and a region except for the needle crystal group is an amorphous region or a region in which amorphousness and microcrystals are mixed.

One embodiment of the present invention is an oxide semiconductor film which includes a needle crystal group on at least one surface side, and the needle crystal group grows in a c-axis direction perpendicular to the surface and includes an a-b plane parallel to the surface. A length of a needle crystal in the needle crystal group in the c-axis direction is greater than or equal to five times as long as a length in a direction of an a-axis or a b-axis. A region except for the needle crystal group is an amorphous region or a region in which amorphousness and microcrystals are mixed.

Another embodiment of the present invention is a semiconductor device including a gate electrode layer over an insulating surface; a gate insulating layer over the gate electrode layer; an oxide semiconductor layer over the gate insulating layer; a source electrode layer and a drain electrode layer which overlap with part of the oxide semiconductor layer, and are over the gate insulating layer; and an oxide insulating layer in contact with the oxide semiconductor layer, over the source electrode layer and the drain electrode layer. The oxide semiconductor layer includes a needle crystal group on at least one surface side, and the needle crystal group grows in a c-axis direction perpendicular to the surface and includes an a-b plane parallel to the surface. A length of a needle crystal in the needle crystal group in the c-axis direction is greater than or equal to five times as long as a length in a direction of an a-axis or a b-axis. A region except for the needle crystal group is an amorphous region or a region in which amorphousness and microcrystals are mixed.

Note that the length of the needle crystal in the direction of the a-axis or the b-axis is preferably greater than or equal to 2 nm and less than or equal to 50 nm. A crystal structure of the needle crystal group is preferably represented by $In_2Ga_2ZnO_7$. It is preferable that a composition of the amorphous region or the region in which amorphousness and microcrystals are mixed be represented by $InGaO_3(ZnO)_m$ and that m be not a natural number (m>0). A molar ratio of In to Ga to Zn of the amorphous region or the region in which amorphousness and microcrystals are mixed is preferably 1:1:0.5. The thickness of the oxide semiconductor layer is preferably greater than or equal to 10 nm and less than or equal to 200 nm.

Another embodiment of the present invention is a method for manufacturing a semiconductor device, including the steps of: forming a gate electrode layer over a substrate having an insulating surface; forming a gate insulating layer over the gate electrode layer; forming an oxide semiconductor layer over the gate insulating layer; performing heat treatment at a temperature of higher than or equal to 400° C. and lower than or equal to 700° C. after the oxide semiconductor layer is formed, so that a needle crystal group including needle crystals grown in a c-axis direction perpendicular to the surface and having an a-b plane parallel to the surface and having a length in the c-axis direction greater than or equal to five times as long as a length in a direction of the a-axis or the b-axis is formed on a surface of the oxide semiconductor layer; forming a source electrode layer and a drain electrode layer over the oxide semiconductor layer; and forming an oxide insulating layer in contact with part of the oxide semiconductor layer, over the source electrode layer and the drain electrode layer.

Note that the heat treatment is preferably performed with an RTA method. The heat treatment is preferably performed under a nitrogen atmosphere or a rare gas atmosphere.

As one embodiment of the present invention, a transistor having a bottom gate structure is used. As the transistor having a bottom gate structure, there are a transistor in which an oxide semiconductor layer is over and overlaps with a source electrode layer and a drain electrode layer and a transistor in which a source electrode layer and a drain electrode layer are over and overlap with an oxide semiconductor layer. Either of the transistors can be used.

In the case of a transistor in which a source electrode layer and a drain electrode layer are over and overlap with an oxide semiconductor layer, it is preferable that a superficial portion of the oxide semiconductor layer be not etched and a needle crystal group remains in an upper portion of a channel formation region.

In the above structure, the gate electrode layer, the source electrode layer, and the drain electrode layer of the transistor is formed using a film which includes a metal element selected from aluminum, copper, molybdenum, titanium, chromium, tantalum, tungsten, neodymium, and scandium as its main component or a an alloy film of any of the elements. Each of the gate electrode layer, the source electrode layer, and the drain electrode layer is not limited to a single layer containing any of the above-described elements and may be a stack of two or more layers.

A light-transmitting oxide conductive layer of indium oxide, an alloy of indium oxide and tin oxide, an alloy of indium oxide and zinc oxide, zinc oxide, zinc aluminum oxide, zinc aluminum oxynitride, zinc gallium oxide, or the like is used for the source electrode layer, the drain electrode layer, and the gate electrode layer, so that a light-transmitting property in a pixel portion can be improved and an aperture ratio can be increased.

The oxide conductive layer can be formed between the oxide semiconductor layer and the film including the metal element as its main component, which is for forming the source electrode layer and the drain electrode layer, whereby a transistor which has low contact resistance and can operate at high speed can be formed.

In the above structure, the transistor includes the oxide semiconductor layer and an oxide insulating layer over the oxide semiconductor layer. The oxide insulating layer in contact with the channel formation region of the oxide semiconductor layer functions as a channel protective layer.

In the above structure, as the oxide insulating layer which serves as the channel protective layer of the transistor, an inorganic insulating film formed with a sputtering method is used; typically, a silicon oxide film, a silicon nitride oxide film, an aluminum oxide film, an aluminum oxynitride film, or the like is used.

As the oxide semiconductor layer, a thin film of $InMO_3(ZnO)_m$ (m>0) is formed. The thin film is used as an oxide semiconductor layer to form a thin film transistor. Note that M denotes one metal element or a plurality of metal elements selected from Ga, Fe, Ni, Mn, and Co. As an example, M may be Ga or may include the above metal element in addition to Ga, for example, M may be Ga and Ni or Ga and Fe. Moreover, in the oxide semiconductor, in some cases, a transition metal element such as Fe or Ni or an oxide of the transition metal is contained as an impurity element in addition to a metal element contained as M. In this specification, among the oxide semiconductor layers whose composition formulas are represented by $InMO_3(ZnO)_m$ (m>0), an oxide semiconductor which includes Ga as M is referred to as an In—Ga—Zn—O-based oxide semiconductor, and a thin film of the In—Ga—Zn—O-based oxide semiconductor is also referred to as an In—Ga—Zn—O-based film.

As a metal oxide applied to the oxide semiconductor layers, any of the following oxide semiconductors can be applied besides the above: an In—Sn—O-based, an In—Sn—Zn—O-based, an In—Al—Zn—O-based, a Sn—Ga—Zn—O-based, an Al—Ga—Zn—O-based, a Sn—Al—Zn—O-based, an In—Zn—O-based, a Sn—Zn—O-based, an Al—Zn—O-based, an In—O-based, a Sn—O-based, and a Zn—O-based metal oxide. Silicon oxide may be included in the oxide semiconductor layer formed using the metal oxide.

For the oxide semiconductor layer, the one which is subjected to dehydration or dehydrogenation at high temperature in a short time with an RTA method or the like is used. By this heat treatment process, a needle crystal group provided on at least one surface side of a superficial portion of the oxide semiconductor layer grows in a c-axis direction perpendicular to the surface and has an a-b plane parallel to the surface, and a region except for the needle crystal group of the oxide semiconductor layer is an amorphous region or a region in which amorphousness and microcrystals are mixed.

An oxide semiconductor layer having such a structure is used, whereby deterioration of electric characteristics due to a change to n-type caused by entry of moisture or elimination of oxygen to or from the superficial portion of the oxide semiconductor layer can be prevented. The superficial portion of the oxide semiconductor layer is on a back channel side and has a needle crystal group including a microcrystalline layer, so that generation of a parasitic channel can be suppressed. In the transistor having a structure in which the source electrode layer and the drain electrode layer are over and overlap with the oxide semiconductor layer, the needle crystal group is provided, whereby contact resistance between the superficial portion of the oxide semiconductor layer and the source and drain electrode layers can be reduced.

In the case where the oxide semiconductor layer is formed into an island shape after dehydration or dehydrogenation, no needle crystal group is formed in side surface portions. Although a needle crystal group is formed only in an upper layer portion, except for the side surface portions, an area rate of the side surface portion is small and the above effect is not prevented.

A display device can be formed using a driver circuit portion and a pixel portion which are formed using transistors each of which is one embodiment of the present invention, over the same substrate, and an EL element, a liquid crystal element, an electrophoretic element, or the like.

In the display device which is one embodiment of the present invention, a plurality of transistors is provided in a pixel portion, and the pixel portion has a region in which a gate electrode of one of the transistors is connected to a source wiring or a drain wiring of another transistor. In addition, in a driver circuit of the display device which is one embodiment of the present invention, there is a region where a gate electrode of a transistor is connected to a source wiring or a drain wiring of the transistor.

Since a transistor is easily broken due to static electricity or the like, a protective circuit for protecting the transistor for the pixel portion is preferably provided over the same substrate for a gate line or a source line. The protective circuit is preferably formed with a non-linear element including an oxide semiconductor layer.

Note that the ordinal numbers such as "first" and "second" in this specification are used for convenience and do not denote the order of steps and the stacking order of layers. In addition, the ordinal numbers in this specification do not denote particular names which specify the present invention.

In this specification, a semiconductor device generally means a device which can function by utilizing semiconductor characteristics, and an electrooptic device, a semiconductor circuit, and electronic devices are all semiconductor devices.

In a transistor including an oxide semiconductor layer, a needle crystal group provided on at least one surface side of the oxide semiconductor layer grows in a c-axis direction perpendicular to the surface and includes an a-b plane parallel to the surface, and a portion except for the needle crystal group is an amorphous region or a region in which amorphousness and microcrystals are mixed. Accordingly, a highly reliable semiconductor device with good electric characteristics can be formed.

BRIEF DESCRIPTION OF DRAWINGS

FIGS. 2A to 2C are cross-sectional process views illustrating one embodiment of the present invention.

FIGS. 3A to 3C are cross-sectional process views illustrating one embodiment of the present invention.

FIGS. 8A1, 8A2, 8B1, and 8B2 are plan views and cross-sectional views illustrating one embodiment of the present invention.

FIGS. 19A to 19C are cross-sectional views each illustrating one embodiment of the present invention.

FIGS. 20A1, 20A2 and 20B are plan views and a cross-sectional view illustrating one embodiment of the present invention.

BEST MODE FOR CARRYING OUT THE INVENTION

Figure 1A:
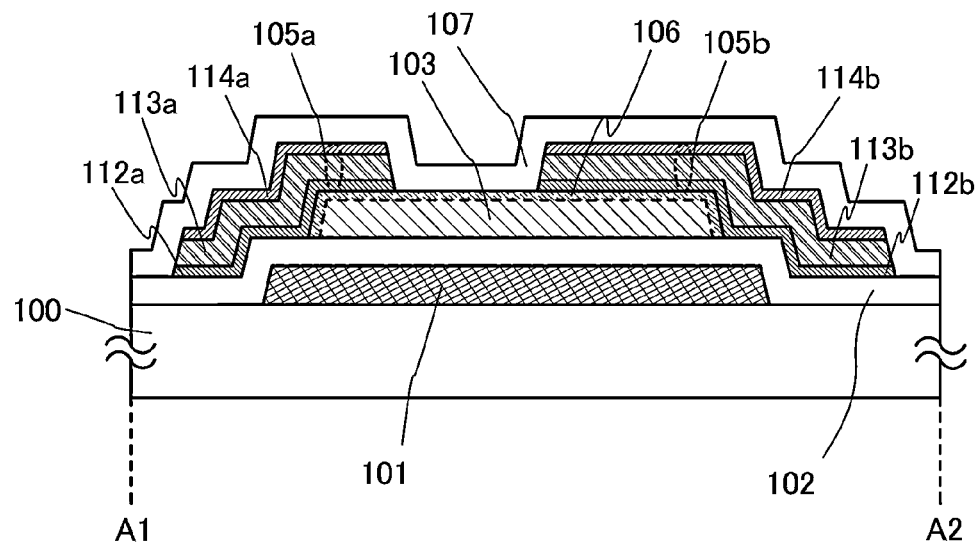
FIGS. 1A and 1B are a cross-sectional view and a plan view each illustrating one embodiment of the present invention.

Embodiments and examples will be described with reference to drawings. Note that the present invention is not limited to the following description, and it will be easily understood by those skilled in the art that the modes and details of the present invention can be modified in various ways without departing from the spirit and scope of the present invention. Therefore, the present invention should not be construed as being limited to the following description of the embodiments and examples. Note that in structures of the present invention described below, the same portions or portions having similar functions are denoted by the same reference numerals in different drawings, and description thereof is omitted.

Embodiment 1

In this embodiment, a transistor is used as a semiconductor device including an oxide semiconductor, and a structure of a transistor including an oxide semiconductor layer will be described with reference to FIGS. 1A and 1B.

Figure 1B:
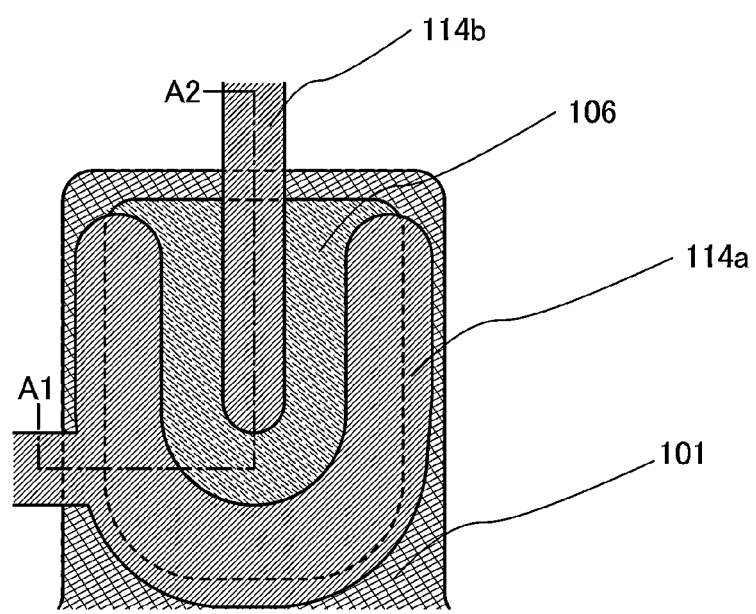

A transistor having a bottom gate structure of this embodiment is illustrated in FIGS. 1A and 1B. FIG. 1A is a cross-sectional view and FIG. 1B is a plan view thereof. FIG. 1A is a cross-sectional view taken along line A1-A2 of FIG. 1B.

The transistor illustrated in FIGS. 1A and 1B includes, over a substrate 100 having an insulating surface, a gate electrode layer 101, a gate insulating layer 102 over the gate electrode layer 101, an oxide semiconductor layer 103 over the gate insulating layer 102, a source electrode layer 105a and a drain electrode layer 105b which overlap part of the oxide semiconductor layer 103 and are over the gate insulating layer 102, and an oxide insulating layer 107 which is over the source electrode layer 105a and the drain electrode layer 105b and in contact with the oxide semiconductor layer 103. In the oxide semiconductor layer 103, a needle crystal group 106 on at least one surface side grows in a c-axis direction perpendicular to the surface and includes an a-b plane parallel to the surface. The length of a needle crystal in the needle crystal group 106 in the c-axis direction is greater than or equal to five times as long as the length in a direction of the a-axis or the b-axis. A region except for the needle crystal group 106 is an amorphous region or a region in which amorphousness and microcrystals are mixed.

The gate electrode layer 101 can be formed with a single-layer structure or a layered structure using any of metal materials such as aluminum, copper, molybdenum, titanium, chromium, tantalum, tungsten, neodymium, and scandium; an alloy material containing any of these metal materials as its main component; or a nitride containing any of these metal materials. Preferably, it is effective to form the gate electrode layer with the use of a low-resistance metal material such as aluminum or copper, the low-resistance metal material is preferably used in combination with a refractory metal material because it has disadvantages such as low heat resistance and a tendency to be corroded. As the refractory metal material, molybdenum, titanium, chromium, tantalum, tungsten, neodymium, scandium, or the like can be used.

Further, in order to increase the aperture ratio of a pixel portion, a light-transmitting oxide conductive layer of indium oxide, an alloy of indium oxide and tin oxide, an alloy of indium oxide and zinc oxide, zinc oxide, zinc aluminum oxide, zinc aluminum oxynitride, zinc gallium oxide, or the like may be used as the gate electrode layer 101.

As the gate insulating layer 102, a single-layer film or a layered film of any of silicon oxide, silicon oxynitride, silicon nitride oxide, silicon nitride, aluminum oxide, tantalum oxide, and the like formed with a CVD method, a sputtering method, or the like can be used.

The oxide semiconductor layer 103 is formed using an In—Ga—Zn—O-based film which contains In, Ga, and Zn and has a composition represented as $InMO_3(ZnO)_m$ (m>0). Note that M denotes one or more of metal elements selected from gallium (Ga), iron (Fe), nickel (Ni), manganese (Mn), and cobalt (Co). For example, M denotes Ga in some cases; meanwhile, M denotes the above metal element such as Ni or Fe in addition to Ga (Ga and Ni or Ga and Fe) in other cases. Further, the above oxide semiconductor may contain Fe or Ni, another transitional metal element, or an oxide of the transitional metal as an impurity element in addition to the metal element contained as M.

The oxide semiconductor layer 103 is formed with a sputtering method to a thickness of greater than or equal to 10 nm and less than or equal to 200 nm, preferably greater than or equal to 10 nm and less than or equal to 40 nm.

As the oxide semiconductor layer 103, the one on which dehydration or dehydrogenation is performed with an RTA method or the like at high temperature for a short time is used. Dehydration or dehydrogenation can be performed through rapid thermal anneal (RTA) treatment with a high-temperature gas (an inert gas such as nitrogen or a rare gas) or light at from higher than or equal to 400° C. and lower than or equal to 700° C. (or a temperature lower than or equal to the strain point of a glass substrate) for approximately greater than or equal to one minute and less than or equal to ten minutes, preferably at 650° C. for approximately greater than or equal to three minutes and less than or equal to six minutes. With an RTA method, dehydration or dehydrogenation can be performed in a short time; therefore, treatment can be performed even at a temperature higher than the strain point of a glass substrate.

The oxide semiconductor layer 103 is an amorphous layer having many dangling bonds at the stage where the oxide semiconductor layer 103 is formed. Through a heating step for the dehydration or dehydrogenation, dangling bonds within a short distance are bonded to each other, so that the oxide semiconductor layer 103 can have an ordered amorphous structure. As ordering proceeds, the oxide semiconductor layer 103 comes to be formed of a mixture of amorphousness and microcrystals, where microcrystals are mixed into an amorphous region, or be formed of a microcrystal group. Here, a microcrystal is a so-called nanocrystal with a particle size of greater than or equal to 1 nm and less than or equal to 20 nm, which is smaller than that of a microcrystalline particle generally called a microcrystal.

It is preferable that a superficial portion of the oxide semiconductor layer 103 have the needle crystal group 106 which is a needle microcrystalline layer and grows in the c-axis direction perpendicular to a surface of the oxide semiconductor layer 103. Here, the needle crystal group 106 is c-axis-orientated and includes an a-b plane formed using an a-axis and a b-axis which are perpendicular to the c-axis. The length (long axis) of the needle crystal of the needle crystal group 106 in the c-axis direction is greater than or equal to five times as long as the length (short axis) in the direction of the a-axis or the b-axis, and the length in the short axis direction is greater than or equal to 2 nm and less than or equal to 50 nm, preferably, greater than or equal to 3 nm and less than or equal to 10 nm.

The oxide semiconductor layer 103 having such a structure is used as a channel formation region of the transistor, and the dense needle crystal group 106 including needle microcrystals exists in the superficial portion of the oxide semiconductor layer 103, and thus, degradation of electric characteristics due to a change to an n-type, which is attributed to entry of moisture to the superficial portion or elimination of oxygen from the superficial portion, can be prevented. Further, since the superficial portion of the oxide semiconductor layer 103 is on the back channel side, preventing the oxide semiconductor layer 103 from being changed to an n-type is also effective for suppression of generation of a parasitic channel. Furthermore, contact resistance between the superficial portion of the oxide semiconductor layer 103 is increased owing to the existence of the needle crystal group 106 and the source electrode layer 105a or the drain electrode layer 105b can be reduced.

Here, a crystal structure of an In—Ga—Zn—O-based film, which is likely to grow during a heating step, depends on composition of a target used for deposition of an oxide semiconductor. For example, in the case where an In—Ga—Zn—O-based film is formed using a target for deposition of an oxide semiconductor, which contains In, Ga, and Zn so that the ratio of $In_2O_3$ to $Ga_2O_3$ to ZnO is 1:1:1 in molar ratio, and crystallization is performed through a heating step, a hexagonal system layered compound crystal structure in which one oxide layer or two oxide layers containing Ga and Zn are mixed between In oxide layers is likely to be formed. At this time, the needle crystal group 106 is likely to have a crystal structure represented by $In_2Ga_2ZnO_7$. The molar ratio of In to Ga to Zn in the structure of the amorphous region or the region where amorphousness and microcrystals are mixed is likely to be 1:1:0.5. Alternatively, in the case where a target for deposition of an oxide semiconductor, whose molar ratio of $In_2O_3$ to $Ga_2O_3$ to ZnO is 1:1:2, is used, and crystallization is performed through a heating step, an oxide layer containing Ga and Zn interposed between In oxide layers is likely to have a two-layer structure. Since the crystal structure of the oxide layer containing Ga and Zn of the latter having a two-layer structure is stable and thus crystal growth is likely to occur, in the case where a target whose molar ratio of $In_2O_3$ to $Ga_2O_3$ to ZnO is 1:1:2 is used, and crystallization is performed through a heating step, a crystal continuous from an outer layer to an interface between a gate insulating film and the oxide layer containing Ga and Zn is formed in some cases. At this time, the crystal structure of the needle crystal group 106 is likely to be represented by $InGaZnO_4$. Note that the molar ratio may be referred to as the ratio of atoms.

Figure 10A:
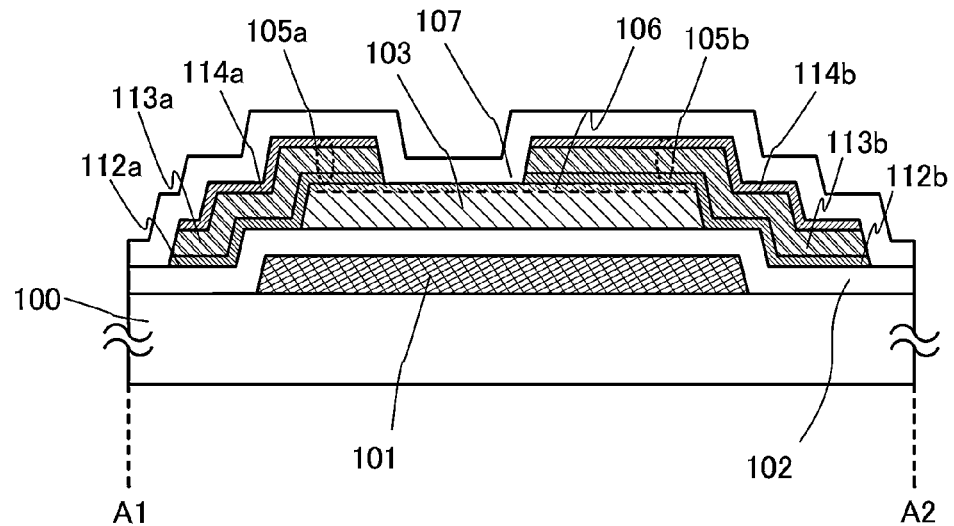
FIGS. 10A and 10B are cross-sectional views each illustrating one embodiment of the present invention.

Note that as illustrated in FIG. 10A, a needle crystal group is not formed in a side surface portion of the oxide semiconductor layer 103 depending on the order of steps and the needle crystal group 106 is formed only in an upper layer portion. Note that the area rate of the side surface portion is low and thus, the above effect can also be kept in that case.

The source electrode layer 105a has a three-layer structure of a first conductive layer 112a, a second conductive layer 113a, and a third conductive layer 114a, while the drain electrode layer 105b has a three-layer structure of a first conductive layer 112b, a second conductive layer 113b, and a third conductive layer 114b. As a material of the source electrode and drain electrode layers 105a and 105b, a material similar to that of the gate electrode layer 101 can be used. Note that in this embodiment, the source electrode layer 105a and the drain electrode layer 105b each have a three-layer structure; however, one embodiment of the present invention is not limited to this structure. The source electrode layer 105a and the drain electrode layer 105b may be formed to have a single-layer structure or a layered structure using a material similar to that used for the gate electrode layer 101, as appropriate.

Further, the light-transmitting oxide conductive layer is used for the source electrode layer 105a and the drain electrode layer 105b in a manner similar to that of the gate electrode layer 101, whereby light transmissivity of the pixel portion can be increased and the aperture ratio can also be increased.

Further, the oxide conductive layer may be formed between the oxide semiconductor layer 103 and the film including any of the above metal materials as its main component, which is to be the source and drain electrode layers 105a and 105b, so that contact resistance can be reduced.

The oxide insulating layer 107 functioning as a channel protective layer is provided over the oxide semiconductor layer 103, the source electrode layer 105a, and the drain electrode layer 105b. The oxide insulating layer 107 is formed with a sputtering method using an inorganic insulating film, typically a silicon oxide film, a silicon nitride oxide film, an aluminum oxide film, an aluminum oxynitride film, or the like.

Figure 10B:
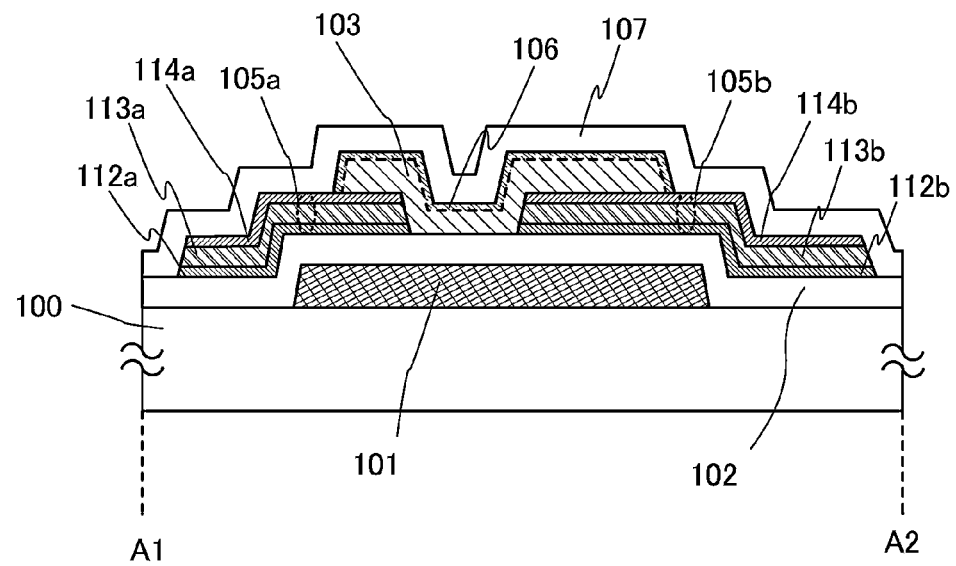

Alternatively, a bottom contact-type transistor, which is illustrated in FIG. 10B, may be formed using a similar material for each portion.

The transistor illustrated in FIG. 10B includes, over the substrate 100 having an insulating surface, the gate electrode layer 101, the gate insulating layer 102 over the gate electrode layer 101, the source electrode layer 105a and the drain electrode layer 105b over the gate insulating layer 102, the oxide semiconductor layer 103 which overlaps with part of the source electrode layer 105a and the drain electrode layer 105b and which is over the gate insulating layer 102, and the oxide insulating layer 107 which is over the oxide semiconductor layer 103, the source electrode layer 105a, and the drain electrode layer 105b and which is in contact with the oxide semiconductor layer 103. In a manner similar to that of the transistor having a bottom gate structure illustrated in FIGS. 1A and 1B, in the oxide semiconductor layer 103, the needle crystal group 106 on at least one surface side grows in a c-axis direction perpendicular to the surface and includes an a-b plane parallel to the surface. The length of a needle crystal in the needle crystal group 106 in the c-axis direction is greater than or equal to five times as long as the length in a direction of the a-axis or the b-axis. A region except for the needle crystal group 106 is an amorphous region or a region in which amorphousness and microcrystals are mixed.

The oxide semiconductor layer 103 having such a structure is used as a channel formation region of the transistor, and the dense needle crystal group 106 including needle microcrystals exists in the superficial portion of the oxide semiconductor layer 103 in a manner similar to that of the transistor having a bottom gate structure illustrated in FIGS. 1A and 1B, and thus, degradation of electric characteristics due to a change to an n-type, which is attributed to entry of moisture to the superficial portion or elimination of oxygen from the superficial portion, can be prevented. Further, since the superficial portion of the oxide semiconductor layer 103 is on the back channel side, preventing the oxide semiconductor layer 103 from being changed to an n-type is also effective for suppression of generation of a parasitic channel.

With such a structure, the transistor can have high reliability and high electric characteristics.

Note that the structure described in this embodiment can be used in combination with any of the structures described in the other embodiments, as appropriate.

Embodiment 2

In this embodiment, a manufacturing process of a display device including the bottom gate transistor described in Embodiment 1 will be described with reference to FIGS. 2A to 2C, FIGS. 3A to 3C, FIG. 4, FIG. 5, FIG. 6, FIG. 7, FIGS. 8A1, 8A2, 8B1, and 8B2, and FIG. 9. FIGS. 2A to 2C and FIGS. 3A to 3C are cross-sectional views, and FIG. 4, FIG. 5, FIG. 6, FIG. 7, and FIG. 9 are plan views, and line A1-A2 and line B1-B2 in FIG. 4, FIG. 5, FIG. 6, FIG. 7, and FIG. 9 correspond to line A1-A2 and line B1-B2 in the cross-sectional views of FIGS. 2A to 2C and FIGS. 3A to 3C, respectively.

First, the substrate 100 having an insulating surface is prepared. As the substrate 100, it is preferable to use a substrate having a strain point higher than the temperature of the heat treatment to be performed later. As the substrate 100, any of the following substrates can be used: non-alkaline glass substrates made of barium borosilicate glass, aluminoborosilicate glass, aluminosilicate glass, and the like with a fusion method or a float method. Note that by containing a larger amount of barium oxide (BaO) than boric acid, a glass substrate is heat-resistant and of more practical use. Therefore, a glass substrate containing BaO and $B_2O_3$ so that the amount of BaO is larger than that of $B_2O_3$ is preferably used.

Note that instead of the glass substrate described above, a substrate formed using an insulator, such as a ceramic substrate, a quartz glass substrate, a quartz substrate, or a sapphire substrate may be used. Alternatively, crystallized glass or the like may be used.

Further, as a base film, an insulating film may be formed over the substrate 100. The base film may be formed with a single-layer structure or a layered structure using any of a silicon oxide film, a silicon nitride film, a silicon oxynitride film, and a silicon nitride oxide film with a CVD method, a sputtering method, or the like. In the case where a substrate containing mobile ions like sodium, such as a glass substrate, is used as the substrate 100, a film containing nitrogen, such as a silicon nitride film or a silicon nitride oxide film, is used as the base film, whereby the mobile ions can be prevented from entering the oxide semiconductor layer.

Figure 4:
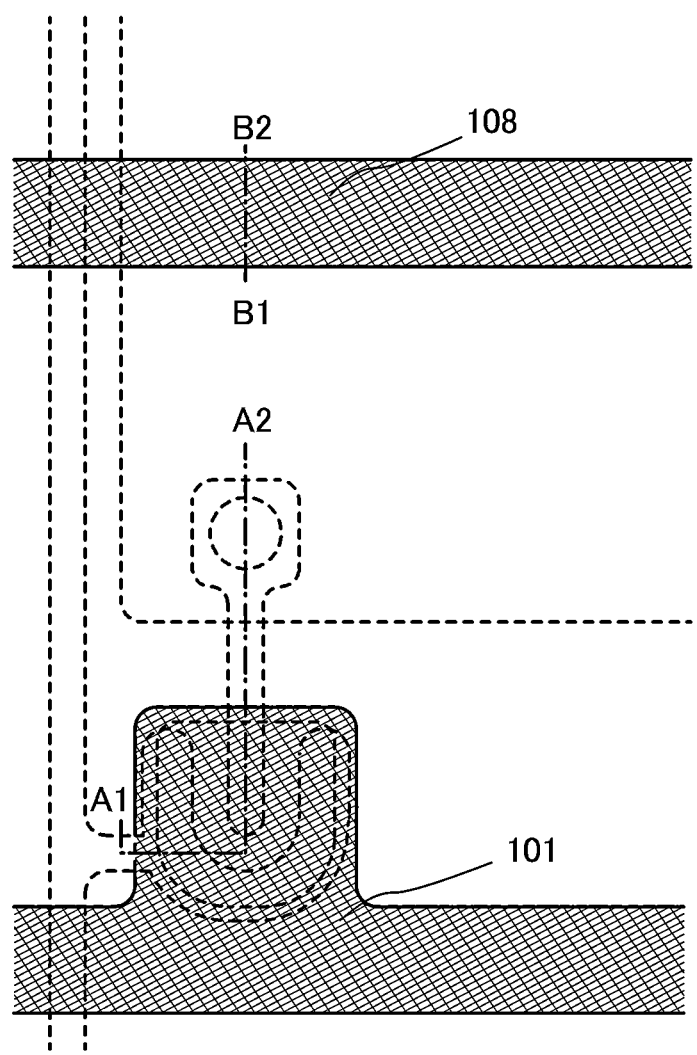
FIG. 4 is a plan view illustrating one embodiment of the present invention.

Next, a conductive film to be a gate wiring including the gate electrode layer 101, a capacitor wiring 108, and a first terminal 121 is formed over an entire surface of the substrate 100 with a sputtering method or a vacuum evaporation method. Next, through a first photolithography process, a resist mask is formed. An unnecessary portion is removed by etching to form wirings and an electrode (the gate wiring including the gate electrode layer 101, the capacitor wiring 108, and the first terminal 121). At this time, etching is preferably performed so that at least end portions of the gate electrode layer 101 is tapered, in order to prevent breakage of a film formed over the gate electrode layer 101. A cross-sectional view at this stage is illustrated in FIG. 2A. Note that FIG. 4 is a plan view at this stage.

The gate wiring including the gate electrode layer 101, the capacitor wiring 108, and the first terminal 121 in a terminal portion can be formed with a single-layer structure or a layered structure using any of metal materials such as aluminum, copper, molybdenum, titanium, chromium, tantalum, tungsten, neodymium, and scandium; an alloy material containing any of these metal materials as its main component; or a nitride containing any of these metal materials. Although it is effective to form the gate electrode layer with the use of a low-resistance metal material such as aluminum or copper, the low-resistance metal material is preferably used in combination with a refractory metal material because it has disadvantages such as low heat resistance and a tendency to be corroded. As the refractory metal material, molybdenum, titanium, chromium, tantalum, tungsten, neodymium, scandium, or the like can be used.

For example, as a two-layer structure of the gate electrode layer 101, the following structures are preferable: a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, and a two-layer structure of a titanium nitride layer and a molybdenum layer. As a three-layer structure, the following structure is preferable: a layered structure containing aluminum, an alloy of aluminum and silicon, an alloy of aluminum and titanium, or an alloy of aluminum and neodymium in a middle layer and any of tungsten, tungsten nitride, titanium nitride, and titanium in a top layer and a bottom layer.

At that time, a light-transmitting oxide conductive layer is used for part of the electrode layer and the wiring layer to increase the aperture ratio. For example, indium oxide, an alloy of indium oxide and tin oxide, an alloy of indium oxide and zinc oxide, zinc oxide, zinc aluminum oxide, zinc aluminum oxynitride, zinc gallium oxide, or the like can be used.

Next, the gate insulating layer 102 is formed on the entire surface of the gate electrode layer 101.

The gate insulating layer 102 can be formed with a single-layer film or a layered film using a silicon oxide, a silicon nitride, a silicon oxynitride, or a silicon nitride oxide with a plasma CVD method, a sputtering method, or the like. For example, a silicon oxynitride layer may be formed using $SiH_4$, oxygen, and nitrogen as deposition gases with a plasma CVD method. The thickness of the gate insulating layer 102 is set to greater than or equal to 50 nm and less than or equal to 500 nm. In the case where the gate insulating layer 102 has a layered structure, the layered structure including a first gate insulating layer having a thickness of greater than or equal to 50 nm and less than or equal to 200 nm and a second gate insulating layer having a thickness of greater than or equal to 5 nm and less than or equal to 300 nm over the first gate insulating layer are employed.

In this embodiment, the gate insulating layer 102 having a thickness of 100 nm which is a silicon oxide film is formed with a plasma CVD method.

Alternatively, the gate insulating layer 102 may be formed with a single-layer film or a layered film using one kind of oxide, nitride, oxynitride, and nitride oxide of aluminum, yttrium, or hafnium; or a compound including at least two or more kinds of the above.

Note that in this specification, oxynitride refers to a substance that contains more oxygen atoms than nitrogen atoms and nitride oxide refers to a substance that contains more nitrogen atoms than oxygen atoms.

Note that before an oxide semiconductor film for forming the oxide semiconductor layer 103 is formed, dust on a surface of the gate insulating layer 102 is preferably removed by performing reverse sputtering in which an argon gas is introduced and plasma is generated. The reverse sputtering refers to a method in which, without application of voltage to a target side, an RF power source is used for application of voltage to a substrate side in an argon atmosphere so that plasma is generated around the substrate to modify a surface. Note that instead of an argon atmosphere, a nitrogen atmosphere, a helium atmosphere, or the like may be used. After the reverse sputtering, the oxide semiconductor film is formed without exposure to air, whereby an interface between the gate insulating layer 102 and the oxide semiconductor layer 103, which is not contaminated by atmospheric components or impurity elements floating in air, such as water or hydrocarbon can be formed. Therefore, variation in characteristics of the transistor can be reduced.

Next, an oxide semiconductor film is formed over the gate insulating layer 102 to a thickness of greater than or equal to 10 nm and less than or equal to 200 nm, preferably greater than or equal to 10 nm and less than or equal to 40 nm.

As the oxide semiconductor film, any of the following oxide semiconductor films can be applied as well as the above: an In—Ga—Zn—O-based oxide semiconductor film; an In—Sn—Zn—O-based oxide semiconductor film; an In—Al—Zn—O-based oxide semiconductor film; a Sn—Ga—Zn—O-based oxide semiconductor film; an Al—Ga—Zn—O-based oxide semiconductor film; an Sn—Al—Zn—O-based oxide semiconductor film; an In—Zn—O-based oxide semiconductor film; a Sn—Zn—O-based oxide semiconductor film; an Al—Zn—O-based oxide semiconductor film; an In—O-based oxide semiconductor film; a Sn—O-based oxide semiconductor film; and a Zn—O-based oxide semiconductor film. The oxide semiconductor film can be formed with a sputtering method in a rare gas (typically argon) atmosphere, an oxygen atmosphere, or an atmosphere of a rare gas (typically argon) and oxygen. In the case of using a sputtering method, film deposition may be performed using a target containing $SiO_2$ at greater than or equal to 2 and less than or equal to 10 percent by weight and SiOx (x>0) which inhibits crystallization may be contained in the oxide semiconductor film.

Here, the oxide semiconductor film is formed using a target for deposition of an oxide semiconductor, which contains In, Ga, and Zn (the ratio of $In_2O_3$ to $Ga_2O_3$ to ZnO is 1:1:0.5, 1:1:1, or 1:1:2 in molar ratio) under conditions where the distance between the substrate and the target is 100 mm, the pressure is 0.6 Pa, and the direct current (DC) power is 0.5 kW, and the atmosphere is an oxygen atmosphere (the proportion of the oxygen flow is 100%). Note that when a pulse direct current (DC) power source is used, powder substances (also referred to as particles or dust) generated in film deposition can be reduced and the film thickness is likely to be uniform. In this embodiment, as the oxide semiconductor film, a 30-nm-thick In—Ga—Zn—O-based film is formed with a sputtering method with the use of a target for deposition of an In—Ga—Zn—O-based oxide semiconductor.

It is preferable that the relative density of the oxide semiconductor in the target for deposition of an oxide semiconductor is greater than or equal to 80%, more preferably greater than or equal to 95%, further preferably, greater than or equal to 99.9%. The impurity concentration in the oxide semiconductor film thus formed can be reduced, and the transistor having high electric characteristics or high reliability can be obtained.

Examples of a sputtering method include an RF sputtering method in which a high-frequency power source is used as a sputtering power source, a DC sputtering method in which DC power source is used, and a pulsed DC sputtering method in which a bias is applied in a pulsed manner. An RF sputtering method is mainly used in the case where a conductive film such as an insulating film is formed, and a DC sputtering method is mainly used in the case where a conductive film such as a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber, which is for a magnetron sputtering method, and a sputtering apparatus which is used for an ECR sputtering method in which plasma produced with the use of microwaves is used without using glow discharge.

Furthermore, as a deposition method using a sputtering method, there are also a reactive sputtering method in which a target substance and a sputtering gas component are chemically reacted with each other during deposition to form a thin compound film thereof, and a bias sputtering method in which voltage is also applied to a substrate during deposition.

Preheat treatment is preferably performed so as to remove moisture or hydrogen remaining on an inner wall of the sputtering apparatus, on a surface of the target, or in a target material, before the oxide semiconductor film is formed. As the preheat treatment, a method in which the inside of the film deposition chamber is heated to from 200° C. to 600° C. under reduced pressure, a method in which introduction and exhaust of nitrogen or an inert gas are repeated while the inside of the film deposition chamber is heated, and the like can be given. After the preheat treatment, the substrate or the sputtering apparatus is cooled, and then the oxide semiconductor film is formed without exposure to air. In this case, not water but oil or the like is preferably used as a coolant for the target. Although a certain level of effect can be obtained when introduction and exhaust of nitrogen are repeated without heating, it is more preferable to perform the treatment with the inside of the film deposition chamber heated.

It is preferable to remove moisture or the like remaining in the sputtering apparatus with the use of a cryopump before, during, or after the oxide semiconductor film is formed.

Next, through a second photolithography process, a resist mask is formed. Then, the In—Ga—Zn—O-based film is etched. In the etching, organic acid such as citric acid or oxalic acid can be used for an etchant. Here, the In—Ga—Zn—O-based film is etched by wet etching with the use of ITO-07N (manufactured by Kanto Chemical Co., Inc.) to remove an unnecessary portion. Thus, the In—Ga—Zn—O-based film is processed to have an island shape, whereby the oxide semiconductor layer 103 is formed. The end portions of the oxide semiconductor layer 103 are etched to have tapered shapes, whereby breakage of a wiring due to a step shape can be prevented. Note that etching here is not limited to wet etching and dry etching may be performed.

Figure 5:
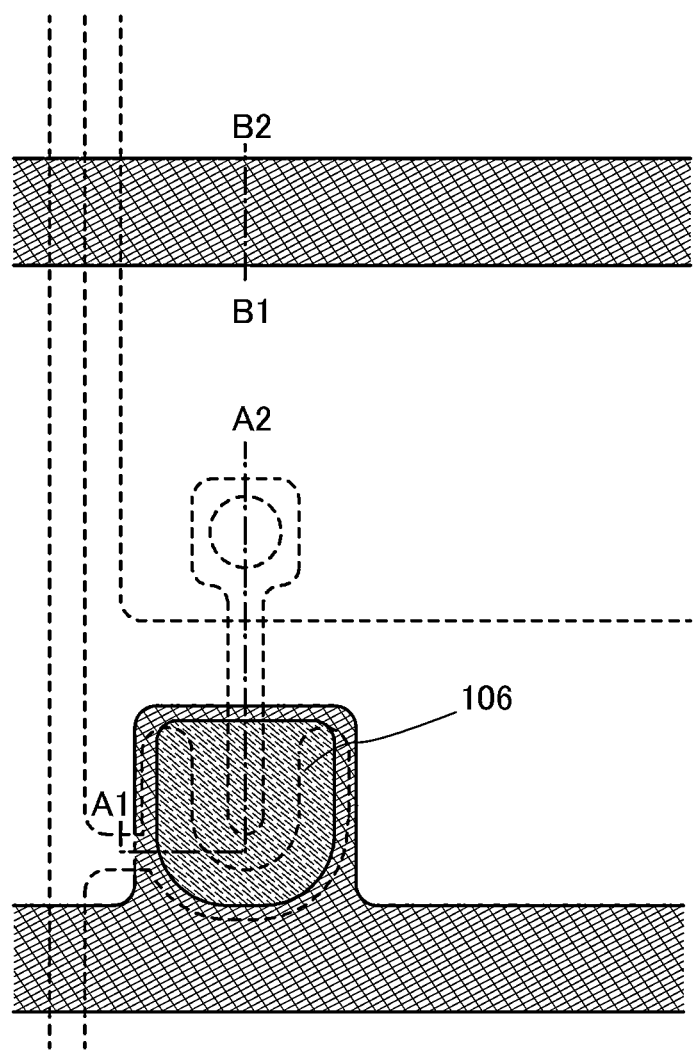
FIG. 5 is a plan view illustrating one embodiment of the present invention.

Then, the oxide semiconductor layer is subjected to dehydration or dehydrogenation. First heat treatment for the dehydration or dehydrogenation can be performed through rapid thermal annealing (RTA) treatment with the use of a high-temperature gas (an inert gas such as nitrogen or a rare gas) or light at a temperature from higher than or equal to 400° C. and lower than or equal to 700° C. (or a temperature lower than or equal to the strain point of the glass substrate 100) for approximately greater than or equal to one minute and less than or equal to ten minutes, preferably at 650° C. for approximately greater than or equal to three minutes and less than or equal to six minutes. With an RTA method, dehydration or dehydrogenation can be performed in a short time; therefore, treatment can be performed even at a temperature higher than the strain point of a glass substrate. A cross-sectional view at this stage and a plan view at this stage are illustrated in FIG. 2B and FIG. 5, respectively. Note that the timing of the first heat treatment is not limited to this timing and may be performed plural times, for example, before and after a photolithography process or a deposition step.

Here, the superficial portion of the oxide semiconductor layer 103 is crystallized through the first heat treatment and thus comes to have the needle crystal group 106 including a microcrystalline layer with needle crystals. The rest region of the oxide semiconductor layer 103 is an amorphous region, a region where amorphousness and microcrystals are mixed, or a microcrystal group. Note that the needle crystal group 106 is part of the oxide semiconductor layer 103 and hereinafter, the "oxide semiconductor layer 103" includes the needle crystal group 106.

Note that in this specification, heat treatment in the atmosphere of an inert gas such as nitrogen or a rare gas is referred to as heat treatment for dehydration or dehydrogenation. In this specification, "dehydrogenation" does not indicate elimination of only $H_2$ with heat treatment. For convenience, elimination of H, OH, and the like is referred to as "dehydration or dehydrogenation".

In addition, when the temperature is lowered from a heating temperature T at which the dehydration or dehydrogenation is performed on the oxide semiconductor layer, it is important to prevent entry of water or hydrogen by using the same furnace that has been used for the dehydration or dehydrogenation, in such a manner that the oxide semiconductor layer is not exposed to air. When a transistor is formed using an oxide semiconductor layer obtained by changing an oxide semiconductor layer into a low-resistance oxide semiconductor layer by performing dehydration or dehydrogenation and by changing the low-resistance oxide semiconductor layer into a high-resistance oxide semiconductor layer so that the oxide semiconductor layer becomes an i-type oxide semiconductor layer, the threshold voltage of the transistor is positive, so that a switching element having a so-called normally-off property can be realized. It is preferable for a display device that a channel be formed with positive threshold voltage that is as close to 0 V as possible in a transistor. If the threshold voltage of the transistor is negative, it tends to be normally on; in other words, current flows between the source electrode and the drain electrode even when the gate voltage is 0 V. In an active matrix display device, electric characteristics of a transistor included in a circuit are important and the performance of the display device depends on the electric characteristics. In particular, of the electric characteristics of the transistor, the threshold voltage ($V_{th}$) is important. When the threshold voltage value is high or is on the minus side even when the field effect mobility is high, it is difficult to control the circuit. In the case of a transistor where the threshold voltage is positive but an absolute value of the threshold voltage is large, the transistor cannot perform a switching function as the transistor and might be a load when the transistor is driven at low voltage. In the case of an n-channel transistor, it is preferable that a channel be formed and drain current flows after positive voltage is applied as gate voltage. A transistor in which a channel is not formed unless driving voltage is raised and a transistor in which a channel is formed and drain current flows even when negative voltage is applied are unsuitable for a transistor used in a circuit.

In addition, the gas atmosphere in which the temperature is lowered from the heating temperature T may be switched to a gas atmosphere which is different from the gas atmosphere in which the temperature is raised to the heating temperature T. For example, cooling is performed in the furnace where heat treatment for dehydration or dehydrogenation is performed while the furnace is filled with a high-purity oxygen gas, a high-purity $N_2O$ gas, or ultra-dry air (having a dew point of −40° C. or lower, preferably −60° C. or lower) without exposure to the air.

Note that in the first heat treatment, it is preferable that water, hydrogen, and the like be not contained in the atmosphere. Alternatively, the purity of an inert gas which is introduced into a heat treatment apparatus is preferably 6N (99.9999%) or more, more preferably 7N (99.99999%) or more (that is, the impurity concentration is 1 ppm or less, preferably 0.1 ppm or less).

In the case where the heat treatment is performed in an inert gas atmosphere, the oxide semiconductor layer is changed into an oxygen-vacant oxide semiconductor layer so that the oxide semiconductor layer becomes a low-resistance oxide semiconductor layer (i.e., an n-type (e.g., $n^-$-type or $n^+$-type) oxide semiconductor layer) through the heat treatment. After that, the oxide semiconductor layer is made to be in an oxygen excess state by the formation of an oxide insulating layer which is in contact with the oxide semiconductor layer. Thus, the oxide semiconductor layer is made to be i-type; that is, the oxide semiconductor layer is changed into a high-resistance oxide semiconductor layer. Accordingly, it is possible to form a highly reliable transistor having favorable electric characteristics.

The first heat treatment for the oxide semiconductor layer may be performed before the oxide semiconductor film is processed into the island-shaped oxide semiconductor layer 103. In that case, the substrate is taken out of the heat treatment apparatus and a second photolithography process is performed after the first heat treatment. A needle crystal group is not formed in a side surface portion of the island-shaped oxide semiconductor layer 103 and the needle crystal group 106 is formed only in an upper layer portion of the oxide semiconductor layer 103 (see FIG. 10A).

Next, through a third photolithography process, a resist mask is formed. An unnecessary portion is removed by etching to form a contact hole reaching the wiring or the electrode layer which is formed from the same material as the gate electrode layer 101. This contact hole is provided for direct connection with a conductive film to be formed later. For example, a contact hole is formed when a transistor whose gate electrode layer is in direct contact with the source or drain electrode layer in the driver circuit portion is formed, or when a terminal that is electrically connected to a gate wiring of a terminal portion is formed.

Next, over the oxide semiconductor layer 103 and the gate insulating layer 102, a first conductive layer 112, a second conductive layer 113, and a third conductive layer 114 which include a metal material are formed with a sputtering method or a vacuum evaporation method. FIG. 2C is a cross-sectional view at this stage.

The first conductive layer 112, the second conductive layer 113, and the third conductive layer 114 can each be formed using a material similar to that of the gate electrode layer 101.

Here, the first conductive layer 112 and the third conductive layer 114 are formed using titanium that is a heat-resistant conductive material, and the second conductive layer 113 is formed using an aluminum alloy containing neodymium. Such a structure can utilize a low resistance property of aluminum and reduce generation of hillock. Although a three-layer structure of the first conductive layer 112, the second conductive layer 113, and the third conductive layer 114 is used in this embodiment, one embodiment of the present invention is not limited to this. A single-layer structure, a two-layer structure, or a layered structure of four or more layers may be employed. For example, a single-layer structure of a titanium film or a layered structure of a titanium film and an aluminum film containing silicon may be employed.

Alternatively, in a manner similar to that of the gate electrode layer 101, the light-transmitting oxide conductive layer is used for the source electrode layer 105a and the drain electrode layer 105b, so that a light-transmitting property of a pixel portion can be improved and an aperture ratio can be increased.

Figure 6:
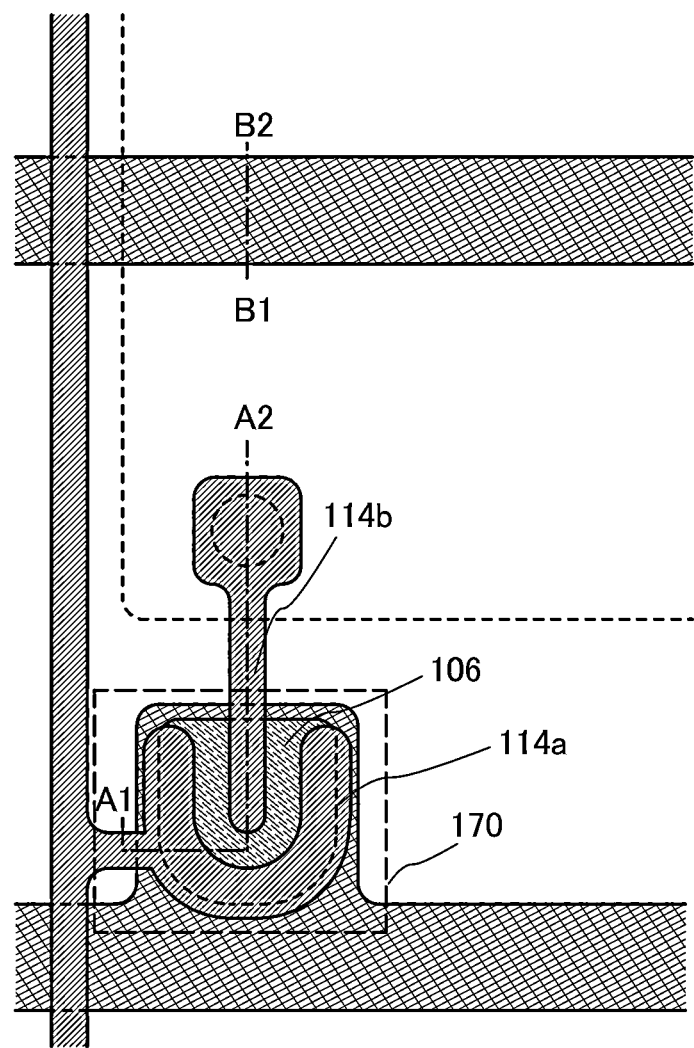
FIG. 6 is a plan view illustrating one embodiment of the present invention.

Next, through a fourth photolithography process, a resist mask 131 is formed. Unnecessary portions are removed by etching, whereby the source and drain electrode layers 105a and 105b and a connection electrode 120 are formed. Wet etching or dry etching is employed as an etching method at this time. For example, when the first conductive layer 112 and the third conductive layer 114 are formed using titanium and the second conductive layer 113 is formed using an aluminum alloy containing neodymium, wet etching can be performed using a hydrogen peroxide solution or heated hydrochloric acid as an etchant. A cross-sectional view at this stage and a plan view at this stage are illustrated in FIG. 3A and FIG. 6, respectively.

At this time, the first conductive layer 112, the second conductive layer 113, the third conductive layer 114, and the oxide semiconductor layer 103 (the needle crystal group 106) are preferably etched in a condition such that the etching selectivity ratio of the first conductive layer 112, the second conductive layer, 113, and the third conductive layer 114 to the oxide semiconductor layer 103 is high. Therefore, the needle crystal group 106 in the superficial portion of the oxide semiconductor layer 103 can be prevented from being removed by etching.

When the needle crystal group 106 is formed in the superficial portion of the oxide semiconductor layer 103, the etching selectivity ratio of the first conductive layer 112, the second conductive layer 113, and the third conductive layer 114 to the oxide semiconductor layer 103 which is an amorphous layer can be high. Therefore, even when the oxide semiconductor layer 103 has a small thickness, it is possible to prevent part of the oxide semiconductor layer 103 from being removed by etching treatment.

In addition, wet etching allows the layers to be etched isotropically; thus, the source and drain electrode layers 105a and 105b are reduced in size so that the end portions of them are on the inner side of the resist mask 131. Through the above steps, a transistor 170 in which the oxide semiconductor layer 103 and the needle crystal group 106 are used as a channel formation region can be manufactured.

Further, the oxide conductive layer may be formed between the oxide semiconductor layer 103 and each of the films containing the metal material as its main component to be the source and drain electrode layers 105a and 105b so that contact resistance can be reduced.

In the fourth photolithography process, a second terminal 122 formed using the same material as the source electrode layer 105a and the drain electrode layer 105b is also left in the terminal portion. Note that the second terminal 122 is electrically connected to a source wiring (the source wiring including the source and drain electrode layers 105a and 105b).

In addition, in the terminal portion, the connection electrode 120 is directly connected to the first terminal 121 of the terminal portion through a contact hole formed in the gate insulating layer 102. Although not illustrated, a source or drain wiring and a gate electrode of a transistor of a driver circuit are directly connected to each other through the same steps as the above steps.

Further, by use of a resist mask having regions with plural thicknesses (typically, two different thicknesses) which is formed using a multi-tone mask, the number of resist masks can be reduced, resulting in a simplified process and lower costs.

Next, the resist mask 131 is removed, and the oxide insulating layer 107 is formed to cover the gate insulating layer 102, the oxide semiconductor layer 103, the source and drain electrode layers 105a and 105b and to be in contact with part of the oxide semiconductor layer 103. The oxide insulating layer 107 can be formed using an oxide insulating layer such as a silicon oxide film, a silicon oxynitride film, an aluminum oxide film, an aluminum oxynitride film, or a tantalum oxide film which is formed with a sputtering method or the like.

The oxide insulating layer 107 can be formed as appropriate with a sputtering method or the like, that is a method with which impurities such as moisture or hydrogen are not mixed into the oxide insulating layer 107. In this embodiment, a silicon oxide film is formed for the oxide insulating layer 107 with a sputtering method. The substrate temperature in film formation may be higher than or equal to a room temperature and lower than or equal to 300° C., and in this embodiment, is 100° C. In order to prevent entry of an impurity such as water or hydrogen in the film formation, it is preferable to perform pre-baking under reduced pressure at a temperature higher than or equal to 150° C. and lower than or equal to 350° C. for greater than or equal to two and less than or equal to ten minutes before the film formation, to form an oxide insulating layer without exposure to the air. The silicon oxide film can be formed with a sputtering method in a rare gas (typically argon) atmosphere, an oxygen atmosphere, or a mixed atmosphere containing a rare gas (typically argon) and oxygen. Further, a silicon oxide target or a silicon target can be used as a target. For example, with the use of a silicon target, a silicon oxide film can be formed with a sputtering method in a mixed atmosphere of oxygen and a rare gas. The oxide insulating layer which is formed in contact with the oxide semiconductor layer in a region whose resistance is reduced is formed using an inorganic insulating film that does not contain impurities such as moisture, a hydrogen ion, and $OH^-$ and blocks entry of such impurities from the outside.

In this embodiment, film formation is performed with a pulsed DC sputtering method with the use of a silicon target doped with a columnar polycrystalline, boron-doped silicon target (with a resistivity of 0.01 Ω·cm) and has a purity of 6N under conditions where the distance between the substrate and the target (T-S distance) is 89 mm, the pressure is 0.4 Pa, and the direct current (DC) power is 6 kW, and the atmosphere is an oxygen atmosphere (the proportion of the oxygen flow is 100%). The thickness of the film is 300 nm.

Next, second heat treatment is performed in an inert-gas atmosphere (preferably at a temperature higher than or equal to 200° C. and lower than or equal to 400° C., e.g., higher than or equal to 250° C. and lower than or equal to 350° C.). For example, the second heat treatment is performed in a nitrogen atmosphere at 250° C. for one hour. Alternatively, RTA treatment may be performed at high temperature for a short time as in the first heat treatment. In the second heat treatment, the oxide insulating layer 107 is heated in contact with part of the oxide semiconductor layer 103. Through the second heat treatment, the oxide semiconductor layer 103 is in an oxygen excess state. Thus, the oxide semiconductor layer 103 can have higher resistance (be i-type).

In this embodiment, the second heat treatment is performed after formation of the oxide insulating layer 107; however, the timing of the heat treatment is not limited to the timing immediately after formation of the oxide insulating layer 107 as long as it is after formation of the oxide insulating layer 107.

In the case where the source electrode layer 105a and the drain electrode layer 105b are formed using a heat resistant material, a step using conditions of the first heat treatment can be performed at the timing of the second heat treatment. In that case, heat treatment may be performed once after formation of the silicon oxide film.

Then, through a fifth photolithography process, a resist mask is formed. The oxide insulating layer 107 is etched so that a contact hole 125 that reaches the drain electrode layer 105b is formed. In addition, a contact hole 126 that reaches the connection electrode 120 and a contact hole 127 that reaches the second terminal 122 are also formed by this etching. A cross-sectional view at this stage is illustrated in FIG. 3B.

Next, a light-transmitting conductive film is formed after the resist mask is removed. The light-transmitting conductive film is formed using indium oxide ($In_2O_3$), an alloy of indium oxide and tin oxide ($In_2O_3$—$SnO_2$, hereinafter abbreviated as ITO), or the like with a sputtering method, a vacuum evaporation method, or the like. Such a material is etched with a hydrochloric acid-based solution. Note that since a residue is likely to be generated in etching ITO in particular, an alloy of indium oxide and zinc oxide ($In_2O_3$—ZnO, hereinafter abbreviated as IZO) may be used to improve etching processability.

Next, through a sixth photolithography process, a resist mask is formed. An unnecessary portion of the light-transmitting conductive film is removed by etching, so that a pixel electrode layer 110 is formed.

In the sixth photolithography step, a storage capacitor is formed with the gate insulating layer 102 and the oxide insulating layer 107 in the capacitor portion which are used as a dielectric, the capacitor wiring 108, and the pixel electrode layer 110.

Further, in the sixth photolithography process, the first terminal 121 and the second terminal 122 are covered with the resist mask, and light-transmitting conductive films 128 and 129 are left in the terminal portions. The light-transmitting conductive films 128 and 129 each serve as an electrode or a wiring connected to an FPC. The light-transmitting conductive film 128 which is formed over the connection electrode 120 which is directly connected to the first terminal 121 is a connection terminal electrode which functions as an input terminal of the gate wiring. The light-transmitting conductive film 129 formed over the second terminal 122 serves as a connection terminal electrode which functions as an input terminal of the source wiring.

Figure 7:
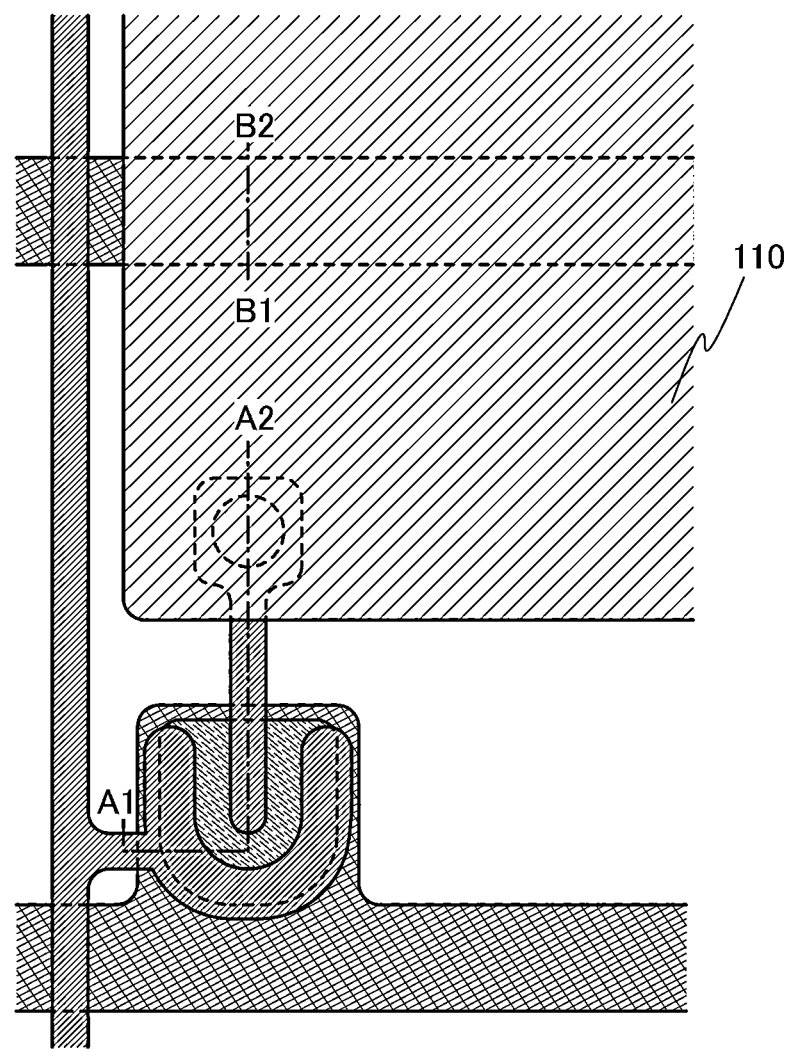
FIG. 7 is a plan view illustrating one embodiment of the present invention.

Then, the resist mask is removed. A cross-sectional view at this stage and a plan view at this stage are illustrated in FIG. 3C and FIG. 7, respectively.

FIGS. 8A1 and 8A2 are a cross-sectional view of a gate wiring terminal portion at this stage and a plan view thereof, respectively. FIG. 8A1 is a cross-sectional view taken along line C1-C2 of FIG. 8A2. In FIG. 8A1, a light-transmitting conductive film 155 formed over a protective insulating film 154 and a connection electrode 153 is a connection terminal electrode which functions as an input terminal. Further, in FIG. 8A1, in the terminal portion, a first terminal 151 formed from the same material as the gate wiring and the connection electrode 153 formed from the same material as the source wiring are overlapped with each other with a gate insulating layer 152 interposed therebetween and are in direct electrical connection. Furthermore, the connection electrode 153 and the light-transmitting conductive film 155 are directly connected to each other through a contact hole formed in the protective insulating film 154.

FIGS. 8B1 and 8B2 are a cross-sectional view of a source wiring terminal portion and a plan view thereof, respectively. FIG. 8B1 is a cross-sectional view taken along line D1-D2 of FIG. 8B2. In FIG. 8B1, the light-transmitting conductive film 155 formed over the protective insulating film 154 and the connection electrode 153 is a connection terminal electrode which functions as an input terminal. Further, in FIG. 8B1, in the terminal portion, an electrode 156 formed from the same material as the gate wiring is located below and overlaps with a second terminal 150 electrically connected to the source wiring, with the gate insulating layer 152 interposed therebetween. The electrode 156 is not electrically connected to the second terminal 150, and a capacitor to prevent noise or static electricity can be formed when the potential of the electrode 156 is set to a potential different from that of the second terminal 150, such as GND or 0 V, or the electrode 156 is set to be in a floating state. The second terminal 150 is electrically connected to the light-transmitting conductive film 155 with the protective insulating film 154 interposed therebetween.

A plurality of gate wirings, source wirings, and capacitor wirings are provided depending on the pixel density. Also in the terminal portion, a plurality of first terminals at the same potential as the gate wiring, a plurality of second terminals at the same potential as the source wiring, a plurality of third terminals at the same potential as the capacitor wiring, and the like are arranged. The number of each of the terminals may be any number, and the number of the terminals may be determined by a practitioner as appropriate.

Through these six photolithography processes, the bottom gate transistor 170 and the storage capacitor portion can be thus completed. When these transistors and storage capacitors are arranged in matrix corresponding to respective pixels, a pixel portion can be formed and one of the substrates for manufacturing an active-matrix display device can be obtained. In this specification, such a substrate is referred to as an active matrix substrate for convenience.

In the case of manufacturing an active matrix liquid crystal display device, an active matrix substrate and a counter substrate provided with a counter electrode are bonded to each other with a liquid crystal layer interposed therebetween. Note that a common electrode electrically connected to the counter electrode on the counter substrate is provided over the active matrix substrate, and a fourth terminal electrically connected to the common electrode is provided in the terminal portion. The fourth terminal is provided so that the common electrode is set to a fixed potential such as GND or 0 V.

Figure 9:
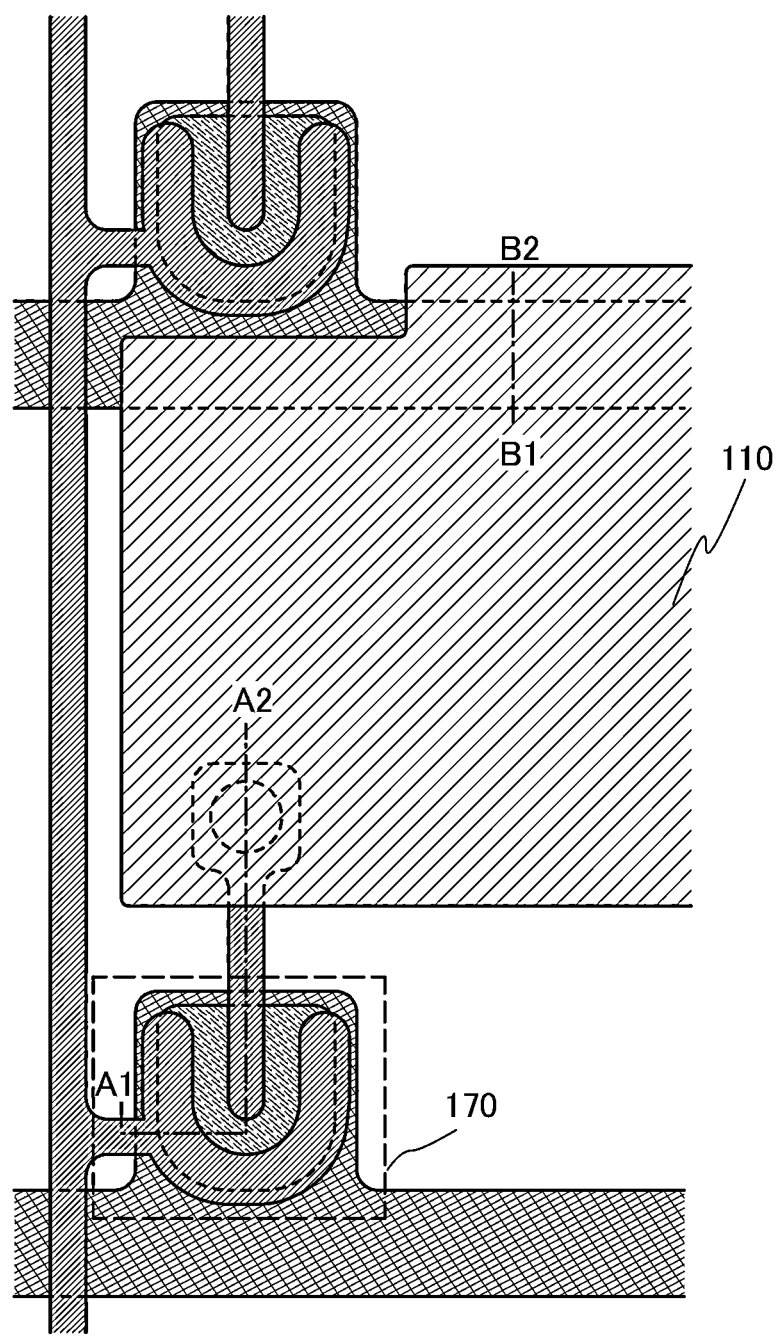
FIG. 9 is a plan view illustrating one embodiment of the present invention.

A pixel structure of this embodiment is not limited to the pixel structure in FIG. 7. FIG. 9 is a plan view illustrating an example which is different from that in FIG. 7. FIG. 9 illustrates an example in which a capacitor wiring is not provided and a storage capacitor is formed with a pixel electrode and a gate wiring of an adjacent pixel which overlap with each other with a protective insulating film and a gate insulating layer interposed therebetween. In this case, the capacitor wiring and the third terminal connected to the capacitor wiring can be omitted. Note that in FIG. 9, portions which are the same as those in FIG. 7 are denoted by common reference numerals.

In an active matrix liquid crystal display device, a display pattern is formed on a screen by driving pixel electrodes arranged in matrix. Specifically, voltage is applied between a selected pixel electrode and a counter electrode corresponding to the pixel electrode, so that a liquid crystal layer provided between the pixel electrode and the counter electrode is optically modulated and this optical modulation is recognized as a display pattern by an observer.

In displaying moving images of a liquid crystal display device, there is a problem in that a long response time of liquid crystal molecules themselves causes afterimages or blurring of moving images. In order to improve the moving-image characteristics of a liquid crystal display device, a driving method called black insertion is employed in which black is displayed on the whole screen every other frame period.

Further, there is another driving technique which is so-called double-frame rate driving. In the double-frame rate driving, a vertical synchronizing frequency is set 1.5 times or more, preferably, 2 times or more as high as a usual vertical synchronizing frequency, whereby the response speed is increased, and the tones to be written is selected for every plural fields in each frame which have been obtained by dividing.

Further alternatively, in order to improve the moving-image characteristics of a liquid crystal display device, a driving method may be employed, in which a plurality of LEDs (light-emitting diodes) or a plurality of EL light sources are used to form a plane light source as a backlight, and each light source of the plane light source is independently driven in a pulsed manner in one frame period. For example, in the case of using LEDs, three or more kinds of LEDs may be used or an LED that emits white light may be used. Since a plurality of LEDs can be controlled independently, the light emission timing of the LEDs can be synchronized with the timing at which a liquid crystal layer is optically modulated. According to this driving method, LEDs can be partly turned off; therefore, an effect of reducing power consumption can be obtained particularly in the case of displaying an image having a large black display region occupied in one screen.

By combining these driving methods, the display characteristics of a liquid crystal display device, such as moving-image characteristics, can be improved as compared to those of conventional liquid crystal display devices.

The transistor obtained in this embodiment includes an In—Ga—Zn—O-based non-single-crystal film in a channel formation region and has good dynamic characteristics. Thus, these driving methods can be applied in combination to the transistor of this embodiment.

In the case of manufacturing a light-emitting display device, an electrode on the low power supply potential side (also called a cathode) of an organic light-emitting element is set at GND, 0 V, or the like; thus, a fourth terminal for setting the cathode at GND, 0 V, or the like is provided in a terminal portion. Also in manufacturing a light-emitting display device, a power supply line is provided in addition to a source wiring and a gate wiring. Accordingly, the terminal portion is provided with a fifth terminal electrically connected to the power supply line.

Note that in this embodiment, the manufacturing method is described taking a transistor having a structure in which the source and drain electrode layers are over and overlap with the oxide semiconductor layer as an example; however, a transistor in which the oxide semiconductor layer is over and overlaps with the source and drain electrode layers may be manufactured by changing the order of steps.

Through the above steps, a highly reliable transistor having favorable electric characteristics and a display device including the transistor can be provided.

Note that the structure described in this embodiment can be used in combination with any of the structures described in the other embodiments, as appropriate.

Embodiment 3

In this embodiment, an example in which at least part of a driver circuit and a transistor to be disposed in a pixel portion are formed over one substrate is described below.

The transistor of the pixel portion is formed in accordance with Embodiments 1 and 2. Further, the transistor described in Embodiments 1 and 2 is an n-channel transistor, and thus part of a driver circuit that can be formed of n-channel transistors among driver circuits is formed over the same substrate as the transistor of the pixel portion.

Figure 14A:
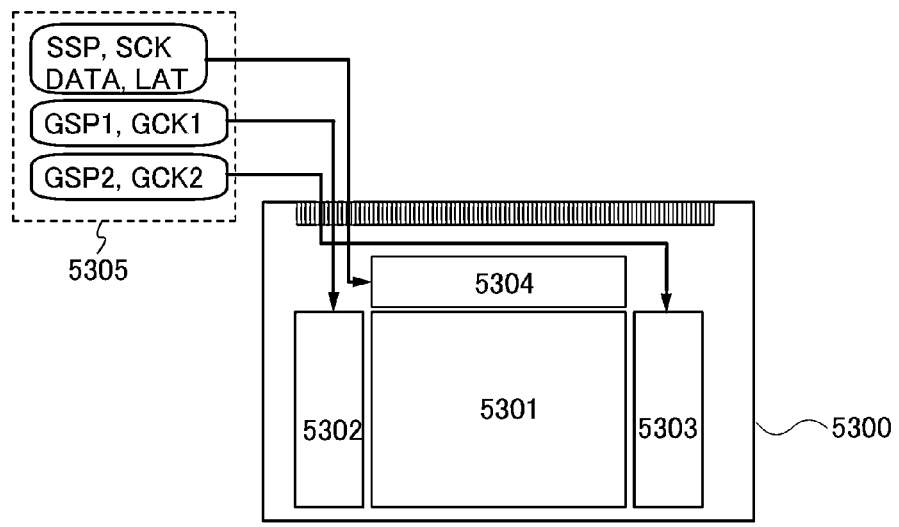
FIGS. 14A and 14B are block diagrams illustrating semiconductor devices.

FIG. 14A illustrates an example of a block diagram of an active matrix display device. A pixel portion 5301, a first scan line driver circuit 5302, a second scan line driver circuit 5303, and a signal line driver circuit 5304 are provided over a substrate 5300 in the display device. In the pixel portion 5301, a plurality of signal lines extended from the signal line driver circuit 5304 is placed and a plurality of scan lines extended from the first scan line driver circuit 5302 and the second scan line driver circuit 5303 is placed. Note that pixels each including a display element are arranged in matrix in respective regions where the scan lines and the signal lines intersect with each other. The substrate 5300 of the display device is connected to a timing control circuit 5305 (also referred to as a controller or a control IC) through a connection portion such as a flexible printed circuit (FPC).

In FIG. 14A, the first scan line driver circuit 5302, the second scan line driver circuit 5303, and the signal line driver circuit 5304 are formed over the substrate 5300 where the pixel portion 5301 is formed. Consequently, the number of components of a driver circuit and the like that are externally provided is reduced, so that costs can be reduced. Moreover, the number of connection portions (e.g., FPC) between the substrate 5300 and external driver circuits can be reduced, and the reliability or yield can be increased.

Note that the timing control circuit 5305 supplies a first scan line driver circuit start signal (GSP1) (a start signal is also referred to as a start pulse) and a scan line driver circuit clock signal (GCK1) to the first scan line driver circuit 5302, for example. Furthermore, the timing control circuit 5305 supplies a second scan line driver circuit start signal (GSP2) and a scan line driver circuit clock signal (GCK2) to the second scan line driver circuit 5303, for example. The timing control circuit 5305 supplies a signal line driver circuit start signal (SSP), a signal line driver circuit clock signal (SCK), video signal data (DATA, also simply referred to as a video signal), and a latch signal (LAT) to the signal line driver circuit 5304. Each clock signal may be a plurality of clock signals with shifted phases or may be supplied together with a signal (CKB) obtained by inverting the clock signal. Note that it is possible to omit one of the first scan line driver circuit 5302 and the second scan line driver circuit 5303.

Figure 14B:
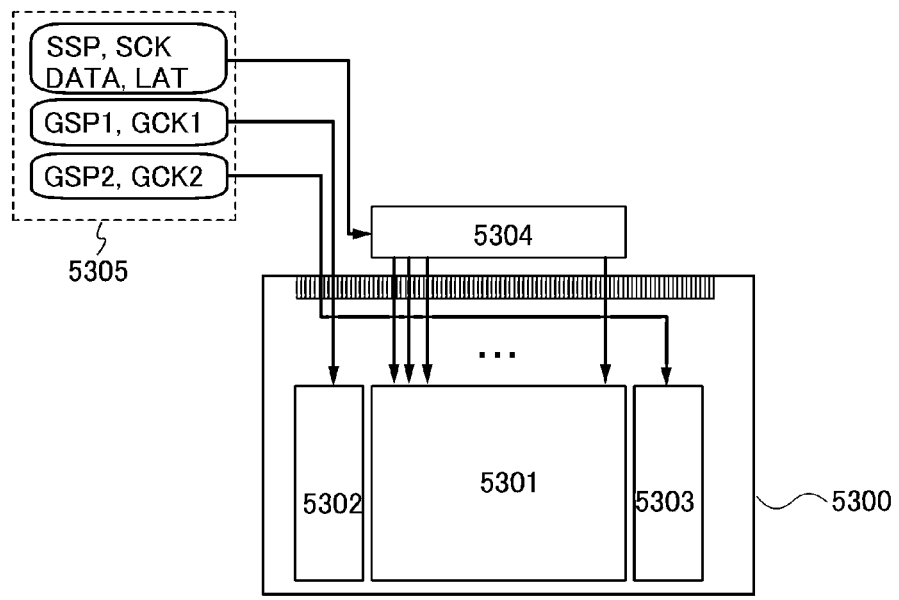

FIG. 14B illustrates a structure in which circuits with lower driving frequency (e.g., the first scan line driver circuit 5302 and the second scan line driver circuit 5303) are formed over the substrate 5300 where the pixel portion 5301 is formed, and the signal line driver circuit 5304 is formed over a substrate which is different from the substrate 5300 where the pixel portion 5301 is formed. With this structure, the driver circuits formed over the substrate 5300 can be constituted by transistors whose field effect mobility is lower than that of transistors each using a single crystal semiconductor. Thus, increase in the size of the display device, reduction in the number of steps, reduction in cost, improvement in yield, or the like can be achieved.

The transistor described in Embodiments 1 and 2 is an n-channel transistor. Next, an example of a structure and operation of a signal line driver circuit constituted by n-channel transistors will be described with reference to FIGS. 15A and 15B.

The signal line driver circuit includes a shift register 5601 and a switching circuit 5602. The switching circuit 5602 is constituted by a plurality of switching circuits 5602_1 to 5602_N (N is a natural number). The switching circuits 5602_1 to 5602_N are each constituted by a plurality of transistors 5603_1 to 5603_$k$ ($k$ is a natural number). Here, the case where the transistors 5603_1 to 5603_$k$ are n-channel transistors is described.

A connection relation in the signal line driver circuit is described by using the switching circuit 5602_1 as an example. First terminals of the transistors 5603_1 to 5603_$k$ are connected to wirings 5604_1 to 5604_$k$, respectively. Second terminals of the transistors 5603_1 to 5603_$k$ are connected to signal lines S1 to Sk, respectively. Gates of the transistors 5603_1 to 5603_$k$ are connected to a wiring 5605_1.

The shift register 5601 has a function of sequentially selecting the switching circuits 5602_1 to 5602_N by sequentially outputting H-level signals (also referred to as H signals or signals at high power supply potential level) to wirings 5605_1 to 5605_N.

The switching circuit 5602_1 has a function of controlling a conduction state between the wirings 5604_1 to 5604_$k$ and the signal lines S1 to Sk (electrical continuity between the first terminals and the second terminals), that is, a function of controlling whether potentials of the wirings 5604_1 to 5604_$k$ are supplied to the signal lines S1 to Sk. In this manner, the switching circuit 5602_1 functions as a selector. Moreover, the transistors 5603_1 to 5603_$k$ have functions of controlling conduction states between the wirings 5604_1 to 5604_$k$ and the signal lines S1 to Sk, respectively, that is, a function of controlling whether potentials of the wirings 5604_1 to 5604_$k$ are supplied to the signal lines S1 to Sk, respectively. In this manner, each of the transistors 5603_1 to 5603_$k$ functions as a switch.

The video signal data (DATA) is input to each of the wirings 5604_1 to 5604_$k$. The video signal data (DATA) is often an analog signal corresponding to image data or an image signal.

Figure 15A:
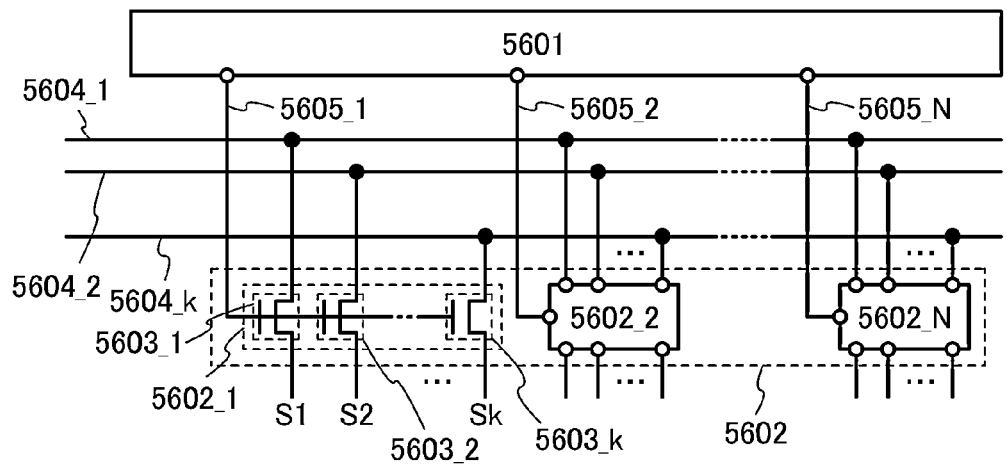
FIGS. 15A and 15B are a configuration diagram and a timing chart of a signal line driver circuit, respectively.
Figure 15B:
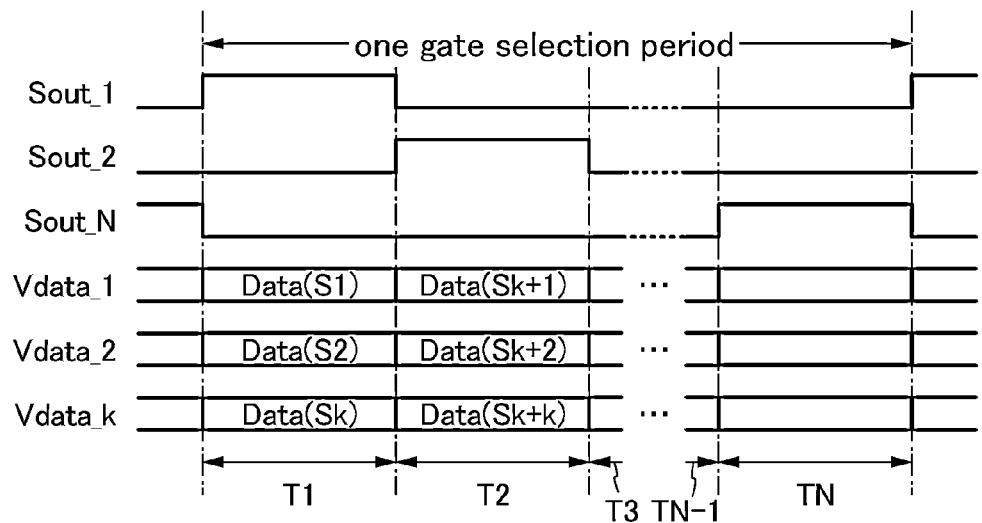

Next, the operation of the signal line driver circuit in FIG. 15A is described with reference to a timing chart in FIG. 15B. FIG. 15B illustrates examples of signals Sout_1 to Sout_N and signals Vdata_1 to Vdata_$k$. The signals Sout_1 to Sout_N are examples of output signals from the shift register

5601. The signals Vdata_1 to Vdata_*k* are examples of signals input to the wirings 5604_1 to 5604_*k*. Note that one operation period of the signal line driver circuit corresponds to one gate selection period in a display device. For example, one gate selection period is divided into periods T1 to TN. Each of the periods T1 to TN is a period for writing the video signal data (DATA) into a pixel that belongs to a selected row.

Note that signal waveform distortion and the like in each structure illustrated in drawings and the like in this embodiment are exaggerated for simplicity in some cases. Therefore, this embodiment is not necessarily limited to the scale illustrated in the drawing.

In the periods T1 to TN, the shift register 5601 outputs H-level signals sequentially to the wirings 5605_1 to 5605_N. For example, in the period T1, the shift register 5601 outputs a high-level signal to the wiring 5605_1. At that time, the transistors 5603_1 to 5603_*k* are turned on, so that the wirings 5604_1 to 5604_*k* and the signal lines S1 to S*k* are brought into conduction. Then, Data(S1) to Data(S*k*) are input to the wirings 5604_1 to 5604_*k*, respectively. The Data(S1) to Data(S*k*) are written into pixels in a first to *k*th columns in a selected row through the transistors 5603_1 to 5603_*k*, respectively. In such a manner, in the periods T1 to TN, the video signal data (DATA) are sequentially written into the pixels in the selected row by *k* columns.

The video signal data (DATA) are written into pixels by a plurality of columns as described above, whereby the number of video signal data (DATA) or the number of wirings can be reduced. Consequently, the number of connections with an external circuit can be reduced. Moreover, the time for writing can be extended when video signal data (DATA) are written into pixels by a plurality of columns; thus, insufficient writing of video signal data (DATA) can be prevented.

Note that any of the circuits constituted by the transistors in Embodiments 1 and 2 can be used for the shift register 5601 and the switching circuit 5602. In that case, the shift register 5601 can be constituted by only unipolar transistors.

One embodiment of a shift register which is used for part of the scan line driver circuit and/or the signal line driver circuit is described with reference to FIGS. 16A to 16D and FIGS. 17A and 17B.

The scan line driver circuit includes a shift register. Additionally, the scan line driver circuit may include a level shifter, a buffer, or the like in some cases. In the scan line driver circuit, a clock signal (CK) and a start pulse signal (SP) are input to the shift register, so that a selection signal is generated. The selection signal generated is buffered and amplified by the buffer, and the resulting signal is supplied to a corresponding scan line. Gate electrodes of transistors in pixels of one line are connected to a scan line. Since the transistors in the pixels of one line have to be turned on all at once, a buffer that can supply a large mount of current is used.

Figure 16A:
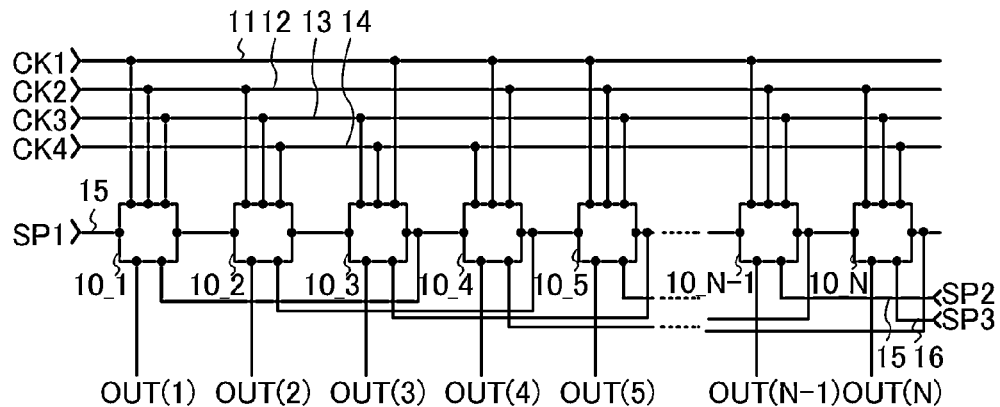
FIGS. 16A to 16D are circuit diagrams each illustrating a configuration of a shift register.

The shift register includes a first to Nth pulse output circuits 10_1 to 10_N (N is a natural number greater than or equal to 3) (see FIG. 16A). In the shift register illustrated in FIG. 16A, a first clock signal CK1, a second clock signal CK2, a third clock signal CK3, and a fourth clock signal CK4 are supplied from a first wiring 11, a second wiring 12, a third wiring 13, and a fourth wiring 14, respectively, to the first to Nth pulse output circuits 10_1 to 10_N. A start pulse SP1 (a first start pulse) is input from a fifth wiring 15 to the first pulse output circuit 10_1. To the nth pulse output circuit 10_*n* of the second or subsequent stage (n is a natural number greater than or equal to 2 and less than or equal to N), a signal from the pulse output circuit of the previous stage (such a signal is referred to as a previous-stage signal OUT(n−1)) is input. To the first pulse output circuit 10_1, a signal from the third pulse output circuit 10_3 of the stage following the next stage is input. In a similar manner, to the nth pulse output circuit 10_*n* of the second or subsequent stage, a signal from the (n+2)th pulse output circuit 10_(n+2) of the stage following the next stage (such a signal is referred to as a subsequent-stage signal OUT(n+2)) is input. Thus, the pulse output circuits of the respective stages output first output signals (OUT(1)(SR) to OUT(N)(SR)) to be input to the pulse output circuits of the subsequent stages and/or the pulse output circuits of the previous stages and second output signals (OUT(1) to OUT(N)) to be input to different circuits or the like. Note that since the subsequent-stage signal OUT(n+2) is not input to the last two stages of the shift register as illustrated in FIG. 16A, a second start pulse SP2 and a third start pulse SP3 may be additionally input to the stage before the last stage and the last stage, respectively, for example.

Note that a clock signal (CK) is a signal that alternates between an H-level and an L-level (also referred to as an L signal or a signal at low power supply potential level) at regular intervals. Here, the first clock signal (CK1) to the fourth clock signal (CK4) are delayed by ¼ cycle sequentially. In this embodiment, driving of the pulse output circuit is controlled with the first to fourth clock signals (CK1) to (CK4). Note that the clock signal is also referred to as GCK or SCK in some cases depending on a driver circuit to which the clock signal is input; the clock signal is referred to as CK in the following description.

A first input terminal 21, a second input terminal 22, and a third input terminal 23 are electrically connected to any of the first to fourth wirings 11 to 14. For example, in the first pulse output circuit 10_1 in FIG. 16A, the first input terminal 21 is electrically connected to the first wiring 11, the second input terminal 22 is electrically connected to the second wiring 12, and the third input terminal 23 is electrically connected to the third wiring 13. In the second pulse output circuit 102, the first input terminal 21 is electrically connected to the second wiring 12, the second input terminal 22 is electrically connected to the third wiring 13, and the third input terminal 23 is electrically connected to the fourth wiring 14.

Figure 16B:
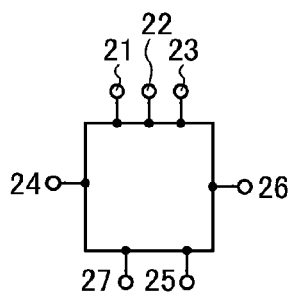

Each of the first to Nth pulse output circuits 10_1 to 10_N is assumed to include the first input terminal 21, the second input terminal 22, the third input terminal 23, a fourth input terminal 24, a fifth input terminal 25, a first output terminal 26, and a second output terminal 27 (see FIG. 16B). In the first pulse output circuit 10_1, the first clock signal CK1 is input to the first input terminal 21; the second clock signal CK2 is input to the second input terminal 22; the third clock signal CK3 is input to the third input terminal 23; a start pulse is input to the fourth input terminal 24; a subsequent-stage signal OUT(3) is input to the fifth input terminal 25; the first output signal OUT(1)(SR) is output from the first output terminal 26; and the second output signal OUT(1) is output from the second output terminal 27.

Figure 16C:
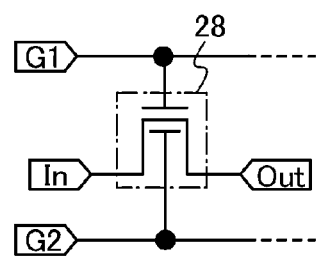

In the first to Nth pulse output circuits 10_1 to 10_N, the transistor having four terminals described in the above embodiment can be used in addition to a transistor having three terminals. FIG. 16C illustrates the symbol of a transistor 28 having four terminals which is described in the above embodiment. The symbol of the transistor 28 illustrated in FIG. 16C represents the transistor having four terminals and is used in the drawings and the like. The transistor 28 is an element that can perform electric control between an IN terminal and an OUT terminal with a first control signal G1 input to the first gate electrode and a second control signal G2 input to the second gate electrode.

When an oxide semiconductor is used for a channel layer in a transistor, the threshold voltage sometimes shifts in the positive or negative direction depending on a manufacturing process. For that reason, the transistor in which an oxide semiconductor is used for a channel layer preferably has a structure with which the threshold voltage can be controlled. The gate electrodes are provided over and under the channel formation region of the transistor 28 in FIG. 16C with a gate insulating film therebetween. By controlling a potential of the upper gate electrode and/or the lower gate electrode, the threshold voltage of the transistor 28 can be controlled to be a desired value.

Next, an example of a specific circuit configuration of the pulse output circuit illustrated in FIG. 16B will be described with reference to FIG. 16D.

Figure 16D:
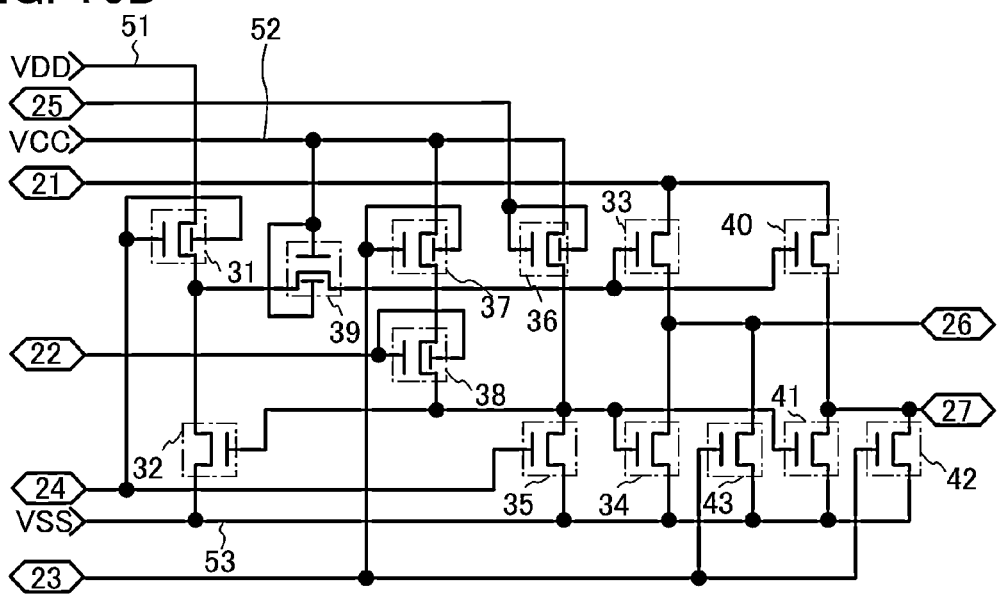

The pulse output circuit illustrated in FIG. 16D includes a first to thirteenth transistors 31 to 43. The first to thirteenth transistors 31 to 43 are connected to the first to fifth input terminals 21 to 25, a power supply line 51 to which a first high power supply potential VDD is supplied, a power supply line 52 to which a second high power supply potential VCC is supplied, and a power supply line 53 to which a low power supply potential VSS is supplied. A signal or power supply potential is supplied to the first to thirteenth transistors 31 to 43 from the power supply line 51 to which the first high power supply potential VDD is supplied, the power supply line 52 to which the second high power supply potential VCC is supplied, and the power supply line 53 to which the low power supply potential VSS is supplied, in addition to the first to fifth input terminals 21 to 25, the first output terminal 26, and the second output terminal 27. The relation of the power supply potentials of the power supply lines in FIG. 16D is as follows: the first high power supply potential VDD is higher than or equal to the second high power supply potential VCC, and the second high power supply potential VCC is higher than the third low power supply potential VSS. Note that the first to fourth clock signals (CK1) to (CK4) each alternate between an H-level and an L-level at regular intervals; for example, the clock signal at H level is VDD and the clock signal at L level is VSS. By making the potential VDD of the power supply line 51 higher than the potential VCC of the power supply line 52, a potential applied to the gate electrode of the transistor can be lowered, shift in threshold voltage of the transistor can be reduced, and degradation of the transistor can be suppressed without an adverse effect on the operation of the transistor. As illustrated in FIG. 16D, the transistor 28 with four terminals in FIG. 16C is preferably used as each of the first transistor 31 and the sixth to ninth transistors 36 to 39 among the first to thirteenth transistors 31 to 43. A potential of a node to which one electrode serving as a source or a drain of each of the first transistor 31 and the sixth to ninth transistors 36 to 39 is connected needs to be switched with a control signal of a gate electrode of each of the first transistor 31 and the sixth to ninth transistors 36 to 39. Further, the first transistor 31 and the sixth to ninth transistors 36 to 39 each reduce a malfunction of the pulse output circuit since response to the control signal input to the gate electrode is fast (the rise of on-state current is steep). Thus, by using the transistor 28 with four terminals illustrated in FIG. 16C, the threshold voltage can be controlled, and a malfunction of the pulse output circuit can be further reduced. Note that in FIG. 16D, the first control signal G1 and the second control signal are the same control signal; however, different control signals may be input.

In FIG. 16D, a first terminal of the first transistor 31 is electrically connected to the power supply line 51, a second terminal of the first transistor 31 is electrically connected to a first terminal of the ninth transistor 39, and gate electrodes (a first gate electrode and a second gate electrode) of the first transistor 31 are electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and gate electrodes (a first gate electrode and a second gate electrode) of the sixth transistor 36 are electrically connected to the fifth input terminal 25. A first terminal of the seventh transistor 37 is electrically connected to the power supply line 52, a second terminal of the seventh transistor 37 is electrically connected to a second terminal of the eighth transistor 38, and gate electrodes (a first gate electrode and a second gate electrode) of the seventh transistor 37 are electrically connected to the third input terminal 23. A first terminal of the eighth transistor 38 is electrically connected to the gate electrode of the second transistor 32 and the gate electrode of the fourth transistor 34, and gate electrodes (a first gate electrode and a second gate electrode) of the eighth transistor 38 are electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to a gate electrode of the third transistor 33 and a gate electrode of the tenth transistor 40, and gate electrodes (a first gate electrode and a second gate electrode) of the ninth transistor 39 are electrically connected to the power supply line 52. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34. A first terminal of the twelfth transistor 42 is electrically connected to the power supply line 53, a second terminal of the twelfth transistor 42 is electrically connected to the second output terminal 27, and a gate electrode of the twelfth transistor 42 is electrically connected to the gate electrodes (the first gate electrode and the second gate electrode) of the seventh transistor 37. A first terminal of the thirteenth transistor 43 is electrically connected to the power supply line 53, a second terminal of the thirteenth transistor 43 is electrically connected to the first output terminal 26, and a gate electrode of the thirteenth transistor 43 is electrically connected to the gate electrodes (the first gate electrode and the second gate electrode) of the seventh transistor 37.

In FIG. 16D, a portion where the gate electrode of the third transistor 33, the gate electrode of the tenth transistor 40, and the second terminal of the ninth transistor 39 are connected is referred to as a node A. Moreover, a portion where the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 are connected is referred to as a node B (see FIG. 17A).

Figure 17A:
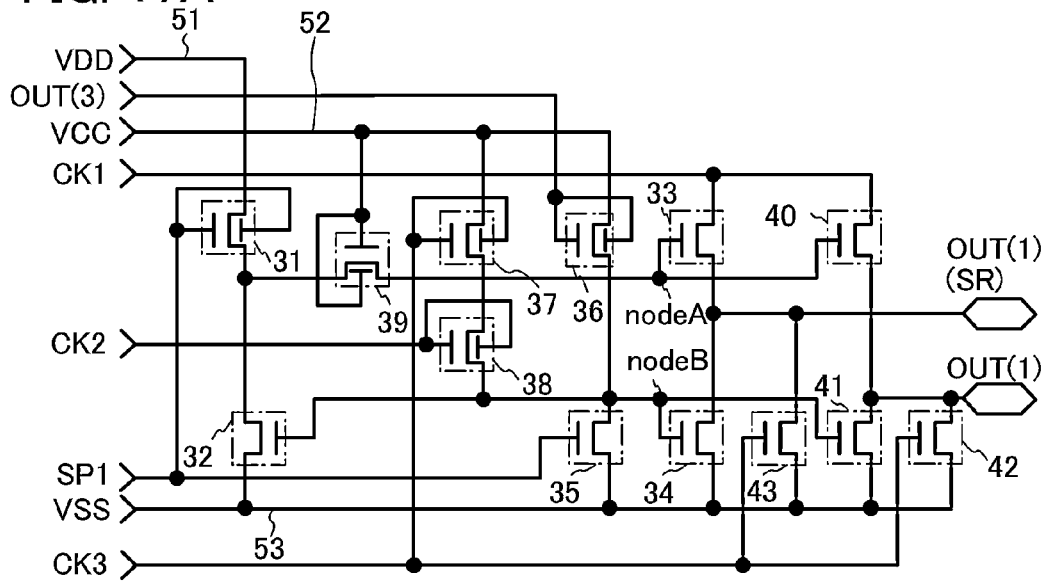
FIGS. 17A and 17B are a circuit diagram illustrating a configuration of a shift register and a timing chart illustrating an operation of the shift register, respectively.

FIG. 17A illustrates signals that are input to or output from the first to fifth input terminals 21 to 25 and the first and second output terminals 26 and 27 in the case where the pulse output circuit illustrated in FIG. 16D is applied to the first pulse output circuit 10_1.

Specifically, the first clock signal CK1 is input to the first input terminal 21; the second clock signal CK2 is input to the second input terminal 22; the third clock signal CK3 is input to the third input terminal 23; the start pulse is input to the fourth input terminal 24; the subsequent-stage signal OUT(3) is input to the fifth input terminal 25; the first output signal OUT(1)(SR) is output from the first output terminal 26; and the second output signal OUT(1) is output from the second output terminal 27.

Note that a transistor is an element having at least three terminals of a gate, a drain, and a source. The transistor has a semiconductor in which a channel region is formed in a region overlapped with the gate, and current which flows between the drain and the source through the channel region can be controlled by controlling the potential of the gate. Here, since the source and the drain of the transistor may change depending on the structure, the operating condition, and the like of the transistor, it is difficult to define which is a source or a drain. Therefore, a region functioning as the source or the drain is not called the source or the drain in some cases. In that case, for example, such regions may be referred to as a first terminal and a second terminal.

Note that in FIG. 16D and FIG. 17A, a capacitor for performing bootstrap operation by bringing the node A into a floating state may be additionally provided. Furthermore, a capacitor having one electrode electrically connected to the node B may be additionally provided in order to hold a potential of the node B.

Figure 17B:
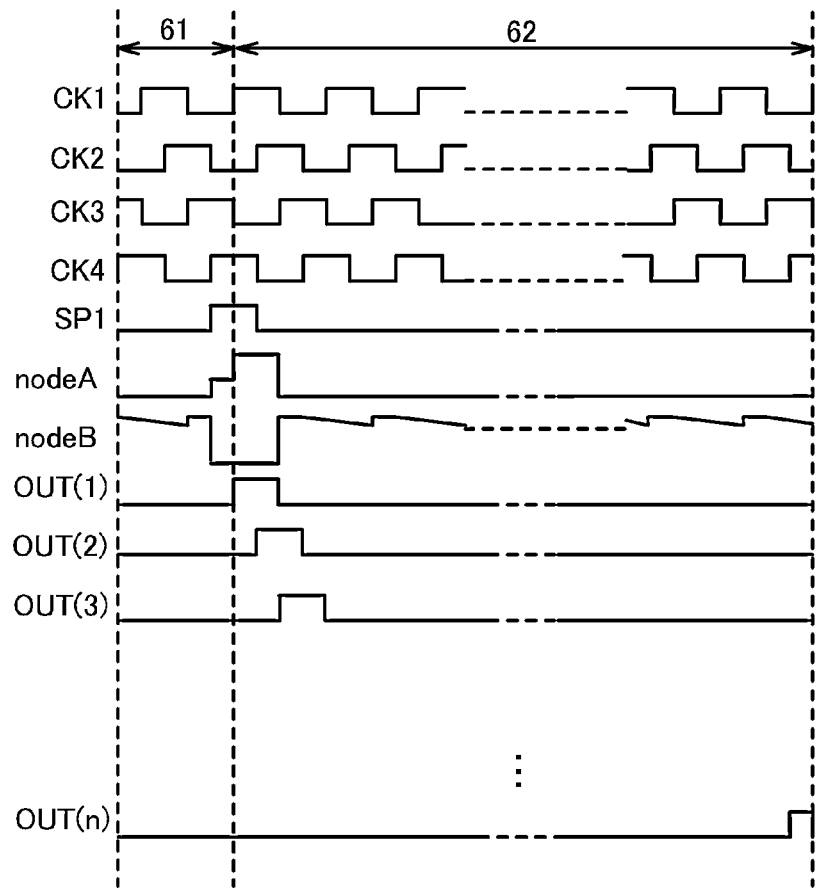

FIG. 17B illustrates a timing chart of a shift register including a plurality of pulse output circuits illustrated in FIG. 17A. Note that when the shift register is the one of a scan line driver circuit, a period 61 in FIG. 17B corresponds to a vertical retrace period and a period 62 corresponds to a gate selection period.

Note that the placement of the ninth transistor 39 in which the second power supply potential VCC is applied to the gate electrode as illustrated in FIG. 17A has the following advantages before and after bootstrap operation.

Without the ninth transistor 39 in which the second power supply potential VCC is applied to the gate electrode, if a potential of the node A is raised by bootstrap operation, a potential of the source which is the second terminal of the first transistor 31 rises to a value higher than the first power supply potential VDD. Then, the source of the first transistor 31 is switched to the first terminal, that is, the terminal on the power supply line 51 side. Consequently, in the first transistor 31, high voltage is applied and thus significant stress is applied between the gate and the source and between the gate and the drain, which might cause deterioration of the transistor. On the other hand, with the ninth transistor 39 in which the second power supply potential VCC is applied to the gate electrode, increase in the potential of the second terminal of the first transistor 31 can be prevented while the potential of the node A is raised by bootstrap operation. In other words, the placement of the ninth transistor 39 can lower the level of negative voltage applied between the gate and the source of the first transistor 31. Thus, the circuit configuration in this embodiment can reduce negative voltage applied between the gate and the source of the first transistor 31, so that deterioration of the first transistor 31 due to stress can be suppressed.

Note that the ninth transistor 39 may be provided so that the first terminal and the second terminal of the ninth transistor 39 are connected between the second terminal of the first transistor 31 and the gate of the third transistor 33. Note that in the case of the shift register including a plurality of pulse output circuits in this embodiment in a signal line driver circuit having a larger number of stages than a scan line driver circuit, the ninth transistor 39 can be omitted, which is advantageous in that the number of transistors is reduced.

Note that an oxide semiconductor is used for a semiconductor layer of each of the first to thirteenth transistors 31 to 43, whereby the off-state current of the transistors can be reduced, the on-state current and field effect mobility can be increased. In addition, the degree of degradation of the transistors can be reduced and thus, a malfunction in the circuit can be reduced. Moreover, the degree of deterioration of the transistor formed using an oxide semiconductor by application of a high potential to a gate electrode is smaller than that of a transistor formed using amorphous silicon. Consequently, similar operation can be obtained even when the first power supply potential VDD is supplied to the power supply line to which the second power supply potential VCC is supplied, and the number of power supply lines placed between circuits can be reduced; thus, the size of the circuit can be reduced.

Note that a similar function is obtained even when the connection relation is changed so that a clock signal that is supplied to the gate electrodes (the first gate electrode and the second gate electrode) of the seventh transistor 37 from the third input terminal 23 and a clock signal that is supplied to the gate electrodes (the first gate electrode and the second gate electrode) of the eighth transistor 38 from the second input terminal 22 are supplied from the second input terminal 22 and the third input terminal 23, respectively. In the shift register illustrated in FIG. 17A, a state of the seventh transistor 37 and the eighth transistor 38 is changed so that both the seventh transistor 37 and the eighth transistor 38 are on, then the seventh transistor 37 is off and the eighth transistor 38 is on, and then the seventh transistor 37 and the eighth transistor 38 are off; thus, the fall in potential of the node B due to fall in potentials of the second input terminal 22 and the third input terminal 23 is caused twice by fall in potential applied to the gate electrode of the seventh transistor 37 and fall in potential applied to the gate electrode of the eighth transistor 38. On the other hand, in the shift register illustrated in FIG. 17A, when a state of the seventh transistor 37 and the eighth transistor 38 is changed so that both the seventh transistor 37 and the eighth transistor 38 are on, then the seventh transistor 37 is on and the eighth transistor 38 is off, and then the seventh transistor 37 and the eighth transistor 38 are off, the fall in potential of the node B due to fall in potentials of the second input terminal 22 and the third input terminal 23 occurs only once, which is caused by fall in potential applied to the gate electrode of the eighth transistor 38. Consequently, the connection relation, in which the clock signal CK3 is supplied to the gate electrodes (the first gate electrode and the second gate electrode) of the seventh transistor 37 from the third input terminal 23 and the clock signal CK2 is supplied to the gate electrodes (the first gate electrode and the second gate electrode) of the eighth transistor 38 from the second input terminal 22, is preferable. That is because the number of times of the change in the potential of the node B can be reduced, whereby the noise can be reduced.

In such a manner, an H-level signal is regularly supplied to the node B in a period during which the potentials of the first output terminal 26 and the second output terminal 27 are held at L level; thus, a malfunction of the pulse output circuit can be suppressed.

Note that the structure described in this embodiment can be used in combination with any of the structures described in the other embodiments, as appropriate.

Embodiment 4

In this embodiment, a semiconductor device (also referred to as a display device) with a display function, which can be formed using the transistors described in Embodiments 1 and 2 in a pixel portion and a driver circuit will be described. Further, part or whole of a driver circuit can be formed over the same substrate as a pixel portion, using the transistor described in Embodiments 1 and 2, whereby a system-on-panel can be obtained.

The display device includes a display element. As the display element, a liquid crystal element (also referred to as a liquid crystal display element) or a light-emitting element (also referred to as a light-emitting display element) can be used. The light-emitting element includes an element whose luminance is controlled by current or voltage in its category, and specifically includes an inorganic electroluminescent (EL) element, an organic EL element, and the like in its category. Furthermore, a display medium whose contrast is changed by an electric effect, such as electronic ink, can be used.

In addition, a display device includes a panel in which a display element is sealed, and a module in which an IC including a controller or the like is mounted on the panel. Furthermore, an element substrate, which corresponds to one embodiment before the display element is completed in a manufacturing process of the display device, is provided with a means for supplying current to the display element in each of a plurality of pixels. Specifically, the element substrate may be in a state where only a pixel electrode of the display element is formed, a state after formation of a conductive film to be a pixel electrode and before etching of the conductive film to form the pixel electrode, or any other states.

Note that a display device in this specification refers to an image display device, a display device, or a light source (including a lighting device). Further, the display device includes the following modules in its category: a module including a connector such as a flexible printed circuit (FPC), a tape automated bonding (TAB) tape; or a tape carrier package (TCP) attached; a module having a TAB tape or a TCP which is provided with a printed wiring board at the end thereof; and a module having an integrated circuit (IC) that is directly mounted on a display element with a chip on glass (COG) method.

In this embodiment, the appearance and a cross section of a liquid crystal display panel, which is one embodiment of a semiconductor device, will be described with reference to FIGS. 20A1, 20A2, and 20B. FIGS. 20A1 and 20A2 are top views of a panel in which highly reliable transistors 4010 and 4011 each including the In—Ga—Zn—O-based film described in Embodiments 1 and 2 as an oxide semiconductor layer and a liquid crystal element 4013 formed over a first substrate 4001 are sealed between the first substrate 4001 and a second substrate 4006 with a sealant 4005. FIG. 20B is a cross-sectional view taken along line M-N of FIGS. 20A1 and 20A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that there is no particular limitation on the connection method of the driver circuit which is separately formed, and a COG method, a wire bonding method, a TAB method, or the like can be used. FIG. 20A1 illustrates an example in which the signal line driver circuit 4003 is mounted with a COG method. FIG. 20A2 illustrates an example in which the signal line driver circuit 4003 is mounted with a TAB method.

The pixel portion 4002 and the scan line driver circuit 4004 provided over the first substrate 4001 include a plurality of transistors. FIG. 20B illustrates the transistor 4010 included in the pixel portion 4002 and the transistor 4011 included in the scan line driver circuit 4004, as an example. Insulating layers 4020 and 4021 are provided over the transistors 4010 and 4011.

Any of the highly reliable transistors including an In—Ga—Zn—O-based film as the oxide semiconductor layers which are described in Embodiments 1 and 2 can be used as the transistors 4010 and 4011. In this embodiment, the transistors 4010 and 4011 are n-channel transistors.

A conductive layer 4040 is provided over part of an insulating layer 4044, which overlaps with a channel formation region of an oxide semiconductor layer in the transistor 4011 for the driver circuit. The conductive layer 4040 is provided at the position overlapping with the channel formation region of the oxide semiconductor layer, whereby the amount of change in threshold voltage of the transistor 4011 before and after the BT test can be reduced. The conductive layer 4040 may have the same potential as or have potential different from that of the gate electrode layer of the transistor 4011 and can function as a second gat electrode layer. Alternatively, the potential of the conductive layer 4040 may be GND or 0 V, or the conductive layer 4040 may be in a floating state.

A pixel electrode layer 4030 included in the liquid crystal element 4013 is electrically connected to the transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 respectively which each function as an alignment film, and the liquid crystal layer 4008 is sandwiched between the pixel electrode layer 4030 and the counter electrode layer 4031 with the insulating layers 4032 and 4033 therebetween. Although not illustrated, a color filter may be provided on either the first substrate 4001 side or the second substrate 4006 side.

Note that glass, metal (typically, stainless steel), ceramics, or plastics can be used as the first substrate 4001 and the second substrate 4006. As plastics, a fiberglass-reinforced plastics (FRP) plate, a polyvinyl fluoride (PVF) film, a polyester film, or an acrylic resin film can be used. Alternatively, a sheet with a structure in which aluminum foil is sandwiched between PVF films, polyester films, or the like may be used.

A spacer 4035 is a columnar spacer obtained by selective etching of an insulating film and is provided in order to control the distance (a cell gap) between the pixel electrode layer 4030 and the counter electrode layer 4031. Alternatively, a spherical spacer may also be used. The counter electrode layer 4031 is electrically connected to a common potential line formed over the substrate where the transistor 4010 is formed. The counter electrode layer 4031 and the common potential line can be electrically connected to each other through conductive particles arranged between a pair of substrates using the common connection portion. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is only generated within a narrow range of temperature, a liquid crystal composition containing a chiral agent at 5 wt % or more is used for the liquid crystal layer 4008 in order to improve the temperature range. The liquid crystal composition including liquid crystal exhibiting a blue phase and a chiral agent has a short response time of greater than or equal to 10 μsec and less than or equal to 100 μsec and is optically isotropic; therefore, alignment treatment is not necessary and viewing angle dependence is small. Note that in the case where a blue phase is used, one embodiment of the present invention is not limited to the structures in FIGS. 20A1, 20A2, and 20B and a structure of a so-called horizontal electric field mode, in which an electrode layer corresponding to the counter electrode layer 4031 is formed on the side of the substrate over which the pixel electrode layer 4030 is formed, may be used.

Note that this embodiment is an example of a transmissive liquid crystal display device, and one embodiment of the present invention can also be applied to a reflective liquid crystal display device and a transflective liquid crystal display device.

In the example of the liquid crystal display device according to this embodiment, a polarizing plate is provided on the outer surface of the substrate (on the viewer side) and a coloring layer (color filter) and an electrode layer used for a display element are sequentially provided on the inner surface of the substrate; alternatively, the polarizing plate may be provided on the inner surface of the substrate. The layered structure of the polarizing plate and the coloring layer is not limited to that in this embodiment and may be set as appropriate depending on materials of the polarizing plate and the coloring layer or conditions of the manufacturing process. Further, a light-blocking film serving as a black matrix may be provided.

In this embodiment, in order to reduce the surface roughness due to the transistor and to improve the reliability of the transistor, the transistor obtained in Embodiment 2 is covered with insulating layers (the insulating layers 4020 and 4021) serving as a protective film and a planarizing insulating film. Note that the protective film is provided to prevent entry of contaminant impurities such as an organic substance, metal, and moisture existing in the air and is preferably a dense film. The protective film may be formed with a single-layer structure or a layered structure using any of a silicon oxide film, a silicon nitride film, a silicon oxynitride film, a silicon nitride oxide film, an aluminum oxide film, an aluminum nitride film, aluminum oxynitride film, and an aluminum nitride oxide film. Although this embodiment describes an example in which the protective film is formed with a sputtering method, any other method may be used.

In this embodiment, the insulating layer 4020 having a layered structure is formed as a protective film. Here, a silicon oxide film is formed with a sputtering method as a first layer of the insulating layer 4020. The use of the silicon oxide film as the protective film has an effect of preventing hillock of an aluminum film which is used as the source and drain electrode layers.

As a second layer of the protective film, an insulating layer is formed. Here, a silicon nitride film is formed with a sputtering method, as the second layer of the insulating layer 4020. The use of the silicon nitride film as the protective film can prevent mobile ions of sodium or the like from entering a semiconductor region, so that variation in electrical characteristics of the transistor can be suppressed.

After the protective film is formed, annealing (higher than or equal to 300° C. and lower than or equal to 400° C.) of the oxide semiconductor layer may be performed.

The insulating layer 4021 is formed as a planarization insulating film. The insulating layer 4021 can be formed using a heat-resistant organic material such as an acrylic resin, polyimide, a benzocyclobutene resin, polyamide, or an epoxy resin. Other than such organic materials, it is also possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating films formed using any of these materials.

Note that a siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. Moreover, the organic group may include a fluoro group.

There is no particular limitation on the method of forming the insulating layer 4021, and the following method or means can be employed depending on the material: a method such as a sputtering method, an SOG method, a spin coating method, a dipping method, a spray coating method, or a droplet discharge method (e.g., an ink-jet method, screen printing, or offset printing), or a tool such as a doctor knife, a roll coater, a curtain coater, or a knife coater. In the case of forming the insulating layer 4021 with the use of a liquid material, annealing (higher than or equal to 300° C. and lower than or equal to 400° C.) of the oxide semiconductor layer may be performed at the same time as a baking step. The baking step of the insulating layer 4021 also serves as annealing of the oxide semiconductor layer, whereby a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Alternatively, a conductive composition containing a conductive high molecule (also referred to as a conductive polymer) can be used for the pixel electrode layer 4030 and the counter electrode layer 4031. The pixel electrode formed using the conductive composition preferably has a sheet resistance of less than or equal to 10000 ohms per square and a light transmittance of greater than or equal to 70% at a wavelength of 550 nm. Further, the resistivity of the conductive high molecule included in the conductive composition is preferably less than or equal to 0.1 Ω·cm.

As the conductive high molecule, a so-called π-electron conjugated conductive polymer can be used. Examples are polyaniline and a derivative thereof, polypyrrole and a derivative thereof, polythiophene and a derivative thereof, and a copolymer of two or more kinds of these materials.

Further, a variety of signals and potentials are supplied to the signal line driver circuit 4003 which is separately formed, the scan line driver circuit 4004, or the pixel portion 4002 from an FPC 4018.

In this embodiment, a connection terminal electrode 4015 is formed using the same conductive film as the pixel electrode layer 4030 included in the liquid crystal element 4013. A terminal electrode 4016 is formed using the same conductive film as source and drain electrode layers of the transistors 4010 and 4011.

The connection terminal electrode 4015 is electrically connected to a terminal included in the FPC 4018 through an anisotropic conductive film 4019.

Note that FIGS. 20A1, 20A2, and 20B illustrate the example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 21:
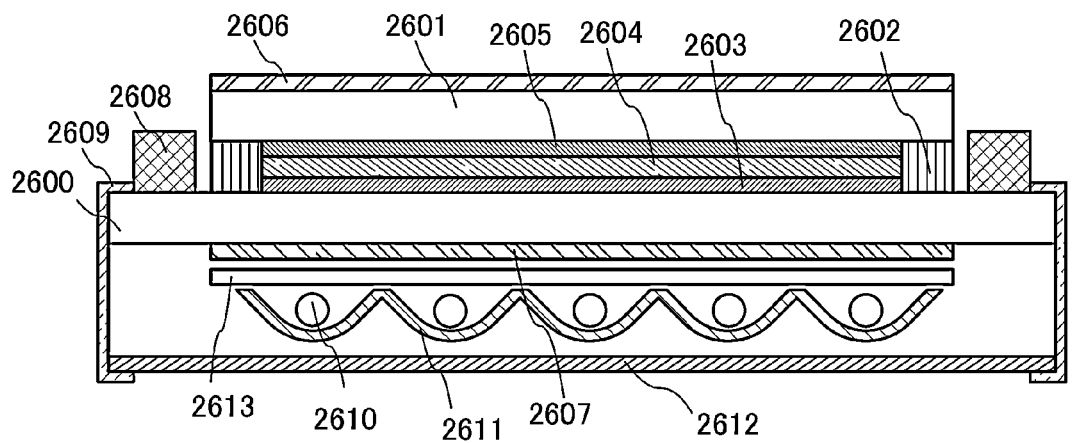
FIG. 21 is a cross-sectional view illustrating one embodiment of the present invention.

FIG. 21 illustrates an example of a liquid crystal display module which is formed as a semiconductor device using a transistor substrate 2600 over which the transistor described in Embodiments 1 and 2 is formed.

FIG. 21 illustrates an example of the liquid crystal display module, in which the transistor substrate 2600 and a counter substrate 2601 are fixed to each other with a sealant 2602, and a pixel portion 2603 including a transistor and the like, a display element 2604 including a liquid crystal layer, and a coloring layer 2605 are provided between the substrates to form a display region. The coloring layer 2605 is necessary to perform color display. In the RGB system, coloring layers corresponding to colors of red, green, and blue are provided for pixels. Polarizing plates 2606 and 2607 and a diffusion plate 2613 are provided outside the transistor substrate 2600 and the counter substrate 2601. A light source includes a cold cathode tube 2610 and a reflective plate 2611. A circuit board 2612 is connected to a wiring circuit portion 2608 of the transistor substrate 2600 by a flexible wiring board 2609 and includes an external circuit such as a control circuit or a power source circuit. The polarizing plate and the liquid crystal layer may be stacked with a retardation plate therebetween.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

Through the above steps, a highly reliable liquid crystal display panel as a semiconductor device can be formed.

Note that the structure described in this embodiment can be used in combination with any of the structures described in the other embodiments, as appropriate.

Embodiment 5

In this embodiment, an example of electronic paper will be described as a semiconductor device to which the transistor described in Embodiments 1 and 2 is applied.

Figure 13:
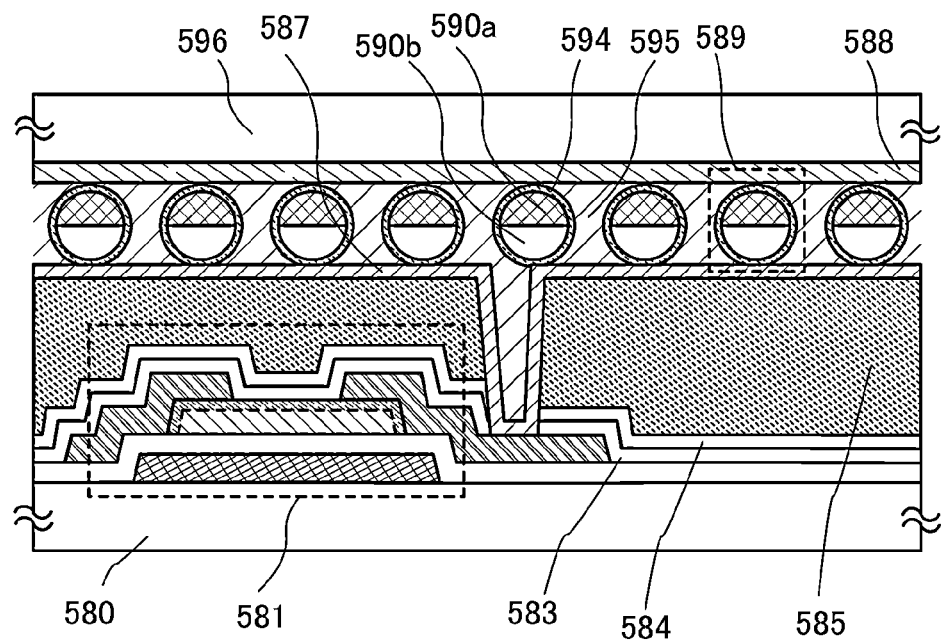
FIG. 13 is a cross-sectional view illustrating one embodiment of the present invention.

FIG. 13 illustrates active matrix electronic paper as an example of a semiconductor device. The transistor described in Embodiments 1 and 2 can be used as a transistor 581 used for the semiconductor device.

The electronic paper in FIG. 13 is an example of a semiconductor device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The transistor 581 formed over a substrate 580 has a bottom gate structure in which the source and drain electrode layer is electrically connected to a first electrode layer 587 through an opening formed in an insulating layer 583, an insulating layer 584 and an insulating layer 585. Spherical particles 589 are provided between the first electrode layer 587 and a second electrode layer 588 formed on a substrate 596. Each of the spherical particles 589 includes a black region 590*a*, a white region 590*b*, and a cavity 594 filled with liquid around the black region 590*a* and the white region 590*b*. A space around the spherical particles 589 is filled with a filler 595 such as a resin (see FIG. 13). In this embodiment, the first electrode layer 587 corresponds to a pixel electrode, and the second electrode layer 588 corresponds to a common electrode. The second electrode layer 588 is electrically connected to a common potential line provided over the substrate where the transistor 581 is formed. With the use of a common connection portion, the second electrode layer 588 can be electrically connected to the common potential line through conductive particles provided between a pair of substrates.

Alternatively, it is possible to use an electrophoretic element instead of the twisting ball. A microcapsule having a diameter of approximately greater than or equal to 10 μm and less than or equal to 200 μm in which transparent liquid, positively charged white microparticles, and negatively charged black microparticles are encapsulated, is used. In the microcapsule provided between the first electrode layer and the second electrode layer, when an electric field is applied by the first electrode layer and the second electrode layer, the white microparticles and the black microparticles move in opposite directions, so that white or black can be displayed. A display element using this principle is an electrophoretic display element, and a device including the electrophoretic display element is called electronic paper in general. The electrophoretic display element has higher reflectance than a liquid crystal display element; thus, an auxiliary light is unnecessary, power consumption is low, and a display portion can be recognized in a dim place. In addition, even when power is not supplied to the display portion, an image which has been displayed once can be maintained. Consequently, a displayed image can be stored even if a semiconductor device having a display function (which is also referred to as a display device or a semiconductor device provided with a display device) is kept away from an electric wave source.

Through this process, highly reliable electronic paper as a semiconductor device can be manufactured.

Note that the structure described in this embodiment can be used in combination with any of the structures described in the other embodiments, as appropriate.

Embodiment 6

In this embodiment, an example of a light-emitting display device will be described as a semiconductor device to which the transistor described in Embodiments 1 and 2 is applied. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Because of such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

Figure 18:
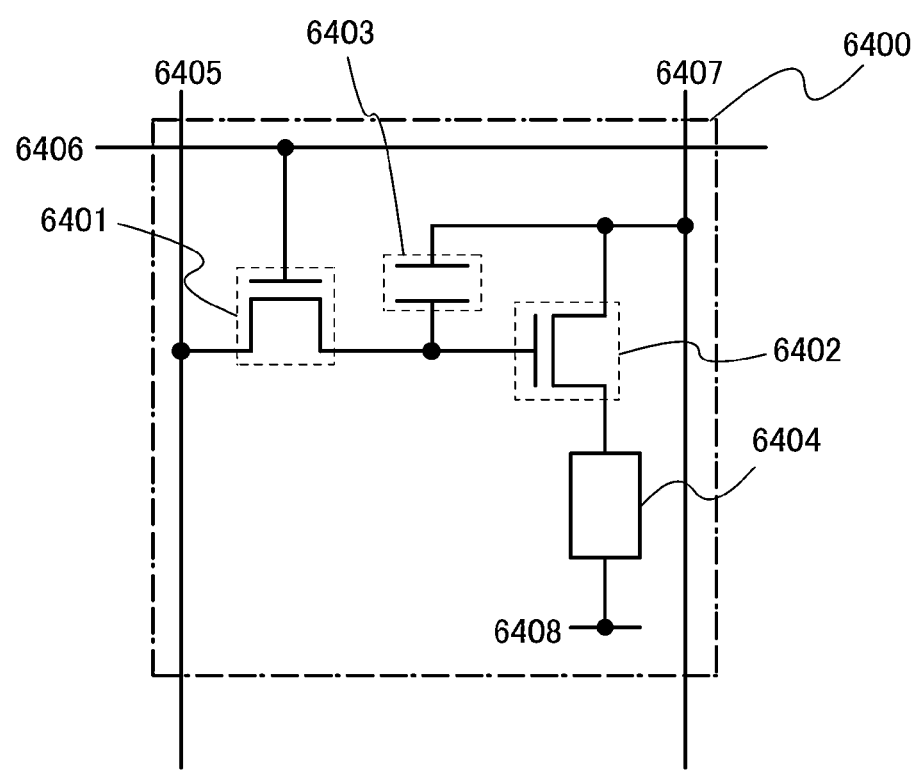
FIG. 18 illustrates a pixel equivalent circuit of a semiconductor device.

FIG. 18 illustrates an example of a pixel structure to which digital time grayscale driving can be applied, as an example of a semiconductor device to which the present invention is applied.

A structure and operation of a pixel to which digital time grayscale driving can be applied are described. Here, an example is described in which one pixel includes two n-channel transistors each of which is described in Embodiments 1 and 2 and each of which includes the oxide semiconductor layer (In—Ga—Zn—O-based film) in a channel formation region.

A pixel 6400 includes a switching transistor 6401, a driver transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. The gate of the driver transistor 6402 is connected to a power supply line 6407 via the capacitor 6403, a first electrode of the driver transistor 6402 is connected to the power supply line 6407, and a second electrode of the driver transistor 6402 is connected to a first electrode (pixel electrode) of the light-emitting element 6404. A second electrode of the light-emitting element 6404 corresponds to a common electrode 6408. The common electrode 6408 is electrically connected to a common potential line provided over the same substrate.

The second electrode (common electrode 6408) of the light-emitting element 6404 is set to low power supply potential. Note that the low power supply potential is potential satisfying the low power supply potential<high power supply potential with reference to the high power supply potential that is set to the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is forward threshold voltage or higher of the light-emitting element 6404.

Note that a gate capacitor of the driver transistor 6402 may be used as a substitute for the capacitor 6403, so that the capacitor 6403 can be omitted. The gate capacitor of the driver transistor 6402 may be formed between the channel formation region and the gate electrode.

In the case of a voltage-input voltage driving method, a video signal is input to the gate of the driver transistor 6402 so that the driver transistor 6402 is in either of two states of being sufficiently turned on or turned off. That is, the driver transistor 6402 operates in a linear region. Since the driver transistor 6402 operates in the linear region, voltage higher than the voltage of the power supply line 6407 is applied to the gate of the driver transistor 6402. Note that voltage higher than or equal to (voltage of the power supply line+Vth of the driver transistor 6402) is applied to the signal line 6405.

In the case of performing analog grayscale driving instead of digital time grayscale driving, the same pixel configuration as FIG. 18 can be used by changing signal input.

In the case of performing analog grayscale driving, voltage higher than or equal to (forward voltage of the light-emitting element 6404+Vth of the driver transistor 6402) is applied to the gate of the driver transistor 6402. The forward voltage of the light-emitting element 6404 indicates voltage at which a desired luminance is obtained, and includes at least forward threshold voltage. The video signal by which the driver transistor 6402 operates in a saturation region is input, so that current can be supplied to the light-emitting element 6404. In order for the driver transistor 6402 to operate in the saturation region, the potential of the power supply line 6407 is set higher than the gate potential of the driver transistor 6402. When an analog video signal is used, it is possible to feed current to the light-emitting element 6404 in accordance with the video signal and perform analog grayscale driving.

Note that the pixel structure illustrated in FIG. 18 is not limited thereto. For example, a switch, a resistor, a capacitor, a transistor, a logic circuit, or the like may be added to the pixel illustrated in FIG. 18.

Next, structures of the light-emitting element will be described with reference to FIGS. 19A to 19C. Here, the case where a driver transistor is an n-channel transistor is illustrated, and cross-sectional structures of pixels are described. Driver transistors 7001, 7011, and 7021 used for semiconductor devices illustrated in FIGS. 19A to 19C can be manufactured in a manner similar to that of the transistor described in Embodiments 1 and 2 and are highly reliable thin film transistors each including an In—Ga—Zn—O-based film as an oxide semiconductor layer.

In order to extract light emitted from the light-emitting element, at least one of an anode and a cathode is required to transmit light. A transistor and a light-emitting element are formed over a substrate. A light-emitting element can have a top emission structure, in which light emission is extracted through the surface on the side opposite to the substrate side; a bottom emission structure, in which light emission is extracted through the surface on the substrate side; or a dual emission structure, in which light emission is extracted through the surface on the side opposite to the substrate side and the surface on the substrate side. The pixel structure according to one embodiment of the present invention can be applied to a light-emitting element having any of these emission structures.

Next, a light-emitting element having a bottom emission structure will be described with reference to FIG. 19A.

FIG. 19A is a cross-sectional view of a pixel in the case where the driver transistor 7011 is an n-channel transistor and light generated in a light-emitting element 7012 is emitted to pass through a first electrode 7013. In FIG. 19A, the first electrode 7013 of the light-emitting element 7012 is formed over a light-transmitting conductive film 7017 which is electrically connected to the drain layer of the driver transistor 7011, and an EL layer 7014 and a second electrode 7015 are stacked in that order over the first electrode 7013.

As the light-transmitting conductive film 7017, a light-transmitting conductive film such as a film of indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added can be used.

Any of a variety of materials can be used for the first electrode 7013 of the light-emitting element. Specifically, the first electrode 7013 is preferably formed using a material having a relatively low work function such as an alkali metal such as Li or Cs; an alkaline earth metal such as Mg, Ca, or Sr; an alloy containing any of these metals (e.g., Mg:Ag or Al:Li); or a rare earth metal such as Yb or Er. In FIG. 19A, the first electrode 7013 is formed to have a thickness enough to transmit light (preferably, approximately 5 nm to 30 nm). For example, an aluminum film with a thickness of 20 nm is used as the first electrode 7013.

Alternatively, a light-transmitting conductive film and an aluminum film may be stacked and then selectively etched so as to form the light-transmitting conductive film 7017 and the first electrode 7013. In this case, the etching can be performed using the same mask, which is preferable.

The peripheral portion of the first electrode 7013 is covered with a partition 7019. The partition 7019 can be formed using an organic resin film of polyimide, acrylic, polyamide, epoxy, or the like; an inorganic insulating film; or organic polysiloxane. It is particularly preferable that the partition 7019 be formed using a photosensitive resin material to have an opening over the first electrode 7013 so that a sidewall of the opening is formed as an inclined surface with continuous curvature. In the case where a photosensitive resin material is used for the partition 7019, a step of forming a resist mask can be omitted.

The EL layer 7014 which is formed over the first electrode 7013 and the partition 7019 may include at least a light-emitting layer and be formed using a single layer or a plurality of layers stacked. When the EL layer 7014 is formed using a plurality of layers, an electron-injection layer, an electron-transport layer, a light-emitting layer, a hole-transport layer, and a hole-injection layer are stacked in that order over the first electrode 7013 which serves as a cathode. Note that not all of these layers need to be provided except for the light-emitting layer.

The stacking order is not limited to the above stacking order, and a hole-injection layer, a hole-transport layer, a light-emitting layer, an electron-transport layer, and an electron-injection layer may be stacked in that order over the first electrode 7013 which serves as an anode. However, when power consumption is compared, it is preferable that the first electrode 7013 serve as a cathode and an electron-injection layer, an electron-transport layer, a light-emitting layer, a hole-transport layer, and a hole-injection layer be stacked in that order over the first electrode 7013 because voltage rise in the driver circuit portion can be suppressed and power consumption can be decreased.

As the second electrode 7015 formed over the EL layer 7014, various materials can be used. For example, when the second electrode 7015 is used as an anode, it is preferable to use a material having a high work function, such as ZrN, Ti, W, Ni, Pt, Cr, or a light-transmitting conductive material of ITO, IZO, or ZnO. Further, a light-blocking film 7016, for example, a metal which blocks light, a metal which reflects light, or the like is provided over the second electrode 7015. In this embodiment, an ITO film is used as the second electrode 7015 and a Ti film is used as the light-blocking film 7016.

The light-emitting element 7012 corresponds to a region where the first electrode 7013 and the second electrode 7015 sandwich the EL layer 7014 including a light-emitting layer. In the case of the element structure illustrated in FIG. 19A, light is emitted from the light-emitting element 7012 to the first electrode 7013 side as indicated by an arrow.

Note that in FIG. 19A, light emitted from the light-emitting element 7012 passes through a color filter layer 7033, an insulating layer 7032, an oxide insulating layer 7031, a gate insulating layer 7030, and a substrate 7010 to be emitted.

The color filter layer 7033 is formed with a droplet discharge method such as an inkjet method, a printing method, an etching method with the use of a photolithography technique, or the like.

The color filter layer 7033 is covered with an overcoat layer 7034, and also covered with a protective insulating layer 7035. Although the overcoat layer 7034 is illustrated to have a small thickness in FIG. 19A, the overcoat layer 7034 has a function of reducing unevenness caused by the color filter layer 7033 with the use of a resin material such as an acrylic resin.

A contact hole which is formed in the protective insulating layer 7035, the overcoat layer 7034, the color filter layer 7033, the insulating layer 7032, and the oxide insulating layer 7031, and which reaches the drain electrode layer is provided in a portion which overlaps with the partition 7019.

Next, a light-emitting element having a dual emission structure will be described with reference to FIG. 19B.

In FIG. 19B, a first electrode 7023 of a light-emitting element 7022 is formed over a light-transmitting conductive film 7027 which is electrically connected to the drain electrode layer of the driver transistor 7021, and an EL layer 7024 and a second electrode 7025 are stacked in that order over the first electrode 7023.

As the light-transmitting conductive film 7027, a light-transmitting conductive film such as a film of indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added can be used.

Any of a variety of materials can be used for the first electrode 7023. For example, when the first electrode 7023 serves as a cathode, specifically, the first electrode 7023 is preferably formed using a material having a relatively low work function such as an alkali metal such as Li or Cs; an alkaline earth metal such as Mg, Ca, or Sr; an alloy containing any of these metals (e.g., Mg:Ag or Al:Li); or a rare earth metal such as Yb or Er. In this embodiment, the first electrode 7023 serves as a cathode and the thickness of the first electrode 7023 is formed to a thickness enough to transmit light (preferably, approximately 5 nm to 30 nm). For example, an aluminum film with a thickness of 20 nm can be used as the first electrode 7023.

Alternatively, a light-transmitting conductive film and an aluminum film may be stacked and then selectively etched so as to form the light-transmitting conductive film 7027 and the first electrode 7023. In this case, the etching can be performed using the same mask, which is preferable.

The periphery of the first electrode 7023 is covered with a partition 7029. The partition 7029 can be formed using an organic resin film of polyimide, acrylic, polyamide, epoxy, or the like; an inorganic insulating film; or organic polysiloxane. It is particularly preferable that the partition 7029 be formed using a photosensitive material to have an opening over the first electrode 7023 so that a sidewall of the opening is formed as an inclined surface with continuous curvature. In the case where a photosensitive resin material is used for the partition 7029, a step of forming a resist mask can be omitted.

The EL layer 7024 which is formed over the first electrode 7023 and the partition 7029 may include at least a light-emitting layer and be formed using a single layer or a plurality of layers stacked. When the EL layer 7024 is formed using a plurality of layers, an electron-injection layer, an electron-transport layer, a light-emitting layer, a hole-transport layer, and a hole-injection layer are stacked in that order over the first electrode 7023 serving as a cathode. Note that not all of these layers need to be provided except for the light-emitting layer.

The stacking order is not limited to the above; the first electrode 7023 is used as an anode and a hole-injection layer, a hole-transport layer, a light-emitting layer, an electron-transport layer, and an electron-injection layer may be stacked in that order over the first electrode 7023. Note that when power consumption is contrasted, the first electrode 7023 is used as a cathode, and stacking an electron-injection layer, an electron-transport layer, a light-emitting layer, a hole-transport layer, and a hole-injection layer in that order over the cathode leads to low power consumption and thus is more preferable.

As the second electrode 7025 formed over the EL layer 7024, various materials can be used. For example, when the second electrode 7025 is used as an anode, it is preferable to use a material having a relatively high work function, such as a light-transmitting conductive material of ITO, IZO, or ZnO. In this embodiment, the second electrode 7025 is used as an anode, and an ITO film containing silicon oxide is formed.

The light-emitting element 7022 corresponds to a region where the EL layer 7024 including a light-emitting layer is sandwiched between the first electrode 7023 and the second electrode 7025. In the case of the element structure illustrated in FIG. 19B, light emitted from the light-emitting element 7022 is emitted from both the second electrode 7025 side and the first electrode 7023 side as indicated by arrows.

Note that in FIG. 19B, light emitted from the light-emitting element 7022 to the first electrode 7023 side passes through a color filter layer 7043, an insulating layer 7042, an oxide insulating layer 7041, a first gate insulating layer 7040, and a substrate 7020 to be emitted.

The color filter layer 7043 is formed with a droplet discharge method such as an inkjet method, a printing method, an etching method with the use of a photolithography technique, or the like.

The color filter layer 7043 is covered with an overcoat layer 7044, and also covered with a protective insulating layer 7045.

A contact hole which is formed in the protective insulating layer 7045, the overcoat layer 7044, the color filter layer 7043, the insulating layer 7042, and the oxide insulating layer 7041, and which reaches the drain electrode layer is provided in a portion which overlaps with the partition 7029.

Note that in the case where the light-emitting element having a dual emission structure is used and full color display is performed on both display surfaces, light from the second electrode 7025 side does not pass through the color filter layer 7043; therefore, a sealing substrate provided with another color filter layer is preferably provided on the second electrode 7025.

Next, a light-emitting element having a top emission structure will be described with reference to FIG. 19C.

FIG. 19C is a cross-sectional view of a pixel in which the driver transistor 7001 is an n-channel transistor and light generated in a light-emitting element 7002 is emitted to pass through a second electrode 7005. In FIG. 19C, a first electrode 7003 of the light-emitting element 7002 is formed to be electrically connected to the drain electrode layer of the driver transistor 7001, and an EL layer 7004 and the second electrode 7005 are stacked in that order over the first electrode 7003.

The first electrode 7003 can be formed using any of a variety of materials; for example when the first electrode 7003 is used as a cathode, it is preferable to use a material having a relatively low work function, such as an alkali metal such as Li or Cs, an alkaline-earth metal such as Mg, Ca, or Sr, an alloy containing any of these (Mg:Ag, Al:Li, or the like), or a rare-earth metal such as Yb or Er.

The periphery of the first electrode 7003 is covered with a partition 7009. The partition 7009 can be formed using an organic resin film of polyimide, acrylic, polyamide, epoxy, or the like; an inorganic insulating film; or organic polysiloxane. It is particularly preferable that the partition 7009 be formed using a photosensitive resin material to have an opening over the first electrode 7003 so that a sidewall of the opening is formed as an inclined surface with continuous curvature. In the case where a photosensitive resin material is used for the partition 7009, a step of forming a resist mask can be omitted.

The EL layer 7004 which is formed over the first electrode 7003 and the partition 7009 may include at least a light-emitting layer and be formed using a single layer or a plurality of layers stacked. When the EL layer 7004 is formed using a plurality of layers, the EL layer 7004 is formed by stacking an electron-injection layer, an electron-transport layer, a light-emitting layer, a hole-transport layer, and a hole-injection layer in that order over the first electrode 7003. Note that not all of these layers need to be provided except for the light-emitting layer.

The stacking order is not limited to the above stacking order, and a hole-injection layer, a hole-transport layer, a light-emitting layer, an electron-transport layer, and an electron-injection layer may be stacked in that order over the first electrode 7003.

In FIG. 19C, a hole-injection layer, a hole-transport layer, a light-emitting layer, an electron-transport layer, and an electron-injection layer are stacked in that order over a laminate film in which a Ti film, an aluminum film, and a Ti film are stacked in that order, and thereover, a stacked layer of a Mg:Ag alloy thin film and ITO is formed.

Note that when the transistor 7001 is an n-channel transistor, it is preferable that an electron-injection layer, an electron-transport layer, a light-emitting layer, a hole-transport layer, and a hole-injection layer be stacked in that order over the first electrode 7003 because voltage rise in the driver circuit can be suppressed and power consumption can be decreased.

The second electrode 7005 is made of a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added.

The light-emitting element 7002 corresponds to a region where the EL layer 7004 including a light-emitting layer is sandwiched between the first electrode 7003 and the second electrode 7005. In the case of the pixel illustrated in FIG. 19C, light is emitted from the light-emitting element 7002 to the second electrode 7005 side as indicated by arrows.

In FIG. 19C, the drain electrode layer of the transistor 7001 is electrically connected to the first electrode 7003 through a contact hole formed in an oxide insulating layer 7051, a protective insulating layer 7052, and an insulating layer 7055. A planarizing insulating layer 7053 can be formed using a resin material such as polyimide, acrylic, benzocyclobutene, polyamide, or epoxy. In addition to such resin materials, it is also possible to use a low-dielectric constant material (low-k material), a siloxane-based resin, phosphosilicate glass (PSG), borophosphosilicate glass (BPSG), or the like. Note that the planarizing insulating layer 7053 may be formed by stacking a plurality of insulating films formed of these materials. There is no particular limitation on the method for forming the planarizing insulating layer 7053, and the planarizing insulating layer 7053 can be formed, depending on the material, with a method such as a sputtering method, an SOG method, spin coating, dipping, spray coating, or a droplet discharge method (e.g., an ink-jet method, screen printing, or offset printing), or with a tool (equipment) such as a doctor knife, a roll coater, a curtain coater, or a knife coater.

The partition 7009 is provided so as to insulate the first electrode 7003 and a first electrode of an adjacent pixel. The partition 7009 can be formed using an organic resin film of polyimide, acrylic, polyamide, epoxy, or the like; an inorganic insulating film; or organic polysiloxane. It is particularly preferable that the partition 7009 be formed using a photosensitive resin material to have an opening over the first electrode 7003 so that a sidewall of the opening is formed as an inclined surface with continuous curvature. In the case where a photosensitive resin material is used for the partition 7009, a step of forming a resist mask can be omitted.

In the structure illustrated in FIG. 19C, for performing full-color display, the light-emitting element 7002, one of light-emitting elements adjacent to the light-emitting element 7002, and the other of the light-emitting elements are, for example, a green light-emitting element, a red light-emitting element, and a blue light-emitting element, respectively. Alternatively, a light-emitting display device capable of full color display may be manufactured using four kinds of light-emitting elements which include a white light-emitting element in addition to three kinds of light-emitting elements.

In the structure of FIG. 19C, a light-emitting display device capable of full color display may be manufactured in such a way that all of a plurality of light-emitting elements which is arranged is white light-emitting elements and a sealing substrate having a color filter or the like is arranged on the light-emitting element 7002. A material which exhibits a single color such as white is formed and combined with a color filter or a color conversion layer, whereby full color display can be performed.

Needless to say, display of monochromatic light can also be performed. For example, a lighting system may be formed with the use of white light emission, or an area-color light-emitting device may be formed with the use of a single color light emission.

If necessary, an optical film such as a polarizing film including a circularly polarizing plate may be provided.

Note that, although the organic EL elements are described here as the light-emitting elements, an inorganic EL element can also be provided as a light-emitting element.

Note that the example is described in which a transistor (a driver transistor) which controls the driving of a light-emitting element is electrically connected to the light-emitting element; however, a structure may be employed in which a transistor for current control is connected between the driver transistor and the light-emitting element.

The structure of the semiconductor device described in this embodiment is not limited to those illustrated in FIGS. 19A to 19C and can be modified in various ways based on the spirit of techniques of one embodiment of the present invention.

Figure 22A:
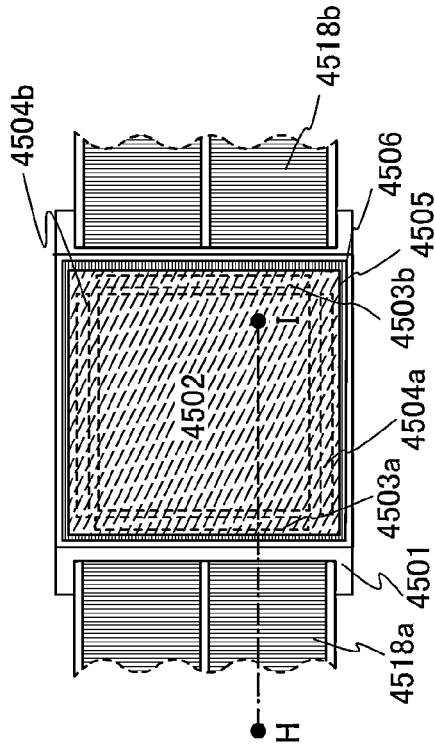
FIGS. 22A and 22B are a plan view and a cross-sectional view illustrating one embodiment of the present invention.
Figure 22B:
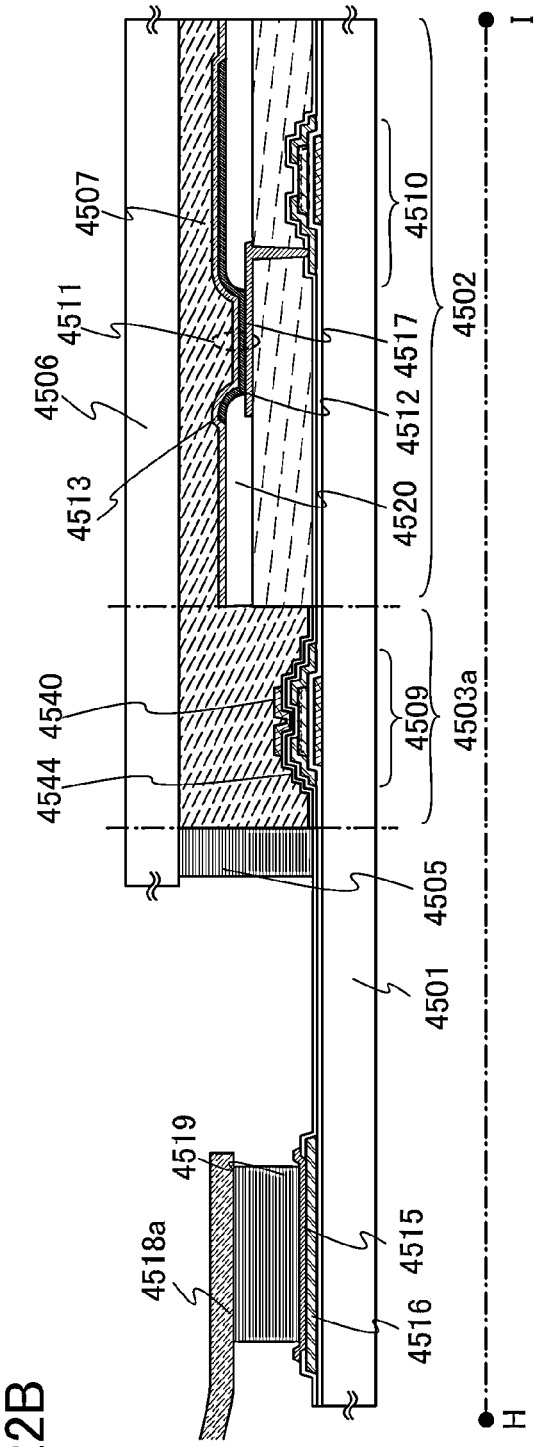

Next, the appearance and the cross section of a light-emitting display panel (also referred to as a light-emitting panel) which corresponds to one embodiment of a semiconductor device to which the transistor described in Embodiments 1 and 2 is applied are described with reference to FIGS. 22A and 22B. FIG. 22A is a top view of a panel in which a transistor and a light-emitting element are sealed between a first substrate and a second substrate with a sealant. FIG. 22B is a cross-sectional view taken along line H-I of FIG. 22A.

A sealant 4505 is provided so as to surround a pixel portion 4502, signal line driver circuits 4503*a* and 4503*b*, and scan line driver circuits 4504*a* and 4504*b* which are provided over a first substrate 4501. In addition, a second substrate 4506 is provided over the pixel portion 4502, the signal line driver circuits 4503*a* and 4503*b*, and the scan line driver circuits 4504*a* and 4504*b*. Accordingly, the pixel portion 4502, the signal line driver circuits 4503*a* and 4503*b*, and the scan line driver circuits 4504*a* and 4504*b* are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air, in this manner.

The pixel portion 4502, the signal line driver circuits 4503*a* and 4503*b*, and the scan line driver circuits 4504*a* and 4504*b* formed over the first substrate 4501 each include a plurality of transistors, and a transistor 4510 included in the pixel portion 4502 and a transistor 4509 included in the signal line driver circuit 4503*a* are illustrated as an example in FIG. 22B.

For each of the transistors 4509 and 4510, a highly reliable transistor including an In—Ga—Zn—O-based film as an oxide semiconductor layer as described in Embodiments 1 and 2 can be applied. In this embodiment, the transistors 4509 and 4510 are n-channel transistors.

Over an insulating layer 4544, a conductive layer 4540 is provided in a position overlapping with a channel formation region of an oxide semiconductor layer of the transistor 4509 used for a driver circuit. By providing the conductive layer 4540 so as to overlap with the channel formation region of the oxide semiconductor layer, the amount of change in the threshold voltage of the transistor 4509 between before and after the BT test can be reduced. Further, potential of the conductive layer 4540 may be the same as or different from that of a gate electrode layer of the transistor 4509. The conductive layer 4540 can function also as a second gate electrode layer. Alternatively, the potential of the conductive layer 4540 may be GND or 0 V, or the conductive layer 4540 may be in a floating state.

Moreover, reference numeral 4511 denotes a light-emitting element. A first electrode layer 4517 which is a pixel electrode included in the light-emitting element 4511 is electrically connected to a source or drain electrode layer of the transistor 4510. Note that a structure of the light-emitting element 4511 is a layered structure of the first electrode layer 4517, an electroluminescent layer 4512, and a second electrode layer 4513, but there is no particular limitation on the structure. The structure of the light-emitting element 4511 can be changed as appropriate depending on the direction in which light is extracted from the light-emitting element 4511, or the like.

A partition 4520 is formed using an organic resin film, an inorganic insulating film, or organic polysiloxane. It is particularly preferable that the partition 4520 be formed using a photosensitive material and an opening be formed over the first electrode layer 4517 so that a sidewall of the opening is formed as an inclined surface with continuous curvature.

The electroluminescent layer 4512 may be formed with a single layer or a plurality of layers stacked.

A protective film may be formed over the second electrode layer 4513 and the partition 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

In addition, a variety of signals and potential are supplied to the signal line driver circuits 4503*a* and 4503*b*, the scan line driver circuits 4504*a* and 4504*b*, or the pixel portion 4502 from FPCs 4518*a* and 4518*b*.

In this embodiment, a connection terminal electrode 4515 is formed using the same conductive film that is used for the first electrode layer 4517 included in the light-emitting element 4511. A terminal electrode 4516 is formed using the same conductive film that is used for the source and drain electrode layers included in the transistors 4509 and 4510.

The connection terminal electrode 4515 is electrically connected to a terminal included in the FPC 4518*a* via an anisotropic conductive film 4519.

The second substrate 4506 located in the direction in which light is extracted from the light-emitting element 4511 should have a light-transmitting property. In that case, a light-transmitting material such as a glass plate, a plastic plate, a polyester film, or an acrylic film is used for the second substrate 4506.

As the filler 4507, an ultraviolet curable resin or a thermosetting resin can be used, in addition to an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. In this embodiment, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503*a* and 4503*b* and the scan line driver circuits 4504*a* and 4504*b* may be mounted as driver circuits formed using a single crystal semiconductor film or a polycrystalline semiconductor film over a substrate separately prepared. In addition, only the signal line driver circuits or part thereof, or the scan line driver circuits or part thereof may be separately formed and mounted. This embodiment is not limited to the structure illustrated in FIGS. 22A and 22B.

Through the above process, a highly reliable light-emitting display device (display panel) as a semiconductor device can be manufactured.

Note that the structure described in this embodiment can be combined with any of the structures described in other embodiments, as appropriate.

Embodiment 7

A semiconductor device to which the transistor described in any of Embodiment 1 and Embodiment 2 is applied can be used as electronic paper. Electronic paper can be used for electronic devices of a variety of fields as long as they can display data. For example, electronic paper can be applied to an e-book reader (electronic book), a poster, an advertisement in a vehicle such as a train, or displays of various cards such as a credit card. Examples of the electronic devices are illustrated in FIGS. 11A and 11B and FIG. 12.

Figure 11A:
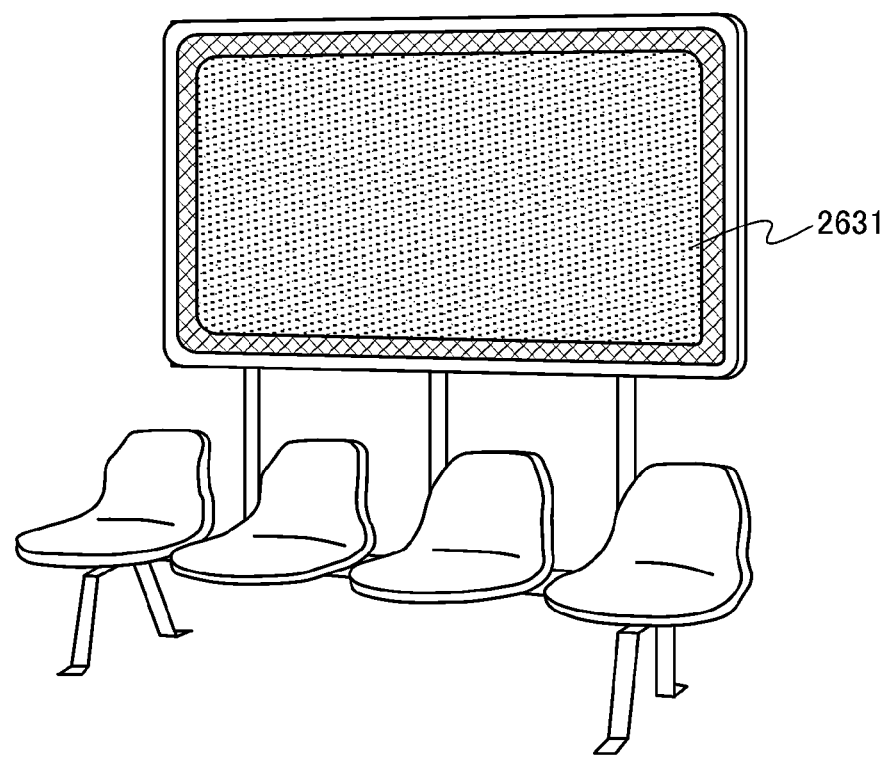
FIGS. 11A and 11B are diagrams each illustrating an example of application of electronic paper.

FIG. 11A illustrates a poster 2631 using electronic paper. In the case where an advertising medium is printed paper, the advertisement is replaced by hands; however, by using the electronic paper, the advertising display can be changed in a short time. Furthermore, stable images can be obtained without display defects. Note that the poster may have a configuration capable of wirelessly transmitting and receiving data.

Figure 11B:
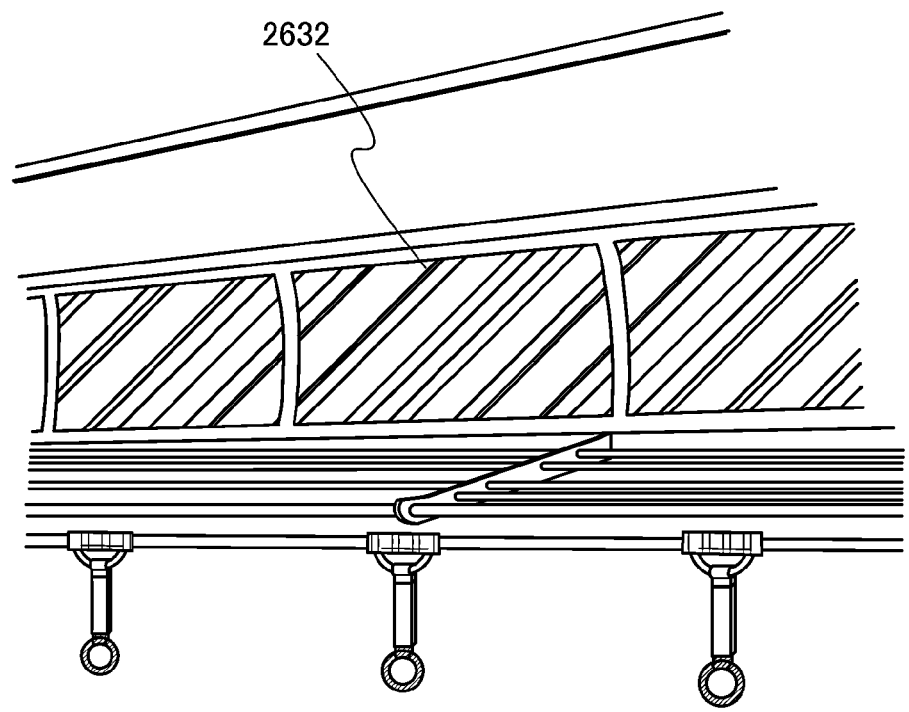

FIG. 11B illustrates an advertisement 2632 in a vehicle such as a train. In the case where an advertising medium is paper, the advertisement is replaced by hand, but in the case where it is electronic paper, much manpower is not needed and the advertising display can be changed in a short time. Furthermore, stable images can be obtained without display defects. Note that the advertisement in a vehicle may have a configuration capable of wirelessly transmitting and receiving data.

Figure 12:
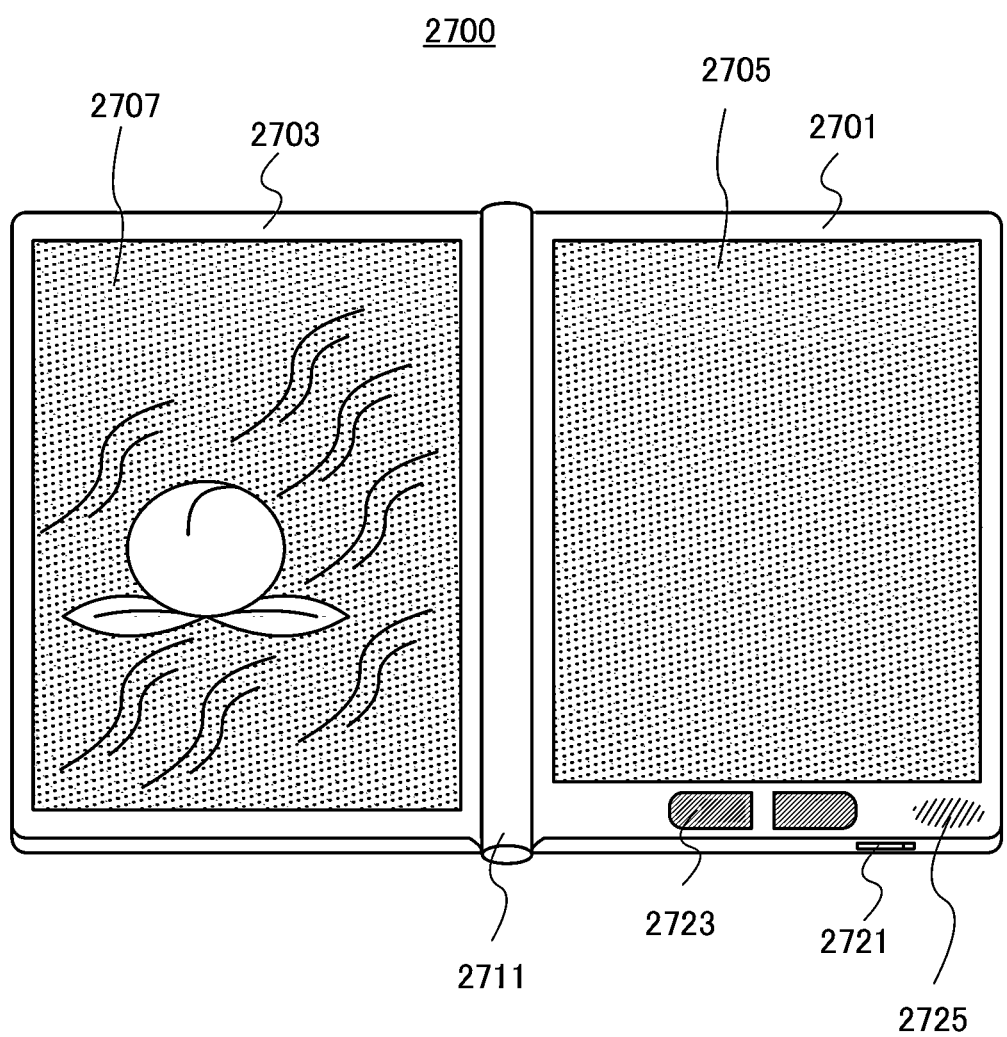
FIG. 12 is an external view illustrating an example of an e-book reader.

FIG. 12 illustrates an example of an e-book reader. For example, an e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the structure where different images are displayed in different display portions, for example, the right display portion (the display portion 2705 in FIG. 12) can display text and the left display portion (the display portion 2707 in FIG. 12) can display an image.

In the example illustrated in FIG. 12, the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

Note that the structure described in this embodiment can be combined with any of the structures described in other embodiments, as appropriate.

Embodiment 8

A semiconductor device using the transistor described in any of Embodiments 1 and 2 can be applied to a variety of electronic appliances (including a game machine). Examples of electronic devices are a television device (also referred to as a television or a television receiver), a monitor of a computer or the like, a camera such as a digital camera or a digital video camera, a digital photo frame, a mobile phone (also referred to as a mobile phone handset or a mobile phone device), a portable game console, a portable information terminal, an audio reproducing device, a large-sized game machine such as a pachinko machine, and the like.

Figure 23A:
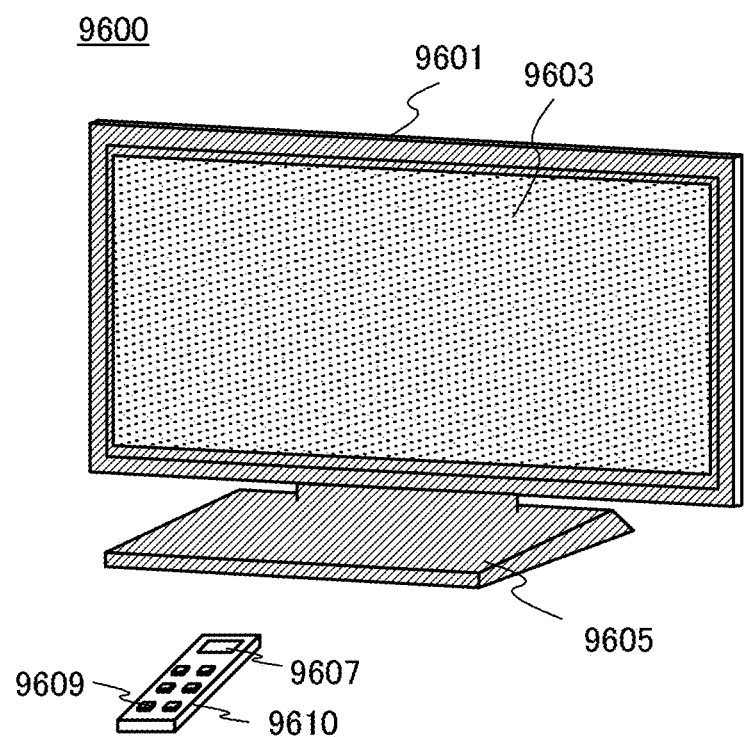
FIGS. 23A and 23B are external views illustrating examples of a television device and a digital photo frame, respectively.

FIG. 23A illustrates an example of a television device. In a television device 9600, a display portion 9603 is incorporated in a housing 9601. The display portion 9603 can display images. Here, the housing 9601 is supported by a stand 9605.

The television device 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television device 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 23B:
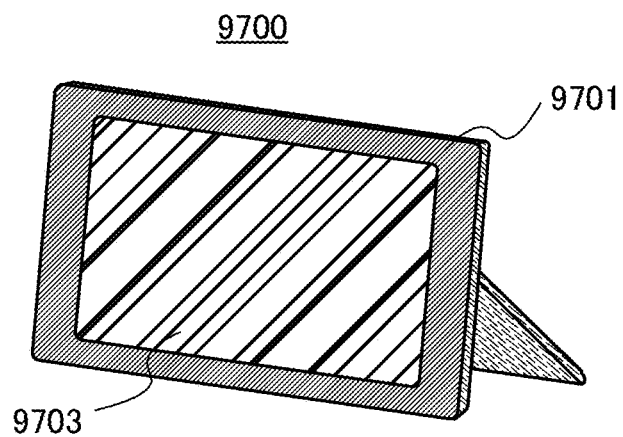

FIG. 23B illustrates an example of a digital photo frame. For example, in a digital photo frame 9700, a display portion 9703 is incorporated in a housing 9701. The display portion 9703 can display a variety of images. For example, the display portion 9703 can display data of an image taken with a digital camera or the like and function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 24A:
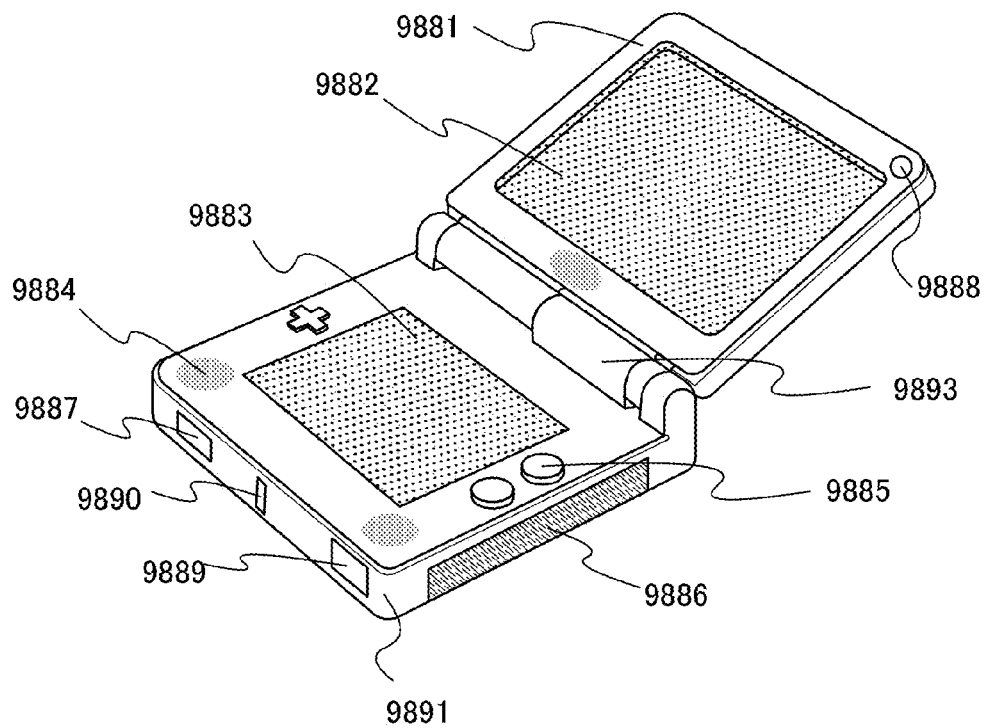
FIGS. 24A and 24B are external views illustrating examples of game machines.

FIG. 24A is a portable game machine and is constituted by two housings of a housing 9881 and a housing 9891 which are connected with a joint portion 9893 so that the portable game machine can be opened or folded. A display portion 9882 and a display portion 9883 are incorporated in the housing 9881 and the housing 9891, respectively. In addition, the portable game machine illustrated in FIG. 24A is provided with a speaker portion 9884, a recording medium insert portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, odor, or infrared ray), and a microphone 9889), and the like. It is needless to say that the structure of the portable game machine is not limited to the above and other structures provided with at least a semiconductor device of the present invention may be employed. The portable game machine may include other accessories, as appropriate. The portable game machine illustrated in FIG. 24A has a function of reading a program or data stored in the recording medium to display it on the display portion, and a function of sharing information with another portable game machine by wireless communication. Note that a function of the portable game machine illustrated in FIG. 24A is not limited to the above, and the portable game machine can have a variety of functions.

Figure 24B:
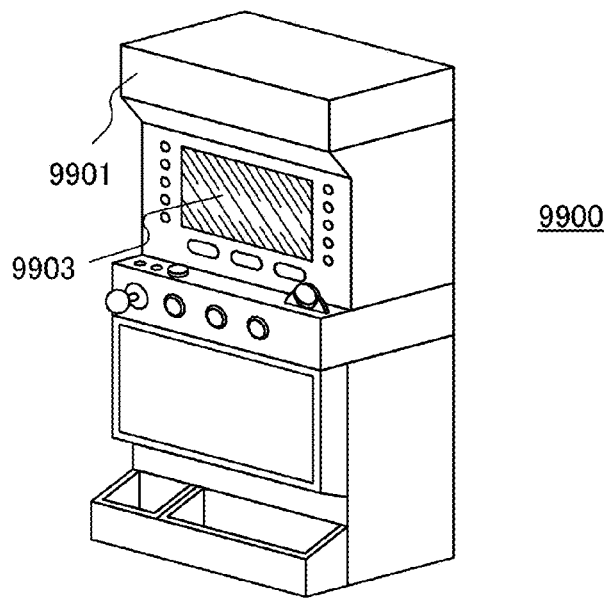

FIG. 24B illustrates an example of a slot machine which is a large-sized game machine. In a slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above and other structures provided with at least a semiconductor device of the present invention may be employed. The slot machine 9900 may include other accessories, as appropriate.

Figure 25A:
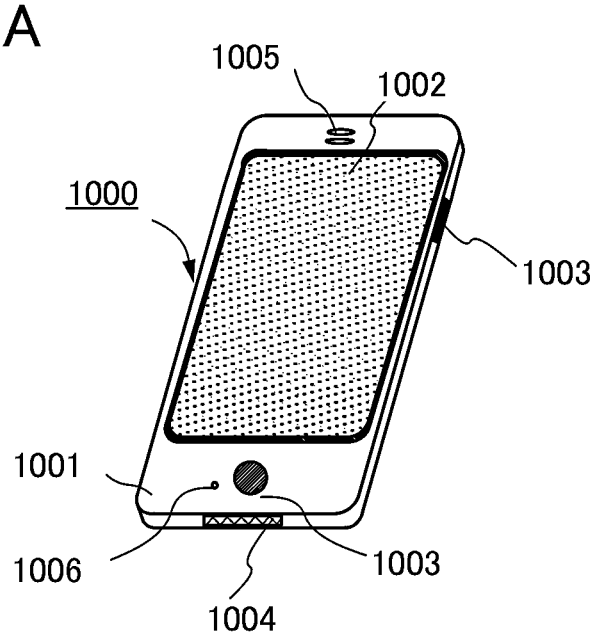
FIGS. 25A and 25B are external views illustrating examples of mobile phones.

FIG. 25A illustrates an example of a mobile phone. A mobile phone 1000 includes a display portion 1002 incorporated in a housing 1001, an operation button 1003, an external connection port 1004, a speaker 1005, a microphone 1006, and the like.

When the display portion 1002 illustrated in FIG. 25A is touched with a finger or the like, data can be input into the mobile phone 1000. Furthermore, operations such as making calls and composing mails can be performed by touching the display portion 1002 with a finger or the like.

There are mainly three screen modes of the display portion 1002. The first mode is a display mode mainly for displaying images. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1002 so that text displayed on a screen can be input. In that case, it is preferable to display a keyboard or number buttons on almost all area of the screen of the display portion 1002.

When a detection device including a sensor for detecting inclination, such as a gyroscope or an acceleration sensor, is provided inside the mobile phone 1000, display in the screen of the display portion 1002 can be automatically switched by determining the installation direction of the mobile phone 1000 (whether the mobile phone 1000 is placed horizontally or vertically for a landscape mode or a portrait mode).

The screen modes are switched by touching the display portion 1002 or operating the operation button 1003 of the housing 1001. Alternatively, the screen modes may be switched depending on the kind of the image displayed on the display portion 1002. For example, when a signal of an image displayed on the display portion is a signal of moving image data, the screen mode is switched to the display mode. When the signal is a signal of text data, the screen mode is switched to the input mode.

Further, in the input mode, when input by touching the display portion 1002 is not performed for a certain period while a signal detected by the optical sensor in the display portion 1002 is detected, the screen mode may be controlled so as to be switched from the input mode to the display mode.

The display portion 1002 may function as an image sensor. For example, an image of a palm print, a fingerprint, or the like is taken when the display portion 1002 is touched with a palm or a finger, whereby personal identification can be performed. Further, by providing a backlight or a sensing light source which emits a near-infrared light in the display portion, an image of a finger vein, a palm vein, or the like can be taken.

Figure 25B:
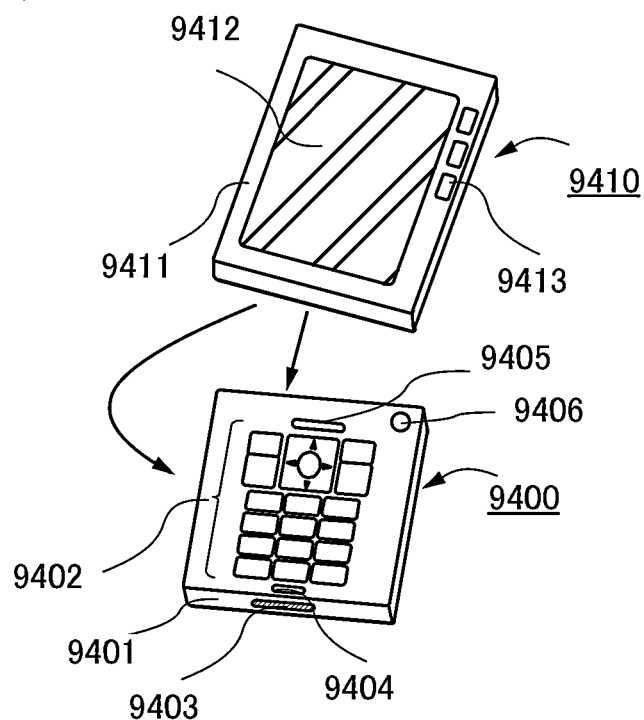

FIG. 25B also illustrates an example of a mobile phone. The mobile phone in FIG. 25B includes an a display device 9410 in which a display portion 9412 and an operation button 9413 are included in a housing 9411, and a communication device 9400 in which operation buttons 9402, an external input terminal 9403, a microphone 9404, a speaker 9405, and a light-emitting portion 9406 that emits light when a phone call is received are included in a housing 9401. The display device 9410 having a display function can be detached from or attached to the communication device 9400 having a telephone function in two directions as indicated by arrows. Thus, a short axis of the display device 9410 can be attached to a short axis of the communication device 9400, and a long axis of the display device 9410 can be attached to a long axis of the communication device 9400. In addition, when only the display function is needed, the display device 9410 can be detached from the communication device 9400 and used alone. Images or input information can be transmitted or received by wireless or wire communication between the communication device 9400 and the display device 9410, each of which has a rechargeable battery.

Note that the structure described in this embodiment can be combined with any of the structures described in other embodiments, as appropriate.

Embodiment 9

A phenomenon occurs in which oxygen moves when an oxide semiconductor layer is in contact with a metal layer or an oxide insulating layer. In this embodiment, differences between an amorphous oxide semiconductor layer and a crystalline oxide semiconductor layer are described using scientific computation on the phenomenon.

Figure 33:
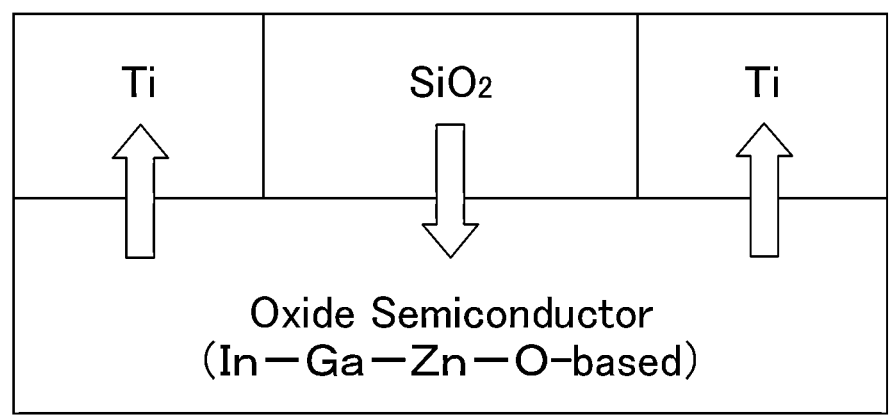
FIG. 33 is a diagram briefly illustrating scientific computing.

FIG. 33 is a schematic view of a state where an oxide semiconductor layer is in contact with a metal layer to serve as a source electrode and a drain electrode and the oxide insulating layer in a structure of a transistor which is one embodiment of the present invention. The directions of arrows indicate direction of movement of oxygen in a state where these are in contact with each other or a state where these are heated.

When oxygen vacancies occur, an i-type oxide semiconductor layer has n-type conductivity, whereas when oxygen is oversupplied, an n-type oxide semiconductor layer caused by oxygen vacancies becomes an i-type oxide semiconductor layer. This effect is utilized in an actual device process, and in the oxide semiconductor layer which is in contact with the metal layer to serve as a source electrode and a drain electrode, oxygen is pulled to the metal side, and oxygen vacancies occur in part of a region, which is in contact with the metal layer (in the case of a small thickness, in an entire region in the film thickness direction), whereby the oxide semiconductor layer becomes an n-type oxide semiconductor layer and favorable contact with the metal layer can be obtained. In addition, oxygen is supplied from the oxide insulating layer to the oxide semiconductor layer in contact with the oxide insulating layer, and part of a region of the oxide semiconductor layer, which is in contact with the oxide insulating layer (in the case of a small thickness, in the entire region in the film thickness direction), contains excessive oxygen, to be an i-type region, whereby the oxide semiconductor layer becomes an i-type oxide semiconductor layer and functions as a channel formation region of a transistor.

In one embodiment of the present invention, in a region where the oxide semiconductor layer is in contact with the metal layer to serve as a source electrode and a drain electrode and the oxide insulating layer, a crystalline region including a needle crystal group, and differences between an amorphous state and a state where oxygen moves were examined by scientific computing.

Figure 34A:
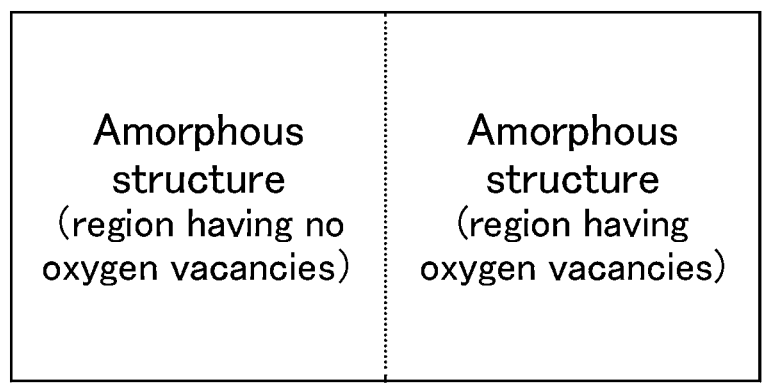
FIGS. 34A and 34B are diagrams briefly illustrating scientific computing.
Figure 34B:
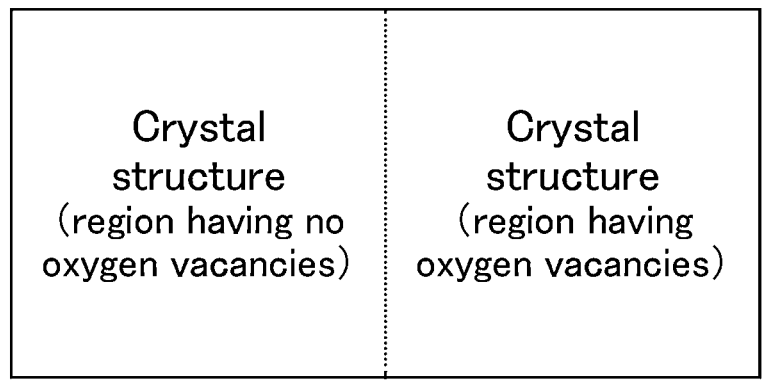

Models used for scientific computing have an In—Ga—Zn—O-based amorphous structure and an In—Ga—Zn—O-based crystal structure. In each of the models, one of regions in a longitudinal direction of a rectangular solid was deficient in oxygen by 10% as compared to the other region (see FIGS. 34A and 34B). The calculation is to compare distribution of oxygen in the In—Ga—Zn—O-based amorphous structure and the In—Ga—Zn—O-based crystal structure after ten nanoseconds under an accelerated condition of 650° C. Respective conditions are shown in Table 1 and Table 2.

TABLE 1

| | condition of structure |
|---|---|
| number of atoms | 317 atoms (192 oxygen) |
| lattice constant | a = b = 1.3196 nm, c = 2.6101 nm, $\alpha = \beta = 90°, \gamma = 120°$ |
| density | 6.23 g/cm$^3$ |

TABLE 2

| | calculation condition |
|---|---|
| ensemble | NTV (number of atoms, temperature, fixed volume) |
| temperature | 923 K |
| step size of time | 0.2 fs |
| total calculation time | 10 ns |
| potential | Born-Mayer-Huggins type is applied to Metal-Oxygen and Oxygen-Oxygen |
| charge | In: +3, Ga: +3, Zn: +2, O: −2 |

Figure 35A:
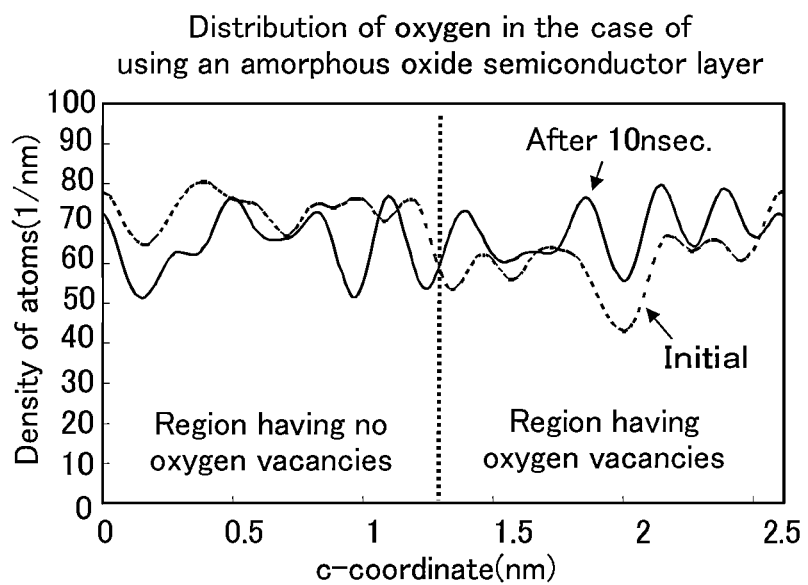
FIGS. 35A and 35B are diagrams illustrating scientific computation.
Figure 35B:
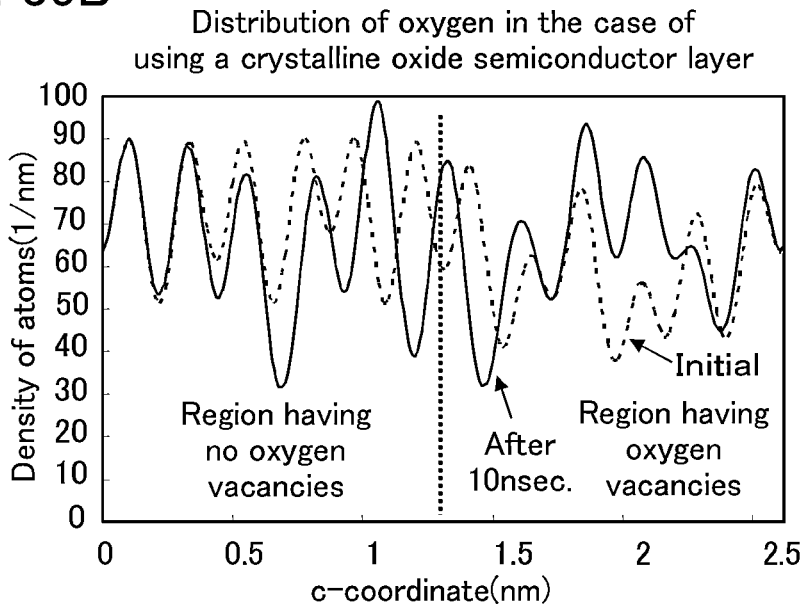

As the calculation results under the above conditions, distribution of oxygen in the case of using an amorphous oxide semiconductor layer is shown in FIG. 35A, and distribution of oxygen in the case of using a crystalline oxide semiconductor layer is shown in FIG. 35B. A dotted line indicates an initial state (Initial), and a solid line indicates a result (after ten nanoseconds). It is found that oxygen moves regardless of whether the amorphous oxide semiconductor layer or the crystalline oxide semiconductor layer is used.

The increasing rates of oxygen atoms between before and after calculation in a region having oxygen vacancies were 15.9% in the case of the amorphous oxide semiconductor layer and 11.3% in the case of the crystalline oxide semiconductor layer. That is, oxygen in the amorphous oxide semiconductor layer is more likely to move than oxygen in the crystalline oxide semiconductor layer, resulting in easily compensating for the oxygen vacancies. In other words, oxygen in the crystalline oxide semiconductor layer is relatively less likely to move than oxygen in the amorphous oxide semiconductor layer.

Therefore, it is also found that oxygen moves in the oxide semiconductor layer in one embodiment of the present invention having the crystalline region including a needle crystal group, in a manner similar to that of the case of the amorphous oxide semiconductor layer. It is also found that the crystalline region including a needle crystal group has an effect in which elimination of oxygen from the oxide semiconductor layer is suppressed because oxygen is relatively less likely to move in the crystalline oxide semiconductor layer than in the amorphous oxide semiconductor layer.

Example 1

In this example, a state of the oxide semiconductor film which is subjected to dehydration or dehydrogenation at high temperature in a short time with an RTA method was analyzed with a TEM analysis, a TEM-EDX analysis, an X-ray diffraction analysis, and an SIMS analysis, and the results are described.

Samples used for analysis are In—Ga—Zn—O-based films each formed in accordance with Embodiment 2 with the use of an oxide semiconductor target whose molar ratio of $In_2O_3$ to $Ga_2O_3$ to ZnO is 1:1:1. There are three kinds of samples: a sample A, and a sample B and a sample C which are comparative examples. The sample A is formed in such a manner that a heating step is performed in a nitrogen gas atmosphere at 650° C. for six minutes using an RTA apparatus. The sample B is formed in such a manner that a heating step is performed in a nitrogen gas atmosphere at 450° C. for one hour using an electric furnace, and the sample C (as-depo) is in a non-heating state.

Figure 26A:
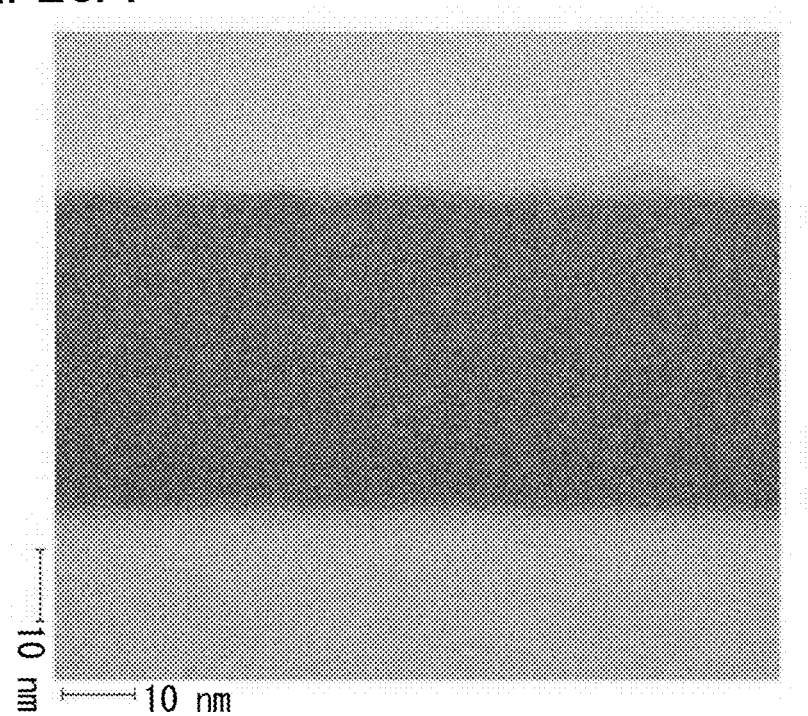
FIGS. 26A and 26B are TEM photographs of a cross section of an oxide semiconductor layer.
Figure 26B:
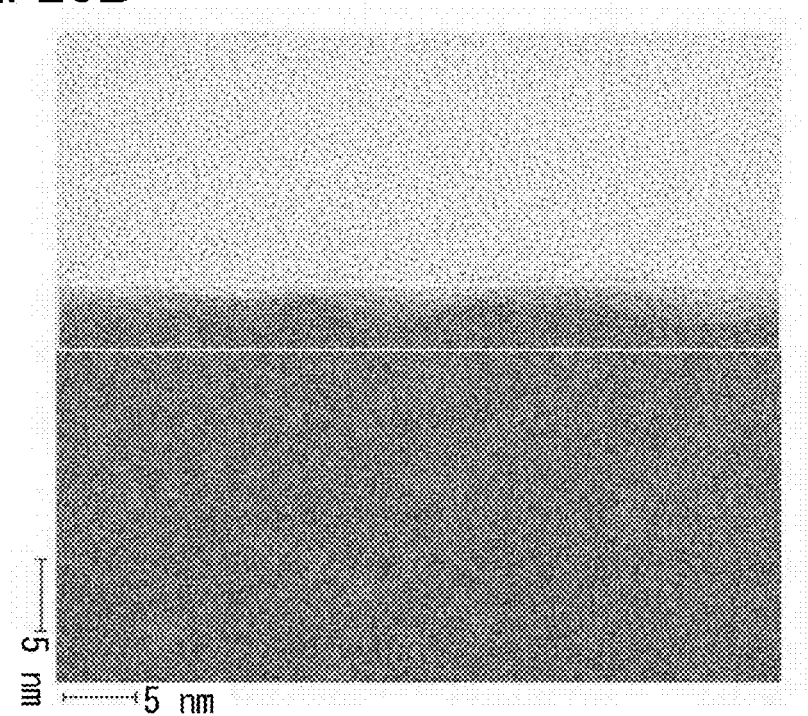
Figure 27A:
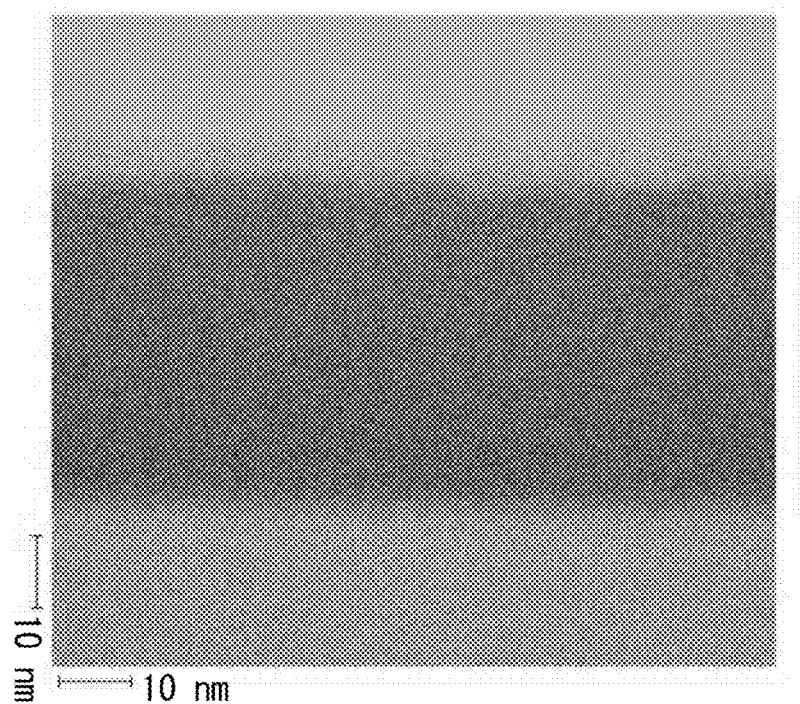
FIGS. 27A and 27B are TEM photographs of a cross section of an oxide semiconductor layer.
Figure 27B:
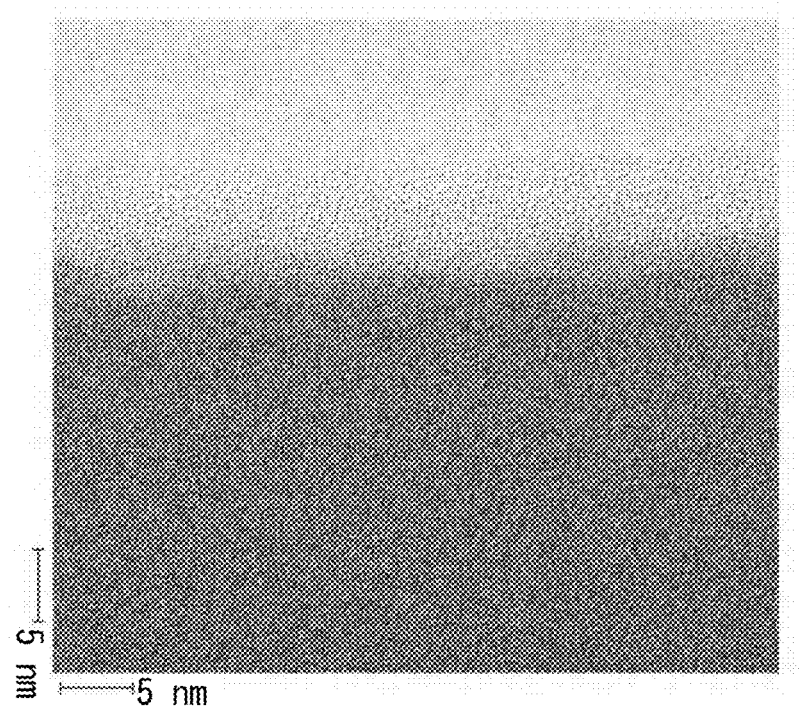
Figure 28A:
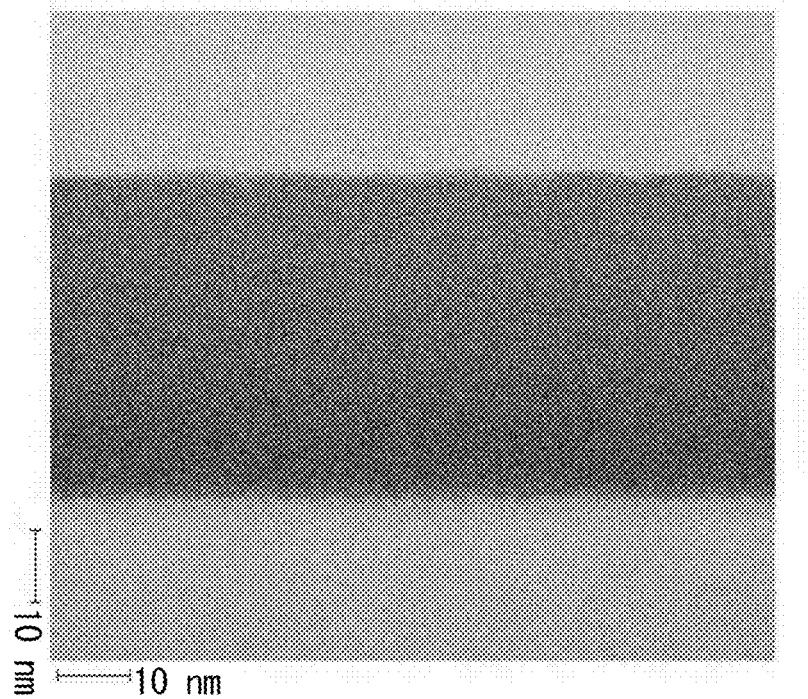
FIGS. 28A and 28B are TEM photographs of a cross section of an oxide semiconductor layer.
Figure 28B:
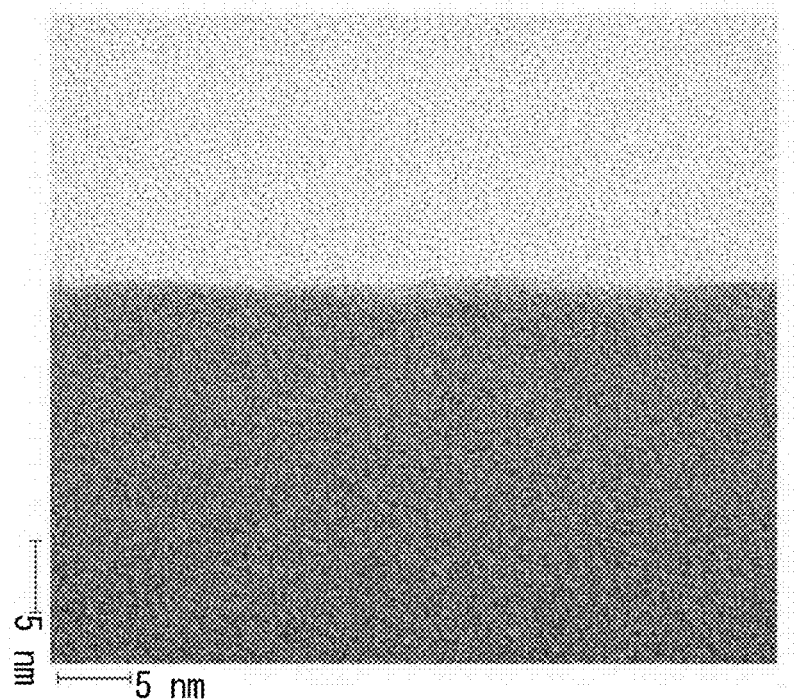

First, a cross section of a crystalline state of each sample was observed at an acceleration voltage of 300 kV using a high resolution transmission electron microscope ("H9000-NAR" manufactured by Hitachi, Ltd.: TEM) to examine the crystalline state of each sample. Cross-sectional photographs of the sample A, the sample B, and the sample C are illustrated in FIGS. 26A and 26B, FIGS. 27A and 27B, and FIGS. 28A and 28B, respectively. Note that FIG. 26A, FIG. 27A, and FIG. 28A are low magnification photographs (two million-fold magnification) and FIG. 26B, FIG. 27B, and FIG. 28B are high magnification photographs (four million-fold magnification).

A continuous lattice image was observed in a superficial portion of a cross section of the sample A which is heated at 650° C. for six minutes with an RTA method in FIGS. 26A and 26B. In particular, in the high magnification photograph of FIG. 26B, a clear lattice image is observed in a region surrounded by a white frame, and the existence of microcrystals whose crystal axes are aligned is indicated. Accordingly, it is found that the superficial portion of the In—Ga—Zn—O-based film is crystallized by performing heating at 650° C. for as short as approximately six minutes with an RTA method and a crystalline region is provided. Note that in a region except for the superficial portion, a clear continuous lattice image is not observed and a state where microcrystalline particles exist here and there in an amorphous region is found. The microcrystals are so-called nanocrystals each with a grain size of greater than or equal to 2 nm and less than or equal to 4 nm.

On the other hand, a clear lattice image was not observed in any region in a thickness direction from the cross-sectional photographs of FIGS. 27A and 27B (the sample B) and FIGS. 28A and 28B (the sample C), so that it is found that the sample B and the sample C are amorphous.

Figure 29A:
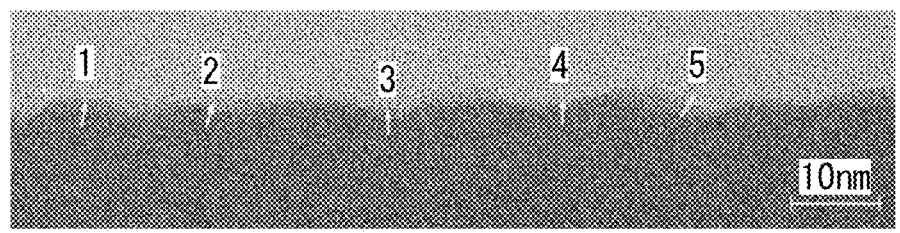
FIGS. 29A and 29B are a TEM photograph of a cross section of an oxide semiconductor layer and an electron diffraction pattern, respectively.
Figure 29B:
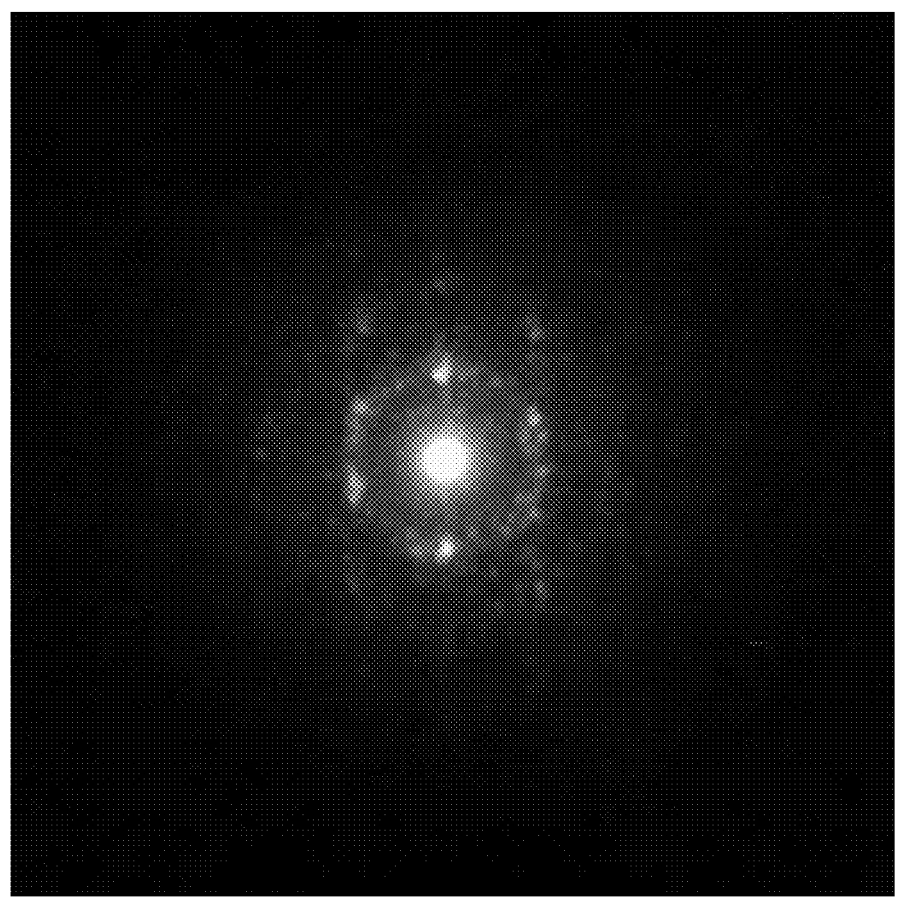

A macrophotography of the superficial portion of the sample A which is heated at 650° C. for six minutes with an RTA method, and an electron diffraction pattern of a crystalline region are shown in FIGS. 29A and 29B, respectively. Directional arrows 1 to 5 indicating directions where lattice images are aligned are illustrated in the macrophotography of the superficial portion (FIG. 29A), and needle crystals are grown in a direction perpendicular to a surface of the film. The electron diffraction pattern shown in FIG. 29B is observed at a position indicated by the arrow 3, and a c-axis orientation is found. As a result of comparison between this electron diffraction pattern and a known lattice constant, it became clear that a crystal structure is $In_2Ga_2ZnO_7$ illustrated in FIG. 36.

Figure 36:
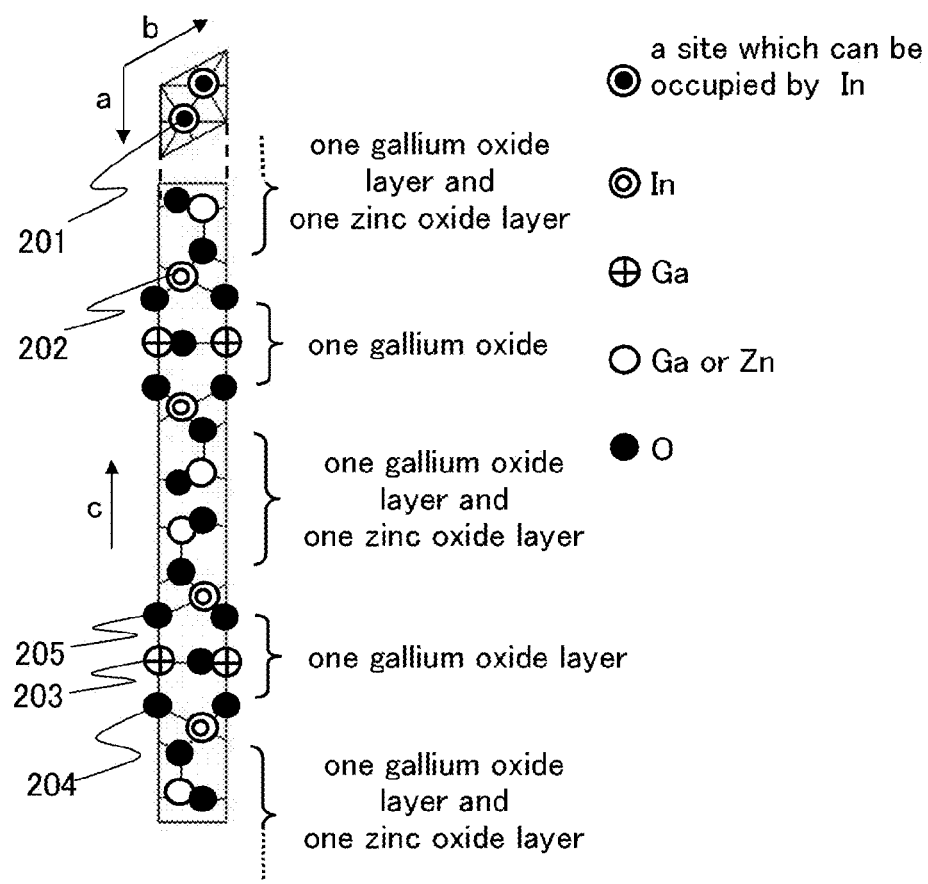
FIG. 36 is a diagram illustrating a crystal structure of an oxide semiconductor.

A top view and a side view of a hexagonal-system layered compound of $In_2Ga_2ZnO_7$ are illustrated in FIG. 36. The top view is a view of a plan parallel to an a-axis and a b-axis, and the side view is a view of a plan parallel to a c-axis. Here, the c-axis is perpendicular to the a-axis and the b-axis, and the angle between the a-axis and the b-axis is 120 degrees. In FIG. 36, a site 201 which can be occupied by an In atom is illustrated in the top view, and an In atom 202, a Ga atom 203, a Ga or Zn atom 204, and an O atom 205 are illustrated in the side view. As illustrated in FIG. 36, $In_2Ga_2ZnO_7$ has a structure in which one gallium oxide layer between In oxide layers and two oxide layers, which are between In oxide layers, including one gallium oxide layer and one zinc oxide layer are alternatively provided between In oxide layers stacked.

Figure 30:
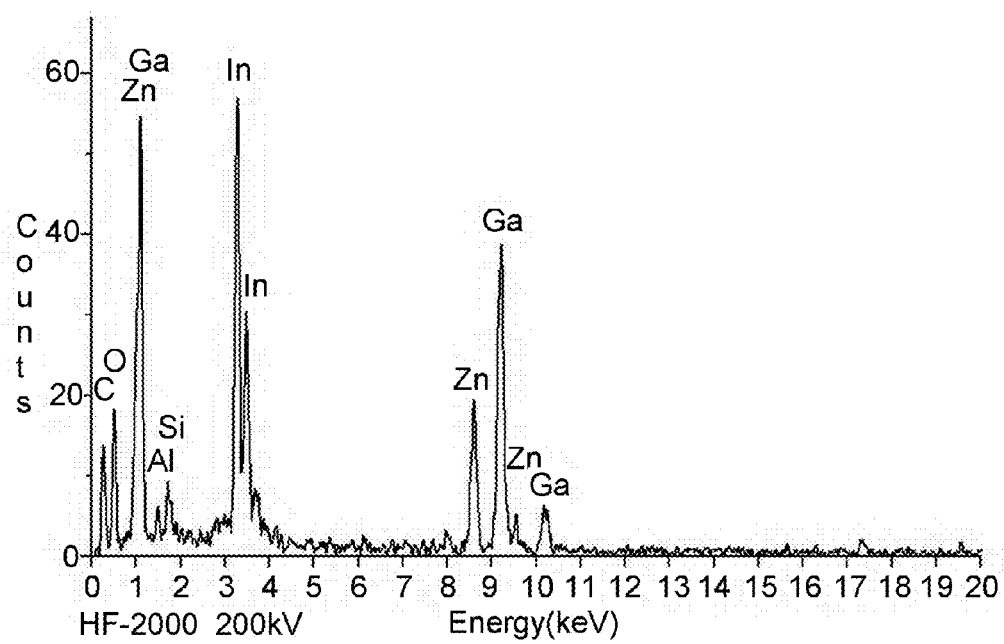
FIG. 30 is an EDX analysis spectrum of an oxide semiconductor layer.

FIG. 30 shows results of analysis with TEM-EDX (energy dispersive X-ray spectrometry) of a cross section of the superficial portion of the sample A. A material target whose molar ratio of $In_2O_3$ to $Ga_2O_3$ to ZnO is 1:1:1 was used, while it is found that as for the composition ratio of the superficial portion, In or Ga is 1 whereas Zn is greater than or equal to 0.3 and less than or equal to 0.4, so that Zn is slightly deficient.

Figure 31:
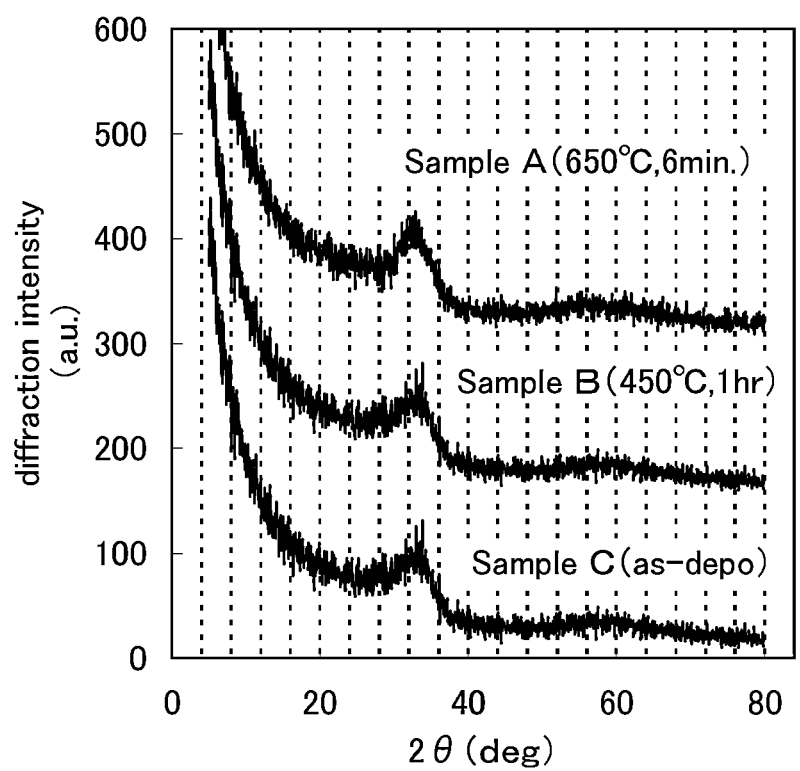
FIG. 31 is an X-ray diffraction chart of an oxide semiconductor layer.

Next, results of analysis of crystalline states of the same samples of three kinds with an X-ray diffraction analysis are shown in FIG. 31. In the chart of the samples, a peak seen when 2θ is 30 to 36 degrees is data derived from an In—Ga—Zn—O-based material and is broad; therefore, an amorphous state is reflected. However, the peak position of the sample A which is heated at 650° C. for six minutes with an RTA method is on the lower angle side than the sample B and the sample C, indicating the existence of a diffraction peak obtained from a (009) plane or a (101) plane, which show the strongest diffraction intensity in the In—Ga—Zn—O-based crystal materials. Therefore, it is also confirmed with the X-ray diffraction analysis that the sample A has a crystalline region.

Figure 32A:
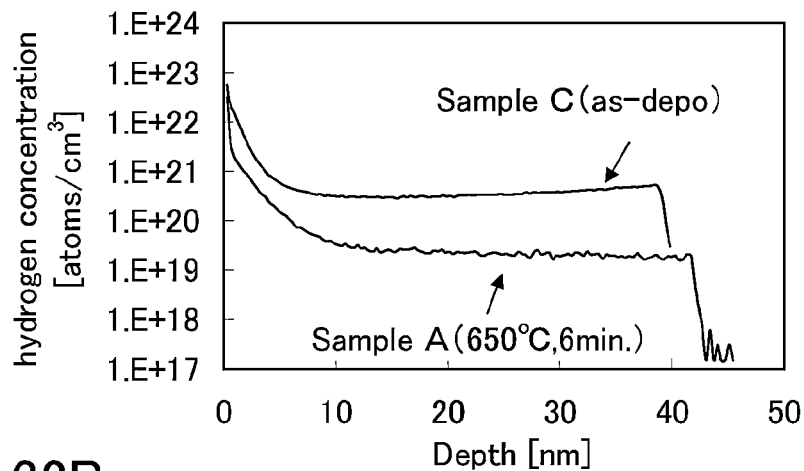
FIGS. 32A to 32C are SIMS analysis depth profiles of oxide semiconductor layers.
Figure 32B:
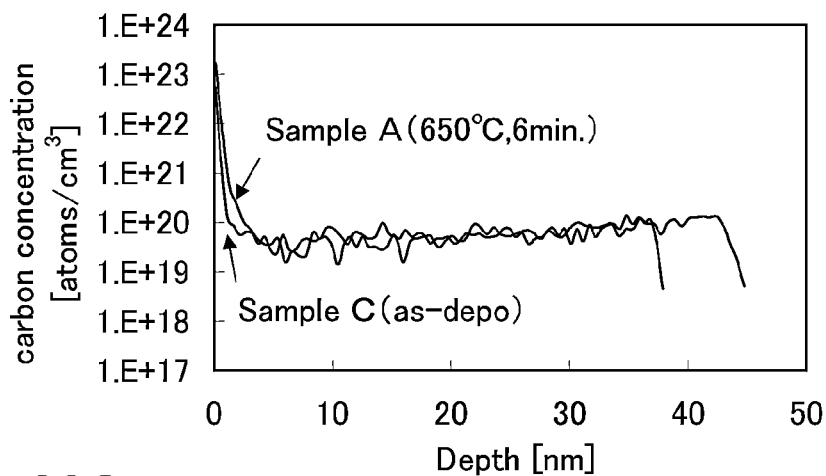
Figure 32C:
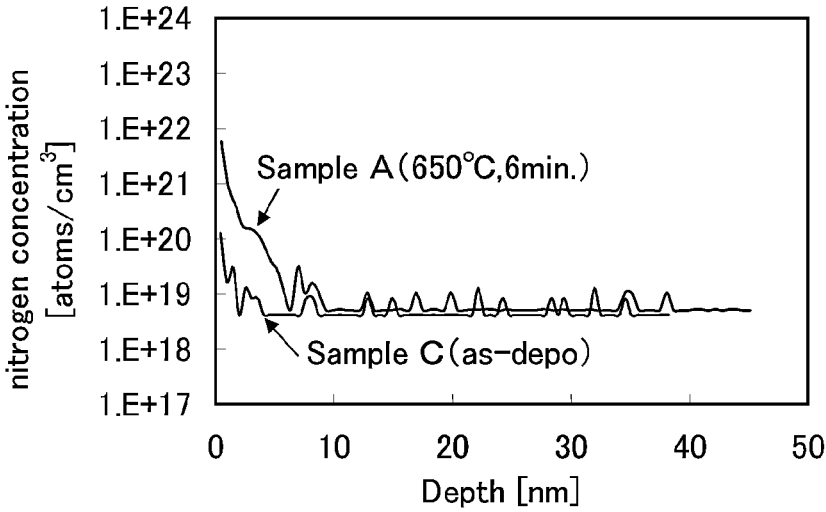

Next, results of analysis of the hydrogen concentration, the carbon concentration, and the nitrogen concentration in a film of each of the sample A and the sample C with secondary ion mass spectrometry (SIMS) are shown in FIGS. 32A to 32C. A horizontal axis indicates a depth from surfaces of the samples, and a left end where the depth is 0 nm corresponds to the outermost surfaces of the samples (outermost surfaces of the oxide semiconductor layers), and analysis is performed from the surface side.

FIG. 32A illustrates a hydrogen concentration profile. It turns out that the hydrogen concentration of the profile of the sample A decreases by greater than or equal to one digit as compared to that of the profile of the sample C, and it is confirmed that the dehydration or dehydrogenation was effectively performed at 650° C. for six minutes with an RTA method. Note that the profile of the sample A and the profile of the sample C are quantified using a reference sample formed with the use of an In—Ga—Zn—O-based oxide semiconductor layer similarly to the samples.

It is known that it is difficult to accurately obtain data in the proximity of a surface of a sample or in the proximity of an interface between laminate films formed using different materials with the SIMS analysis in principle. In this analysis, the profile of greater than or equal to 15 nm and less than or equal to 35 nm in depth in the thickness of approximately 40 nm was an object of evaluation in order to obtain accurate data in the film.

It is found from the profile of the sample C that hydrogen is contained in the oxide semiconductor layer which is not subjected to dehydrogenation at approximately greater than or equal to $3 \times 10^{20}$ atoms/cm$^3$ and less than or equal to approximately $5 \times 10^{20}$ atoms/cm$^3$ and at an average hydrogen concentration of approximately $4 \times 10^{20}$ atoms/cm$^3$. It is found from the profile of the sample A that the average hydrogen concentration in the oxide semiconductor layer can be reduced to approximately $2 \times 10^{19}$ atoms/cm$^3$ by dehydrogenation.

Figure 38A:
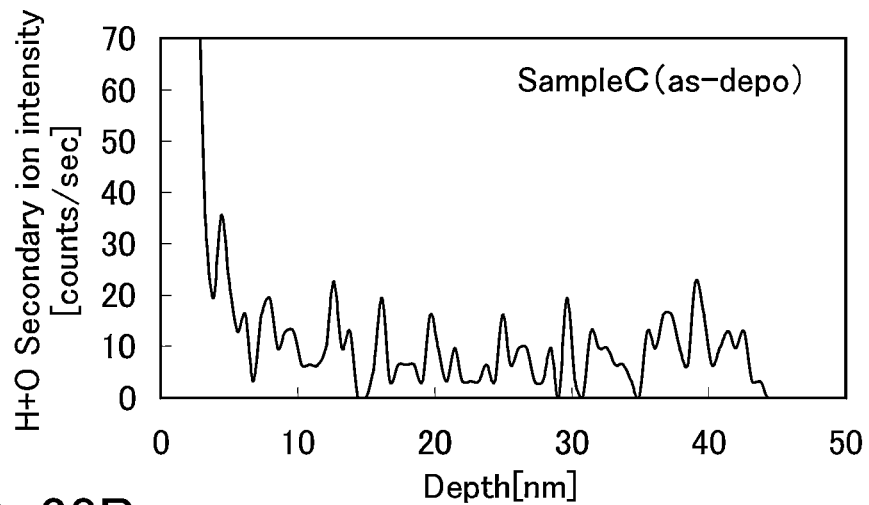
FIGS. 38A to 38C are SIMS analysis depth profiles of oxide semiconductor layers.
Figure 38B:
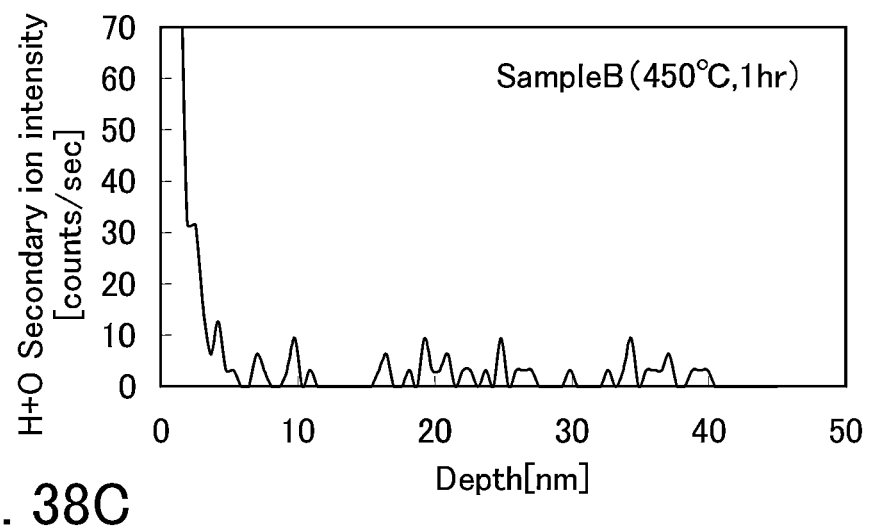
Figure 38C:
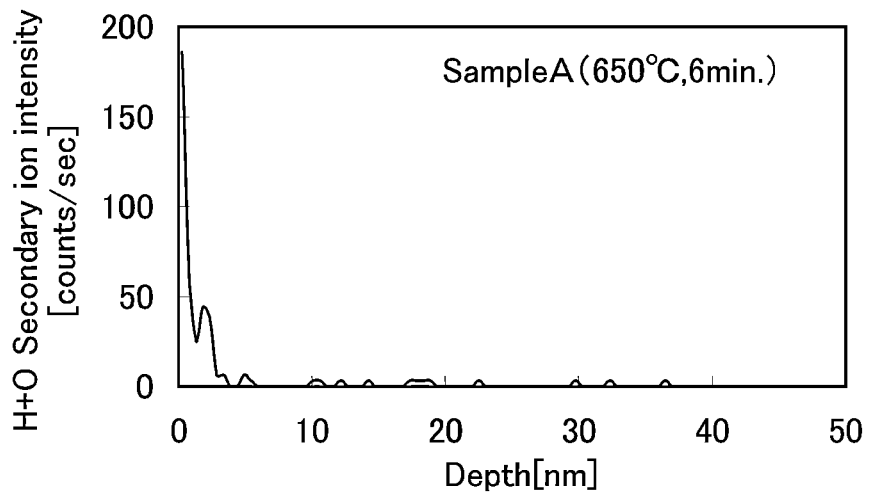
Figure 39A:
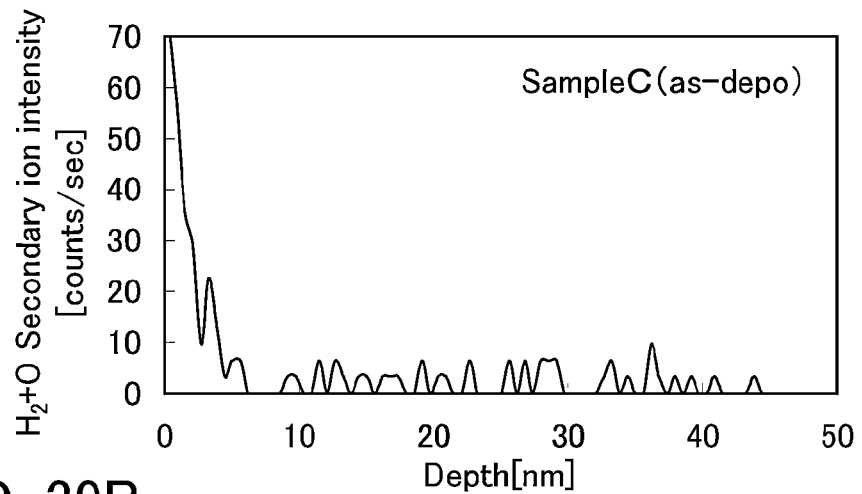
FIGS. 39A to 39C are SIMS analysis depth profiles of oxide semiconductor layers.
Figure 39B:
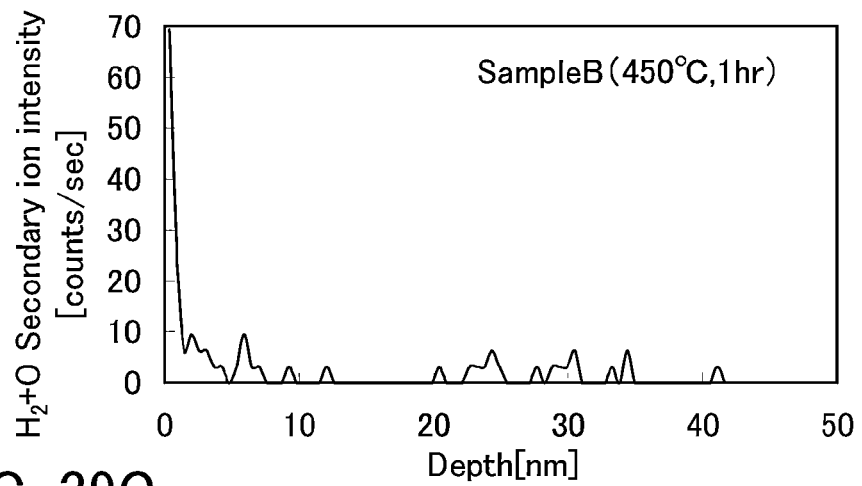
Figure 39C:
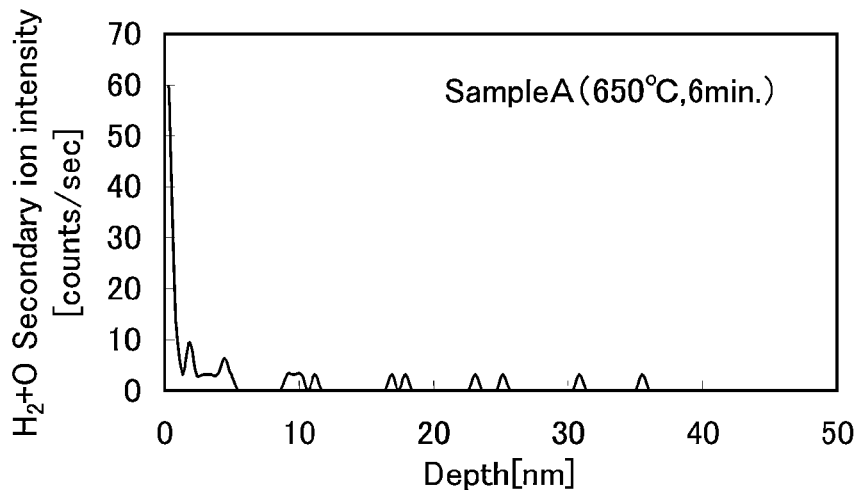

The carbon concentration profile is shown in FIG. 32B, and the nitrogen concentration profile is shown in FIG. 32C. Unlike the hydrogen concentration profile, neither the carbon concentration profile nor the nitrogen concentration profile has a sharp contrast between the sample A and the sample C, and it is confirmed that there is no discharge or entry of a carbon component and a nitrogen component due to heating at 650° C. for six minutes with an RTA method. The detection results of secondary ion intensity of H+O are shown in FIGS. 38A to 38C, and those of H$_2$+O are shown in FIGS. 39A to 39C. It is found that the samples processed at higher temperature have lower intensity in both H+O and H$_2$+O and that discharge of water or OH is efficiently performed by performing heating at 650° C. for six minutes with an RTA method.

From the results of analysis, it is found that the superficial portion of the sample which is heated at 650° C. in a short time of six minutes with an RTA method has a crystalline region including a needle crystal group. It is also found that the hydrogen concentration in the oxide semiconductor layer can be reduced to less than or equal to 1/10.

Example 2

In this example, the results obtained by forming a transistor described in Embodiment 1 and performing a −BT test will be described.

One of methods for examining reliability of transistors is a bias-temperature stress test (hereinafter, referred to as a BT test). The BT test is one kind of accelerated test and can evaluate change in characteristics, caused by long-term usage, of transistors in a short time. In particular, the amount of shift in threshold voltage of the transistor between before and after the BT test is an important indicator for examining reliability. As a difference in the threshold voltage between before and after the BT test is small, the transistor has higher reliability.

Specifically, the temperature of a substrate over which a transistor is formed (substrate temperature) is set at fixed temperature, a source and a drain of the transistor are set at the same potential, and a gate is supplied with potential different from those of the source and the drain for a certain period. The substrate temperature may be set as appropriate in accordance with the purpose of the test. A test in the case where potential applied to the gate is higher than potential of the source and the drain is referred to as a +BT test, and a test in the case where potential applied to the gate is lower than potential of the source and the drain is referred to as a −BT test.

The stress conditions for the BT test can be determined by setting the substrate temperature, electric field intensity applied to a gate insulating film, or a time period of application of electric field. The electric field intensity applied to a gate insulating film can be determined by dividing the potential difference between the gate potential and the source and drain potential by the thickness of the gate insulating film. For example, in the case where the electric field intensity applied to the 100-nm-thick gate insulating film is to be set to 2 MV/cm, the potential difference may be set to 20 V.

Note that "voltage" generally indicates a difference between potential of two points, and "potential" indicates electrostatic energy (electrical potential energy) of a unit charge at a given point in an electrostatic field. Note that in general, a difference between potential of one point and reference potential (e.g., ground potential) is merely called potential or voltage, and potential and voltage are used as synonymous words in many cases. Thus, in this specification, potential may be rephrased as voltage and voltage may be rephrased as potential unless otherwise specified.

A −BT test was performed under such conditions that a substrate temperature was 150° C., an electric field intensity applied to the gate insulating film was 2 MV/cm, and a time period for application was one hour.

First, in order to measure initial characteristics of a transistor subjected to the −BT test, a change in characteristics of the source-drain current (hereinafter, referred to as the drain current or Id) was measured, under the conditions where the substrate temperature was set to 40° C., the voltage between a source and a drain (hereinafter, the drain voltage or Vd) was set to 1 V, and the voltage between a source and a gate (hereinafter, the gate voltage or Vg) was changed in the range of −20 V to +20 V. That is, Vg-Id characteristics when Vd was 1 V were measured. Here, as a countermeasure against moisture-absorption onto surfaces of the samples, the substrate temperature was set to 40° C. However, the measurement may be performed at room temperature (25° C.) or lower if there is no particular problem.

Next, a similar measurement was conducted when Vd was set to 10 V, and Vg-Id characteristics at the time when Vd was 10 V were measured.

Next, the substrate temperature was increased to 150° C., and then, the potential of the source and the drain of the transistor was set to 0 V. Then, voltage was applied to the gate so that the intensity of the electric field applied to the gate insulating film was 2 MV/cm. Since the thickness of the gate insulating film of the transistor was 100 nm, −20 V was applied to the gate and this voltage was kept for one hour. The time period for voltage application was one hour here; however, the time period may be changed as appropriate in accordance with the purpose.

Next, the substrate temperature was decreased to 40° C. while voltage is applied between the gate and the source and the drain. If application of the voltage is stopped before the substrate temperature was completely decreased to 40° C., the transistor which has been damaged during the −BT test is repaired by the influence of residual heat. Thus, the substrate temperature must be decreased while the voltage is applied. After the substrate temperature was decreased to 40° C., application of the voltage was terminated. Strictly, the time of decreasing temperature must be added to the time of the voltage application; however, since the temperature was able to be decreased to 40° C. in several minutes actually, this was considered to be an error range and the time of decreasing temperature was not added to the time of application.

Then, the Vg-Id characteristics when Vd was 1 V and 10 V were measured under the same conditions as those for the measurement of the initial characteristics, so that the Vg-Id characteristics after the −BT test is performed were obtained.

Figure 37A:
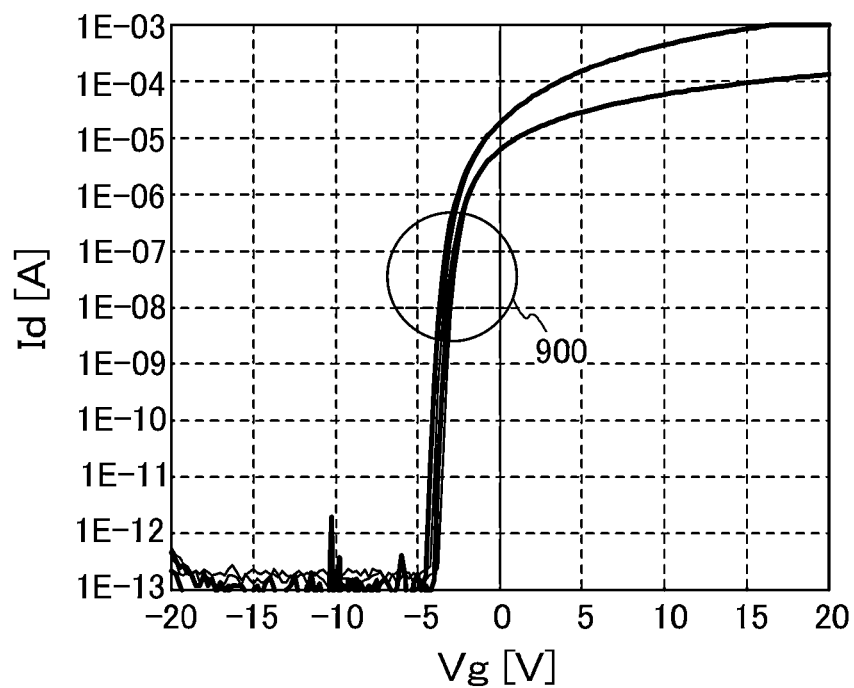
FIGS. 37A and 37B show I-V characteristics of a transistor which has not been subjected to −BT test and has been subjected to −BT test.

FIG. 37A illustrates the Vg-Id characteristics of the transistor which has not been subjected to −BT test and has been subjected to −BT test. In FIG. 37A, the horizontal axis represents the gate voltage (Vg) which is shown with a logarithmic scale, and the vertical axis represents the drain current (Id) which is shown with a logarithmic scale.

Figure 37B:
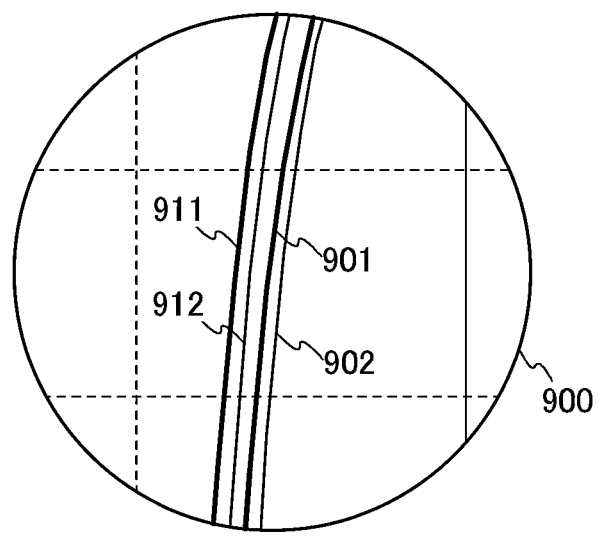

FIG. 37B is an enlarged view of a portion 900 shown in FIG. 37A. Initial characteristics 901 represent the Vg-Id characteristics of the transistor which has not been subjected to the −BT test in the case where Vd is 1 V, and initial characteristics 911 represent the Vg-Id characteristics of the transistor which has been subjected to the −BT test in the case where Vd is 10 V. In addition, −BT 902 represents the Vg-Id characteristics of the transistor which has been subjected to the −BT test in the case where Vd is 1 V, and −BT 912 represents the Vg-Id characteristics of the transistor which is subjected to the −BT test in the case where Vd is 10 V.

It is found that, from FIGS. 37A and 37B, compared to the initial characteristics 901 and the initial characteristics 911, the entire −BT 902 and the entire −BT 912 slightly shift to the positive direction. However, it is found that the shift amount is as small as less than or equal to 0.5 V and that the transistor formed in Embodiment 1 has high reliability in the −BT test.

This application is based on Japanese Patent Application serial no. 2009-218877 filed with Japan Patent Office on Sep. 24, 2009, the entire contents of which are hereby incorporated by reference.

The invention claimed is:

1. An oxide semiconductor film comprising:
a first region and a second region,
wherein the oxide semiconductor film comprises In, Ga and Zn,
wherein a carbon concentration of the oxide semiconductor film is lower than $1\times10^{21}$ atoms/cm$^3$,
wherein the first region is over the second region,
wherein the first region includes crystals which are c-axis-oriented in a direction substantially perpendicular to a surface of the oxide semiconductor film, and
wherein the second region includes nanocrystals.

2. The oxide semiconductor film according to claim 1, wherein a crystal structure of the crystals in the first region is represented by In$_2$Ga$_2$ZnO$_7$.

3. The oxide semiconductor film according to claim 1, wherein each of the nanocrystals has a particle size of greater than or equal to 1 nm and less than or equal to 20 nm.

4. A semiconductor device comprising:
a gate electrode layer;
an oxide semiconductor layer;
a gate insulating layer between the gate electrode layer and the oxide semiconductor layer;
a source electrode layer and a drain electrode layer in contact with the oxide semiconductor layer; and
an oxide insulating layer over the source electrode layer and the drain electrode layer and in contact with a first region of a top surface of the oxide semiconductor layer,
wherein the oxide semiconductor layer comprises a channel formation region,
wherein the oxide semiconductor layer comprises In, Ga and Zn,
wherein a carbon concentration of the oxide semiconductor layer is lower than $1\times10^{21}$ atoms/cm$^3$, and
wherein at least a region of the oxide semiconductor layer includes crystals which are c-axis-oriented in a direction substantially perpendicular to a surface of the oxide semiconductor layer.

5. The semiconductor device according to claim 4, wherein a crystal structure of the crystals is represented by In$_2$Ga$_2$ZnO$_7$.

6. The semiconductor device according to claim 4, wherein each of the source electrode layer and the drain electrode layer comprises a conductive layer containing titanium.

7. The semiconductor device according to claim 6, wherein a resistance of the first region of the top surface of the oxide semiconductor layer which is in contact with the oxide insulating layer is higher than a resistance of a second region of the top surface of the oxide semiconductor layer which is in contact with the conductive layer.

8. The semiconductor device according to claim 4, further comprising an insulating layer over the oxide insulating layer and an electrode over the insulating layer,
wherein the electrode is electrically connected to one of the source electrode layer and the drain electrode layer.

9. The semiconductor device according to claim 4, further comprising a conductive layer overlapping with the gate electrode layer with the gate insulating layer, the oxide semiconductor layer and the oxide insulating layer interposed therebetween.

10. A semiconductor device comprising:
a gate electrode layer;
an oxide semiconductor layer comprising a first region and a second region;
a gate insulating layer between the gate electrode layer and the oxide semiconductor layer;
a source electrode layer and a drain electrode layer in contact with the oxide semiconductor layer; and
an oxide insulating layer over the source electrode layer and the drain electrode layer and in contact with a first region of a top surface of the oxide semiconductor layer,
wherein the oxide semiconductor layer comprises a channel formation region,
wherein the oxide semiconductor layer comprises In, Ga and Zn,
wherein a carbon concentration of the oxide semiconductor layer is lower than $1\times10^{21}$ atoms/cm$^3$,
wherein the first region includes crystals which are c-axis-oriented in a direction substantially perpendicular to a surface of the oxide semiconductor layer, and
wherein the second region includes nanocrystals.

11. The semiconductor device according to claim 10, wherein a crystal structure of the crystals in the first region is represented by In$_2$Ga$_2$ZnO$_7$.

12. The semiconductor device according to claim 10, wherein each of the source electrode layer and the drain electrode layer comprises a conductive layer containing titanium.

13. The semiconductor device according to claim 12, wherein a resistance of the first region of the top surface of the oxide semiconductor layer which is in contact with the oxide insulating layer is higher than a resistance of a second region of the top surface of the oxide semiconductor layer which is in contact with the conductive layer.

14. The semiconductor device according to claim 10, further comprising an insulating layer over the oxide insulating layer and an electrode over the insulating layer,
   wherein the electrode is electrically connected to one of the source electrode layer and the drain electrode layer.

15. The semiconductor device according to claim 10, wherein each of the nanocrystals has a particle size of greater than or equal to 1 nm and less than or equal to 20 nm.

16. The semiconductor device according to claim 10, further comprising a conductive layer overlapping with the gate electrode layer with the gate insulating layer, the oxide semiconductor layer and the oxide insulating layer interposed therebetween.

* * * * *